United States Patent
Nagasaka

(10) Patent No.: US 8,027,020 B2
(45) Date of Patent: Sep. 27, 2011

(54) EXPOSURE APPARATUS, EXPOSURE METHOD, AND METHOD FOR PRODUCING DEVICE

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 890 days.

(21) Appl. No.: 11/707,027

(22) Filed: Feb. 16, 2007

(65) Prior Publication Data

US 2007/0273854 A1 Nov. 29, 2007

(30) Foreign Application Priority Data

Feb. 16, 2006 (JP) ................................. 2006-039227

(51) Int. Cl.
*G03B 27/42* (2006.01)
(52) U.S. Cl. ........................................... 355/53; 355/67
(58) Field of Classification Search .................... 355/30, 355/53
See application file for complete search history.

(56) References Cited

U.S. PATENT DOCUMENTS

| | | | |
|---|---|---|---|
| 4,465,368 A | 8/1984 | Matsuura et al. |
| 4,629,313 A | 12/1986 | Tanimoto |
| 4,666,273 A | 5/1987 | Shimizu et al. |
| 5,473,410 A | 12/1995 | Nishi |
| 5,493,403 A | 2/1996 | Nishi |
| 5,825,043 A | 10/1998 | Suwa |
| 5,969,441 A | 10/1999 | Loopstra et al. |
| 6,018,384 A | 1/2000 | Ota |
| 6,169,602 B1 | 1/2001 | Taniguchi et al. |
| 6,235,438 B1 | 5/2001 | Suzuki et al. |
| 6,327,022 B1 | 12/2001 | Nishi |
| 6,341,007 B1 | 1/2002 | Nishi et al. |
| 6,383,940 B1 | 5/2002 | Yoshimura |
| 6,400,441 B1 | 6/2002 | Nishi et al. |
| 6,498,352 B1 | 12/2002 | Nishi |
| 6,549,269 B1 | 4/2003 | Nishi et al. |
| 6,549,271 B2 | 4/2003 | Yasuda et al. |
| 6,590,634 B1 | 7/2003 | Nishi et al. |

(Continued)

FOREIGN PATENT DOCUMENTS

EP 1 079 223 A1 2/2001

(Continued)

OTHER PUBLICATIONS

Supplemental Extended European Search Report for European Patent Application No. 07714256.0; mailed Aug. 2, 2010.

*Primary Examiner* — Edward Glick
*Assistant Examiner* — Mesfin T Asfaw
(74) *Attorney, Agent, or Firm* — Oliff & Berridge, PLC

(57) ABSTRACT

An exposure apparatus includes a projection optical system which forms an image of a first pattern in a first exposure area and which forms an image of a second pattern in a second exposure area; and an adjusting device which adjusts a surface positional relationship between a surface of the substrate and a first image plane for forming the image of the first pattern thereon and which adjusts a surface positional relationship between the surface of the substrate and a second image plane for forming the image of the second pattern thereon when a shot area on the substrate is subjected to multiple exposure with the image of the first pattern and the image of the second pattern via the projection optical system. The substrate can be subjected to the multiple exposure satisfactorily and efficiently.

37 Claims, 25 Drawing Sheets

U.S. PATENT DOCUMENTS

| | | |
|---|---|---|
| 6,608,681 B2 | 8/2003 | Tanaka et al. |
| 6,778,257 B2 | 8/2004 | Bleeker et al. |
| 6,819,405 B2 | 11/2004 | Mulkens et al. |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 7,088,425 B2 | 8/2006 | Tanaka et al. |
| 2002/0041377 A1 | 4/2002 | Hagiwara et al. |
| 2002/0061469 A1 | 5/2002 | Tanaka |
| 2002/0123012 A1* | 9/2002 | Sewell .................. 430/397 |
| 2003/0218730 A1 | 11/2003 | Murakami et al. |
| 2004/0165159 A1 | 8/2004 | Lof et al. |
| 2004/0233407 A1* | 11/2004 | Nishi et al. ............. 355/53 |
| 2004/0263809 A1* | 12/2004 | Nakano .................. 355/30 |
| 2005/0206850 A1 | 9/2005 | Shimizu et al. |
| 2005/0248856 A1 | 11/2005 | Omura et al. |
| 2005/0280791 A1 | 12/2005 | Nagasaka et al. |
| 2006/0170901 A1 | 8/2006 | Tanitsu et al. |
| 2006/0231206 A1 | 10/2006 | Nagasaka et al. |
| 2007/0013890 A1 | 1/2007 | Loopstra et al. |
| 2007/0013893 A1* | 1/2007 | Loopstra .................. 355/72 |

FOREIGN PATENT DOCUMENTS

| | | |
|---|---|---|
| EP | 1 420 298 A2 | 5/2004 |
| EP | 1 544 682 A2 | 6/2005 |
| JP | A 57-117238 | 7/1982 |
| JP | A 60-78454 | 5/1985 |
| JP | A 4-65603 | 3/1992 |
| JP | A 6-124873 | 5/1994 |
| JP | A 7-176468 | 7/1995 |
| JP | A 8-78313 | 3/1996 |
| JP | A 8-78314 | 3/1996 |
| JP | A 8-227847 | 9/1996 |
| JP | A 8-313842 | 11/1996 |
| JP | A 10-163099 | 6/1998 |
| JP | A 10-214783 | 8/1998 |
| JP | A 10-232497 | 9/1998 |
| JP | A 10-303114 | 11/1998 |
| JP | A 11-16816 | 1/1999 |
| JP | A 11-45846 | 2/1999 |
| JP | A 11-135400 | 5/1999 |
| JP | A 11-195602 | 7/1999 |
| JP | A 2000-21742 | 1/2000 |
| JP | A 2000-505958 | 5/2000 |
| JP | A 2000-164504 | 6/2000 |
| JP | A 2001-267239 | 9/2001 |
| JP | A 2001-297976 | 10/2001 |
| JP | A 2002-14005 | 1/2002 |
| JP | A 2003-45797 | 2/2003 |
| JP | A 2004-519850 | 7/2004 |
| JP | A 2004-289126 | 10/2004 |
| JP | A 2004-304135 | 10/2004 |
| WO | WO 99/23692 | 5/1999 |
| WO | WO 99/46835 A1 | 9/1999 |
| WO | WO 99/49504 | 9/1999 |
| WO | WO 99-60361 | 11/1999 |
| WO | WO 02/069049 A2 | 9/2002 |
| WO | WO 03/065428 A1 | 8/2003 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/090634 A2 | 10/2004 |
| WO | WO 2005/029559 A1 | 3/2005 |
| WO | WO 2005/059617 A2 | 6/2005 |
| WO | WO 2005/059618 A2 | 6/2005 |
| WO | WO 2005/076045 A1 | 8/2005 |

\* cited by examiner

Fig. 7
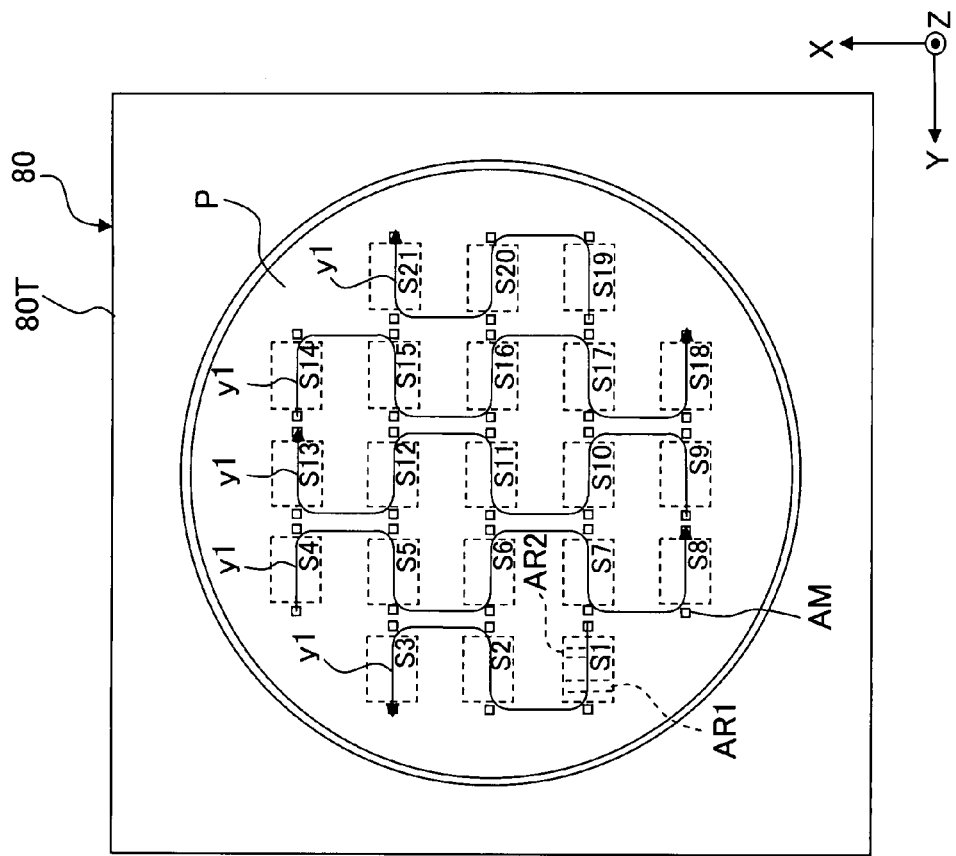
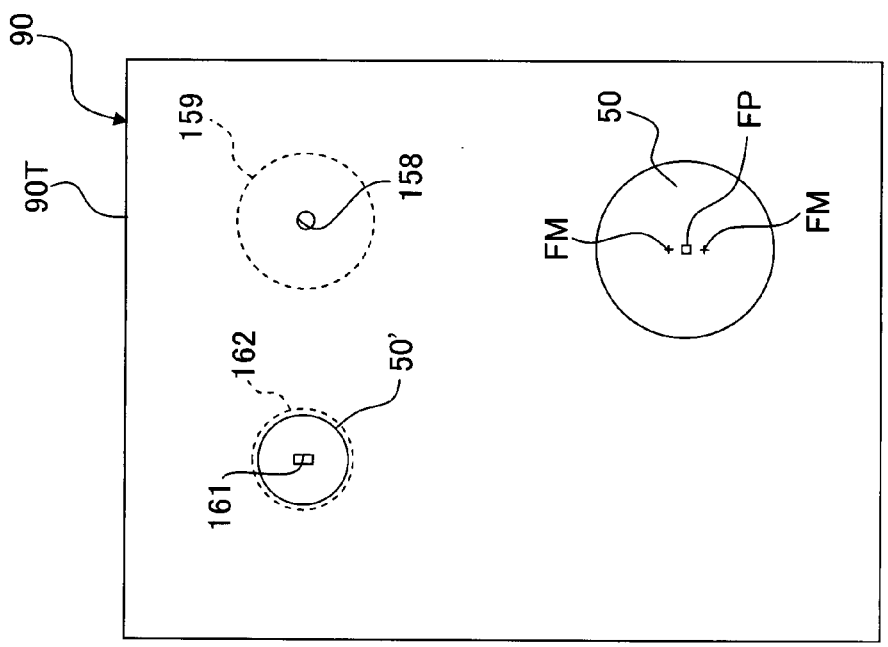

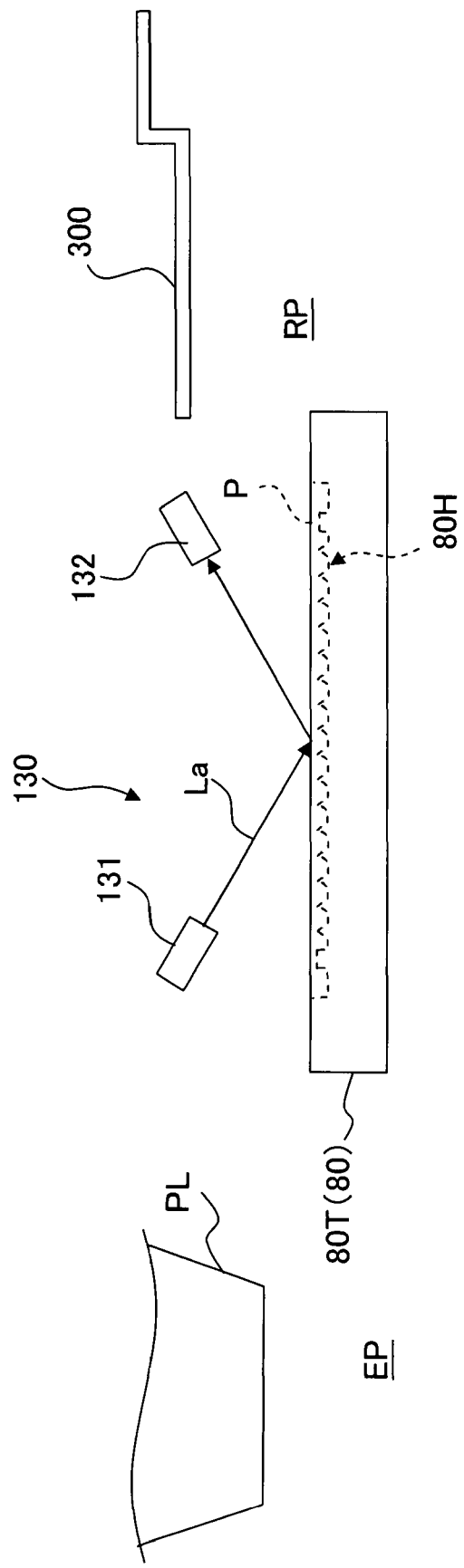

Fig. 13A
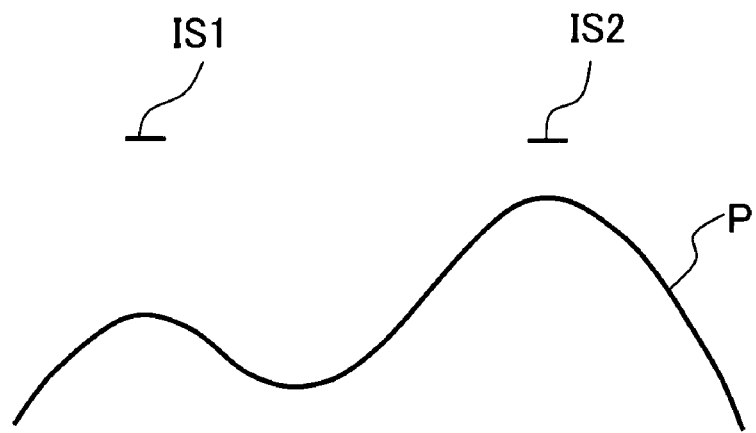
Fig. 13B
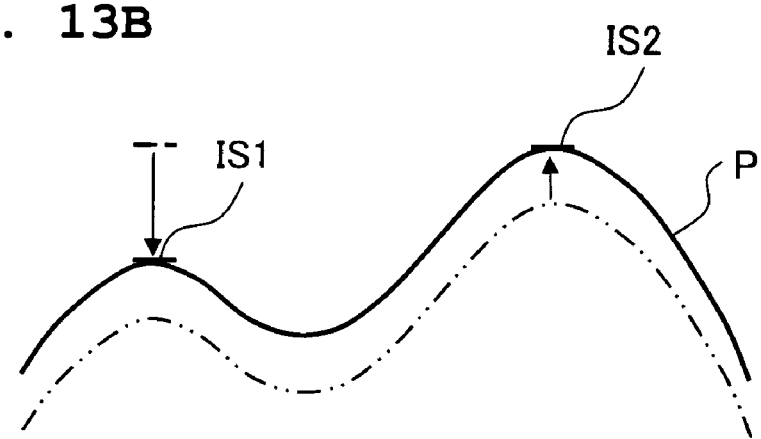
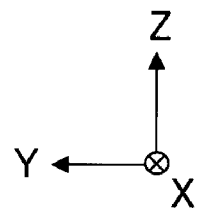

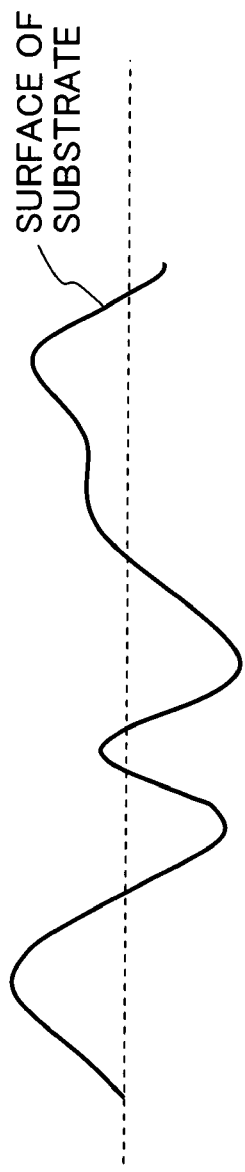
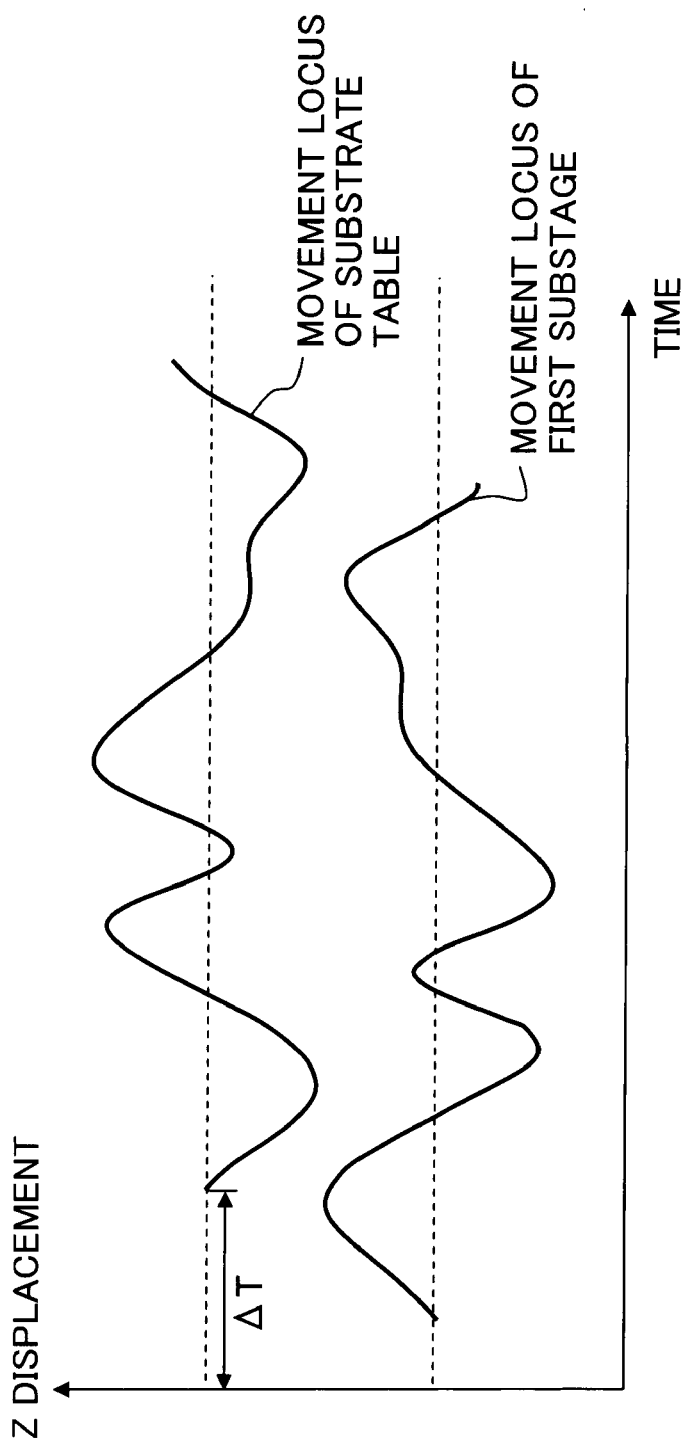
Fig. 15A
Fig. 15B

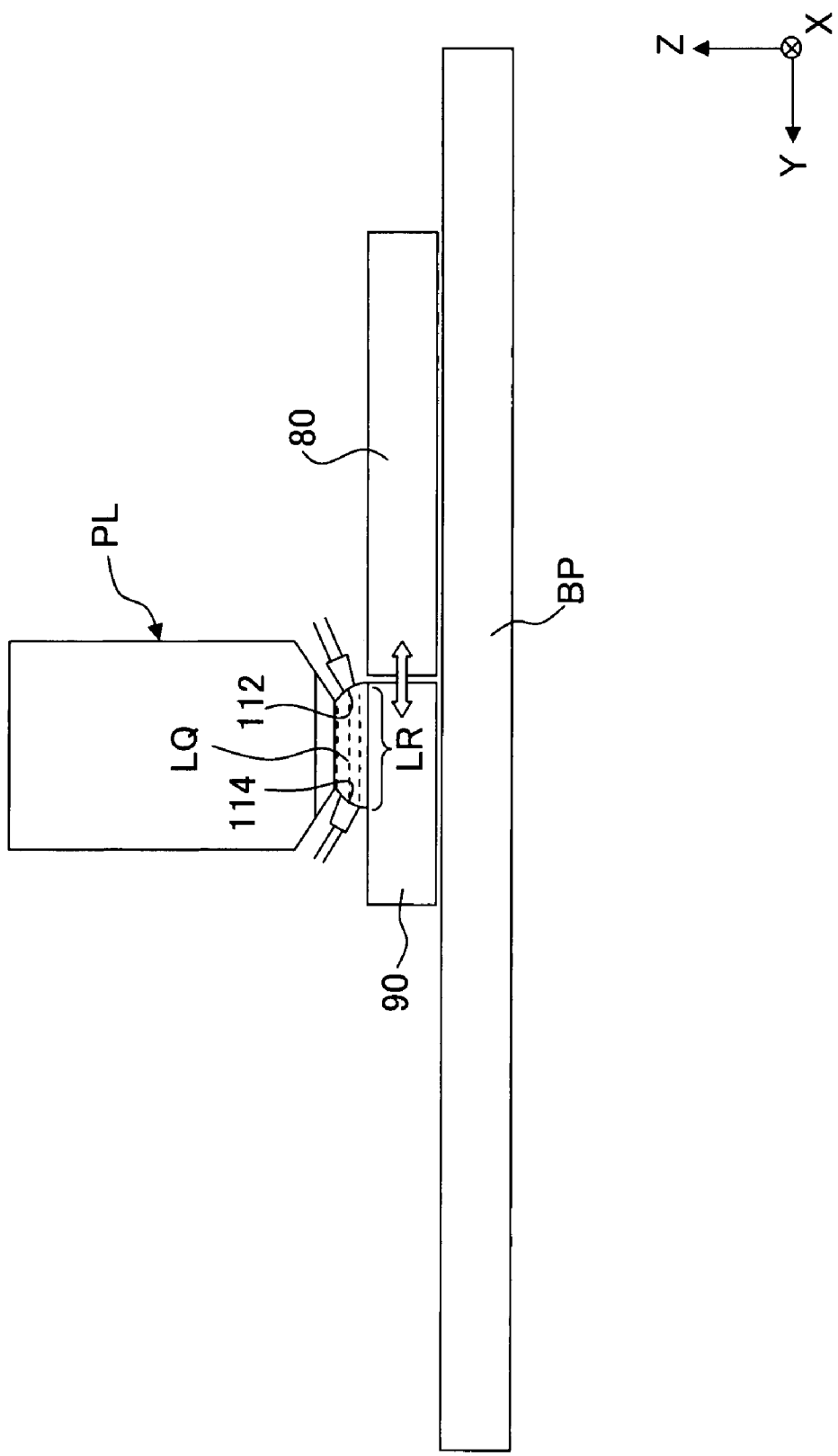

EXPOSURE APPARATUS, EXPOSURE METHOD, AND METHOD FOR PRODUCING DEVICE

CROSS-REFERENCES TO RELATED APPLICATIONS

This application claims the benefit of priority of Japanese Patent Application No. 2006-039227 filed on Feb. 16, 2006 and U.S. Provisional Application No. 60/779,436 filed on Mar. 7, 2006, the entire disclosures of which are incorporated herein by reference.

BACKGROUND OF THE INVENTION

1. Field of the Invention

The present invention relates to an exposure apparatus for exposing a substrate, an exposure method, and a method for producing a device.

2. Description of the Related Art

An exposure apparatus, which performs the multiple exposure for the substrate, is known as disclosed, for example, in Japanese Patent Application Laid-open No. 10-214783 in relation to the exposure apparatus to be used in the photolithography steps.

In the multiple exposure, a plurality of masks are prepared to execute the exposure for each of the masks in some cases, and a plurality of illumination conditions are prepared to execute the exposure under the different illumination conditions for the respective masks in other cases. In such situations, it is necessary to take a period of time in which the mask is exchanged and/or a period of time in which the illumination condition or the like is changed. Therefore, there is such a possibility that the rate of operation of the exposure apparatus may be lowered, and thus the throughput may be lowered.

When the substrate is subjected to the multiple exposure by using patterns of a plurality of masks, it is also important to satisfactorily adjust the positional relationship between a surface of the substrate and the image plane on which the image of each of the patterns is to be formed, in order to form a desired pattern on the substrate.

SUMMARY OF THE INVENTION

The present invention has been made taking the foregoing situations into consideration, an object of which is to provide an exposure apparatus, an exposure method, and a method for producing a device, in which the substrate can be subjected to the multiple exposure satisfactorily and efficiently.

In order to achieve the object as described above, the present invention adopts the following constructions corresponding to respective drawings as illustrated in embodiments.

According to a first aspect of the present invention, there is provided an exposure apparatus which exposes a substrate, comprising an optical system which forms an image of a first pattern in a first exposure area and which forms an image of a second pattern in a second exposure area, the second pattern being different from the first pattern; and an adjusting device which adjusts a surface positional relationship between a surface of the substrate and a first image plane for forming the image of the first pattern thereon and which adjusts a surface positional relationship between the surface of the substrate and a second image plane for forming the image of the second pattern thereon when a predetermined area on the substrate is subjected to multiple exposure with the image of the first pattern and the image of the second pattern via the optical system.

According to the first aspect of the present invention, it is possible to adjust the surface positional relationship between the surface of the substrate and each of the first image plane on which the image of the first pattern is to be formed and the second image plane on which the image of the second pattern is to be formed. Thus, the substrate can be subjected to the multiple exposure satisfactorily and efficiently.

According to a second aspect of the present invention, there is provided an exposure apparatus which exposes a substrate, comprising an optical system which forms an image of a first pattern in a first exposure area and which forms an image of a second pattern in a second exposure area, the second pattern being different from the first pattern; and a detecting system which detects position information about a first image plane for forming the image of the first pattern thereon and which detects position information about a second image plane for forming the image of the second pattern thereon; wherein a predetermined area on the substrate is subjected to multiple exposure with the image of the first pattern and the image of the second pattern based on a detection result of the detecting system.

According to the second aspect of the present invention, the substrate can be subjected to the multiple exposure satisfactorily and efficiently based on the detection result, because the exposure apparatus is provided with the detecting system which detects the position information about the first image plane and the second image plane.

According to a third aspect of the present invention, there is provided a method for producing a device, comprising using the exposure apparatus as defined in the first or second aspect.

According to the third aspect of the present invention, it is possible to produce the device by using the exposure apparatus which makes it possible to perform the multiple exposure for the substrate satisfactorily and efficiently.

According to a fourth aspect of the present invention, there is provided an exposure method for performing multiple exposure for a predetermined area on a substrate with an image of a first pattern and an image of a second pattern, the exposure method comprising: adjusting surface positional relationship between a surface of the substrate and a first image plane on which the image of the first pattern is to be formed; adjusting surface positional relationship between the surface of the substrate and a second image plane on which the image of the second pattern is to be formed; and forming the image of the first pattern and the image of the second pattern in a first exposure area and a second exposure area respectively to perform the multiple exposure for the predetermined area on the substrate with the image of the first pattern and the image of the second pattern.

According to the fourth aspect of the present invention, the surface positional relationship between the first image plane and the surface of the substrate is adjusted, and the surface positional relationship between the second image plane and the surface of the substrate is adjusted. Therefore, the substrate can be subjected to the multiple exposure satisfactorily and efficiently.

According to a fifth aspect of the present invention, there is provided an exposure method for performing multiple exposure for a predetermined area on a substrate with an image of a first pattern and an image of a second pattern, the exposure method comprising: detecting position information about a first image plane on which the image of the first pattern is to be formed; detecting position information about a second image plane on which the image of the second pattern is to be formed; and forming the image of the first pattern and the image of the second pattern in a first exposure area and a second exposure area respectively to perform the multiple exposure for the predetermined area on the substrate with the image of the first pattern and the image of the second pattern based on the detected position informations.

According to the fifth aspect of the present invention, the substrate can be subjected to the multiple exposure satisfactorily and efficiently, because the position informations about the first image plane and the second image plane are detected.

According to a sixth aspect of the present invention, there is provided a method for producing a device, comprising: performing multiple exposure for a substrate by using the exposure method as defined in the fourth or fifth aspect; developing the exposed substrate; and processing the developed substrate. It is possible to produce the highly accurate device highly efficiently by the method for producing the device.

According to the present invention, the substrate can be subjected to the multiple exposure satisfactorily with the image of the first pattern and the image of the second pattern. Further, the substrate can be subjected to the multiple exposure efficiently. Therefore, the device having the desired performance can be produced at the satisfactory productivity.

BRIEF DESCRIPTION OF THE DRAWINGS

FIG. 7 shows a plan view illustrating a substrate stage and a measuring stage as viewed from a position thereabove.

FIG. 12 schematically illustrates the operation of the exposure apparatus according to the first embodiment.

FIGS. 13A and 13B illustrate an exemplary method for adjusting the surface positional relationship between the first and second image planes and the surface of the substrate according to the first embodiment.

FIGS. 15A and 15B schematically show an exemplary relationship between the movement loci of the surface of the substrate and a first substage and the movement locus of a substrate table.

FIG. 26 schematically illustrates an exemplary operation of the exposure apparatus according to the ninth embodiment.

DESCRIPTION OF THE PREFERRED EMBODIMENTS

Embodiments of the present invention will be explained below with reference to the drawings. However, the present invention is not limited to the embodiments. In the following description, the XYZ rectangular coordinates system is defined. The positional relationship concerning respective members will be explained with reference to the XYZ rectangular coordinates system. An X axis direction is a predetermined direction in a horizontal plane. A Y axis direction is a direction which is perpendicular to the X axis direction in the horizontal plane. A Z axis direction is a direction which is perpendicular to the X axis direction and the Y axis direction (i.e., the vertical direction). The directions of rotation (inclination) about the X axis, the Y axis, and the Z axis are designated as the θX, θY, and θZ directions respectively.

First Embodiment

Figure 1:
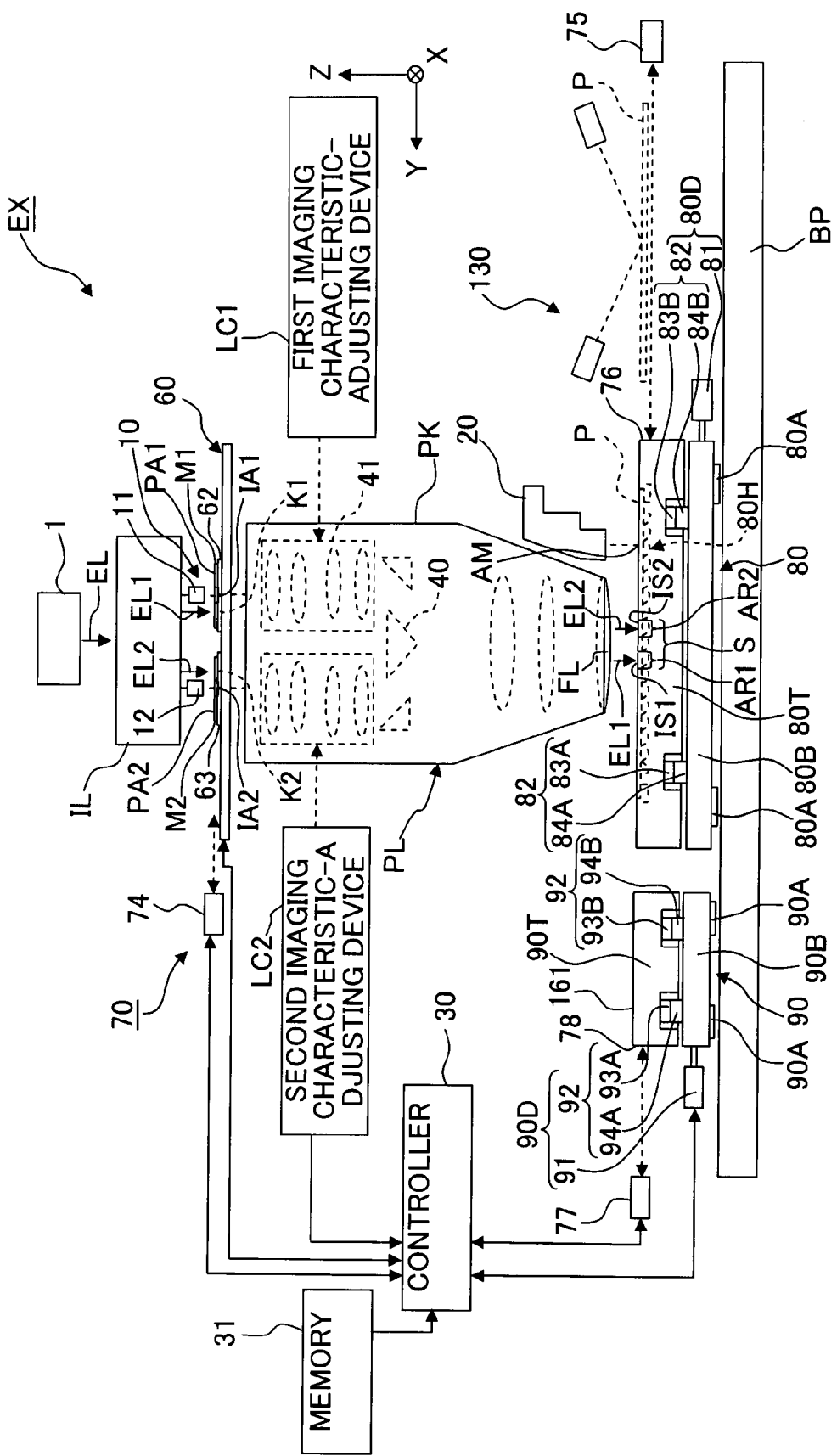
FIG. 1 shows a schematic arrangement view illustrating an exposure apparatus according to a first embodiment.

A first embodiment will be explained. FIG. 1 shows a schematic arrangement view illustrating an exposure apparatus EX according to the first embodiment. With reference to FIG. 1, the exposure apparatus EX includes a mask stage 60 which is movable while holding a first mask M1 having a first pattern PA1 and a second mask M2 having a second pattern PA2; a substrate stage 80 which is movable while holding a substrate P; a measuring stage 90 which is movable with a measuring instrument or a measuring device capable of executing the measurement in relation to the exposure provided thereon; a measuring system 70 which is capable of measuring a position information about each of the stages; a light source device 1 which emits or irradiates an exposure light beam EL; an illumination system IL which splits the exposure light beam EL emitted from the light source device 1 into a first exposure light beam EL1 and a second exposure light beam EL2, which illuminates the first pattern PA1 of the first mask M1 with the first exposure light beam EL1, and which illuminates the second pattern PA2 of the second mask M2 with the second exposure light beam EL2; a projection optical system PL which projects, onto the substrate P, an image of the first pattern PA1 illuminated with the first exposure light beam EL1 and an image of the second pattern PA2 illuminated with the second exposure light beam EL2; a controller 30 which controls the operation of the entire exposure apparatus EX; and a memory 31 which is connected to the controller 30 and which is capable of storing various pieces of information in relation to the exposure. The substrate stage 80 and the measuring stage 90 are movable independently from each other respectively on a base member BP on the light-exit side of the projection optical system PL, i.e., on the side of the image plane of the projection optical system PL.

The substrate referred to herein includes those in which a photosensitive material (photoresist) is coated on a base material including, for example, a semiconductor wafer such as a silicon wafer, and includes those obtained by coating or forming various films such as a protective film (top coat film) in addition to the photosensitive film. The mask includes a reticle on which a device pattern to be subjected to the reduction projection onto the substrate is formed. The mask has a transparent plate member such as a glass plate and a light-shielding film such as chromium formed thereon, and a predetermined pattern is formed by the light-shielding film. Such a transmission type mask is not limited to the binary mask on which the pattern is formed by the light-shielding film. The mask also includes, for example, a phase shift mask of, for example, the spatial frequency modulation type or the half tone type. In this embodiment, the transmission type mask is used as the mask. However, it is also allowable to use a reflection type mask. In this embodiment, the first pattern PA1 formed on the first mask and the second pattern PA2 formed on the second mask are different patterns. Further, the first and second masks M1, M2 are of the same type, but they may differ in the type. For example, one of the first and second masks M1, M2 may be a binary mask, and the other may be a phase shift reticle.

The projection optical system PL is capable of setting a first exposure area AR1 and a second exposure area AR2 in a predetermined positional relationship on the side of the image plane of the projection optical system PL. The projection optical system PL is capable of forming the image of the first pattern PA1 in the first exposure area AR1, and the projection optical system PL is capable of forming the image of the second pattern PA2 in the second exposure area AR2. In the exposure apparatus EX of this embodiment, the first exposure area AR1 and the second exposure area AR2 are set, by the projection optical system PL, on the substrate P arranged on the side of the image plane of the projection optical system PL, the image of the first pattern PA1 is formed in the first exposure area AR1, and the image of the second pattern PA2 is formed in the second exposure area AR2. By doing so, a shot area S on the substrate P is subjected to the multiple exposure (double exposure) with the image of the first pattern PA1 and the image of the second pattern PA2. Specifically, the exposure apparatus EX forms the image of the first pattern PA1 in the first exposure area AR1 with the first exposure light beam EL1 which is emitted from the illumination system IL and which is radiated onto the first exposure area AR1 via the first pattern PA1 and the projection optical system PL. Further, the exposure apparatus EX forms the image of the second pattern PA2 in the second exposure area AR2 with the second exposure light beam EL2 which is emitted from the illumination system IL and which is radiated onto the second exposure area AR2 via the second pattern PA2 and the projection optical system PL. The exposure apparatus EX performs the multiple exposure for the shot area S on the substrate P with the image of the first pattern PA1 and the image of the second pattern PA2 formed as described above. The shot area S on the substrate P is subjected to the multiple exposure (double exposure) by being irradiated with the first exposure light beam EL1 from the first pattern PA1 and the second exposure light beam EL2 from the second pattern PA2.

When the shot area S on the substrate P is subjected to the multiple exposure with the image of the first pattern PA1 and the image of the second pattern PA2, the exposure apparatus EX of this embodiment adjusts the surface positional relationship among a first image plane IS1 on which the image of the first pattern PA1 is to be formed, a second image plane IS2 on which the image of the second pattern PA2 is to be formed, and the surface of the substrate P.

As described later on, the exposure apparatus EX of this embodiment is capable of adjusting, by using the mask stage 60, the positions of the first and second patterns PA1, PA2, i.e., the positions of a first pattern formation surface K1 on which a first pattern PA1 of the first mask M1 is formed and a second pattern formation surface K2 on which a second pattern PA2 of the second mask M2 is formed. The exposure apparatus EX is capable of adjusting the position of the first image plane IS1 (image of the first pattern PA1) by adjusting the position of the first pattern formation surface K1, and the exposure apparatus EX is capable of adjusting the position of the second image plane IS2 (image of the second pattern PA2) by adjusting the position of the second pattern formation surface K2. The adjustment of the surface position of the image plane (IS1, IS2) includes not only the adjustment of the position of the image plane in the Z axis direction but also the adjustment of the inclination of the image plane. The exposure apparatus EX is capable of adjusting the position of the surface of the substrate P by using the substrate stage 80. The adjustment of the surface position of the surface of the substrate P includes not only the adjustment of the position of the surface of the substrate P in the Z axis direction but also the adjustment of the inclination of the surface of the substrate P in the θX and θY directions. The exposure apparatus EX adjusts the surface position relationship among the first image plane IS1 on which the first pattern PA1 is to be formed, the second image plane IS2 on which the second pattern PA2 is to be formed, and the surface of the substrate P by adjusting at least one of the positions of the first pattern formation surface K1, the second pattern formation surface K2, and the surface of the substrate P by using the mask stage 60 and the substrate stage 80. It is assumed that the adjustment of the positions in the Z axis direction of the first and second image planes IS1, IS2 (images of the first and second patterns PA1, PA2) and the adjustment of the inclination in the θX and θY directions are performed by moving the first and second masks M1, M2 in the Z axis direction, the θX direction, and the θY direction. However, the method for adjusting the first and second image planes IS1, IS2 is not limited to the movement of the first and second masks M1, M2. For example, the first and second image planes IS1, IS2 may be adjusted, for example, by the optical adjustment of the projection optical system PL and/or the wavelength adjustment of the exposure light beam (EL1, EL2).

The exposure apparatus EX of this embodiment is provided with a focus/leveling-detecting system 130 which is capable of obtaining the surface information about the substrate P. As shown in FIG. 1, the focus/leveling-detecting system 130 of this embodiment is arranged separately and away from the projection optical system PL. The focus/leveling-detecting system 130 obtains the surface information about the substrate P before the start of the exposure operation for the substrate P. The surface information about the substrate P herein includes the position information of the surface of the substrate P and/or the shape information of the surface of the substrate P. The position information about the surface of the substrate P includes the position information of the surface of the substrate P in relation to the Z axis direction and the position (inclination) information in relation to the θX and θY directions. The shape information about the surface of the substrate P includes the concave/convex or irregularity information of the surface of the substrate P. The focus/leveling-detecting system 130 outputs the obtained result to the controller 30. The controller 30 adjusts the surface positional relationship among the first image plane IS1, the second image plane IS2, and the surface of the substrate P by adjusting at least one of the positions of the first pattern formation surface K1, the second pattern formation surface K2, and the surface of the substrate P by using the mask stage 60 and/or the substrate stage 80 on the basis of the detection result of the focus/leveling-detecting system 130. In this embodiment, a multi-point position-detecting system, which detects the height information about the substrate P (position information in relation to the Z axis direction) at a plurality of detection points respectively, may be used as the focus/leveling-detecting system 130 as disclosed, for example, in U.S. Pat. No. 6,608,681. For example, it is preferable that the positions of the plurality of detection points are different from each other in relation to a predetermined direction, and the plurality of detection points are arranged over a range approximately equivalent to the size (diameter) of the substrate P. Accordingly, the surface information about the substantially entire surface of the substrate P can be obtained by merely moving the substrate P in a direction intersecting the predetermined direction.

The exposure apparatus EX of this embodiment is the scanning type exposure apparatus (so-called scanning stepper) in which the image of the first pattern PA1 of the first mask M1 and the image of the second pattern PA2 of the second mask M2 are projected onto the substrate P while synchronously moving each of the first mask M1 having the first pattern PA1, the second mask M2 having the second pattern PA2, and the substrate P in the predetermined scanning direction. In this embodiment, the scanning direction (synchronous movement direction), in which each of the first mask M1, the second mask M2, and the substrate P is subjected to the scanning, is designated as the Y axis direction. The controller 30 controls the mask stage 60 and the substrate stage 80 so that the movement of the first mask M1 and the second mask M2 in the Y axis direction and the movement of the substrate P in the Y axis direction are performed synchronously.

In the exposure apparatus EX of this embodiment, the shot area S on the substrate P is subjected to the multiple exposure with the image of the first pattern PA1 formed by the first exposure light beam EL1 radiated onto the first exposure area AR1 and the image of the second pattern PA2 formed by the second exposure light beam EL2 radiated onto the second exposure area AR2 by radiating the first exposure light beam EL1 and the second exposure light beam EL2 onto the first exposure area AR1 and the second exposure area AR2 respectively while relatively moving the first exposure area AR1, the second exposure area AR2, and the shot area S on the substrate P in the Y axis direction. The mask stage 60 is capable of moving, in the Y axis direction, the first mask M1 having the first pattern PA1 with respect to the first illumination area IA1 onto which the first exposure light beam EL1 is radiated; and the mask stage 60 is capable of moving, in the Y axis direction, the second mask M2 having the second pattern PA2 with respect to the second illumination area IA2 onto which the second exposure light beam EL2 is radiated. The substrate stage 80 is capable of moving, in the Y axis direction, the shot area S on the substrate P with respect to the first exposure area AR1 and the second exposure area AR2. The first mask M1 having the first pattern PA1 and the second mask M2 having the second pattern PA2 are moved in the Y axis direction, and the substrate P is moved also in the Y axis direction during the exposure for the shot area S on the substrate P. The controller 30 performs the multiple exposure (double exposure) for the shot area S on the substrate P with the image of the first pattern PA1 and the image of the second pattern PA2 while moving the shot area S on the substrate P in the Y axis direction by using the substrate stage 80 with respect to the first exposure area AR1 and the second exposure area AR2 in synchronization with the movement of the first mask M1 and the second mask M2 in the Y axis direction performed by the mask stage 60.

The light source device 1 emits the exposure light beam EL for exposing the substrate P. Light beams usable as the exposure light beam EL emitted from the light source device 1 include, for example, emission lines (g-ray, h-ray, i-ray) radiated, for example, from a mercury lamp; far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser device is used as the light source device 1. The ArF excimer laser light beam is used as the exposure light beam EL. In this embodiment, the exposure apparatus EX is provided with one light source device 1.

Next, the illumination system IL will be explained. The illumination system IL of this embodiment splits the exposure light beam (laser beam) EL emitted from the light source device 1 into the first exposure light beam EL1 and the second exposure light beam EL2 by using a splitting optical system. The illumination system IL illuminates the first pattern PA1 of the first mask M1 with the first exposure light beam EL1; and further, the illumination system IL illuminates the second pattern PA2 of the second mask M2 with the second exposure light beam EL2. The illumination system IL of this embodiment includes a predetermined optical system which includes, for example, a beam expander, a polarization state-switching optical system, a diffraction optical element, an afocal optical system (non-focus optical system), a zoom optical system, a polarization conversion element, an optical integrator, a condenser optical system and the like as disclosed, for example, in International Publication No. 2005/076045 (corresponding to United States Patent Application Publication No. 2006/0170901); a blind device (masking system) which includes a fixed blind for defining the first illumination area IA1 brought about by the first exposure light beam EL1 on the first mask M1 and the second illumination area IA2 brought about by the second exposure light beam EL2 on the second mask M2, and a movable blind for avoiding any unnecessary exposure of the substrate P with the first and second exposure light beams EL1, EL2; and the splitting optical system which splits the exposure light beam EL into the first exposure light beam EL1 and the second exposure light beam EL2, the exposure light beam EL being emitted from the light source device 1 and allowed to pass via the predetermined optical system described above. The splitting optical system of this embodiment includes a polarization splitting optical system (for example, a polarization beam splitter) which splits the exposure light beam EL into a first exposure light beam EL1 in a first polarization state and a second exposure light beam EL2 in a second polarization state. The exposure light beam EL, which is emitted from the light source device 1, which is allowed to pass via, for example, the predetermined optical system of the illumination system IL, and which mainly contains a first polarization component and a second polarization component, is split by the splitting optical system into the first exposure light beam EL1 in the first polarization state and the second exposure light beam EL2 in the second polarization state. The illumination system IL illuminates the first pattern PA1 of the first mask M1 with the first exposure light beam EL1 in the first polarization state (for example, in the S-polarization state) split by the splitting optical system by the aid of the blind device, and the illumination system IL illuminates the second pattern PA2 of the second mask M2 with the second exposure light beam EL2 in the second polarization state (for example, in the P-polarization state).

In this embodiment, the illumination system IL illuminates the first and second patterns PA1, PA2 with the first and second exposure light beams EL1, EL2 in the mutually different polarization states. However, the first and second patterns PA1, PA2 may be illuminated with the first and second exposure light beams EL1, EL2 in a same polarization state. At least one of the first and second exposure light beams EL1, EL2 may be in the random polarization state (no polarization state). In this embodiment, the exposure light beam EL, which is emitted from the single light source device 1, is split by the illumination system IL into the first and second exposure light beams EL1, EL2. However, for example, it is also allowable to provide first and second light source devices, a first illumination system which is optically connected to the first light source device and which emits the first exposure light beam EL1 for illuminating the first pattern PA1 of the first mask M1 therewith, and a second illumination system which is optically connected to the second light source device and which emits the second exposure light beam EL2 for illuminating the second pattern PA2 of the second mask M2 therewith. In this case, a part or parts of the first illumination system and the second illumination system may be commonly used.

Next, the mask stage 60 will be explained. The mask stage 60 is capable of moving the first mask M1 having the first pattern PA1 in the Y axis direction with respect to the first exposure light beam EL1, and the mask stage 60 is capable of moving the second mask M2 having the second pattern PA2 in the Y axis direction with respect to the second exposure light beam EL2. The position information about each of the first mask M1 and the second mask M2 on the mask stage 60 is measured by the measuring system 70.

Figure 2:
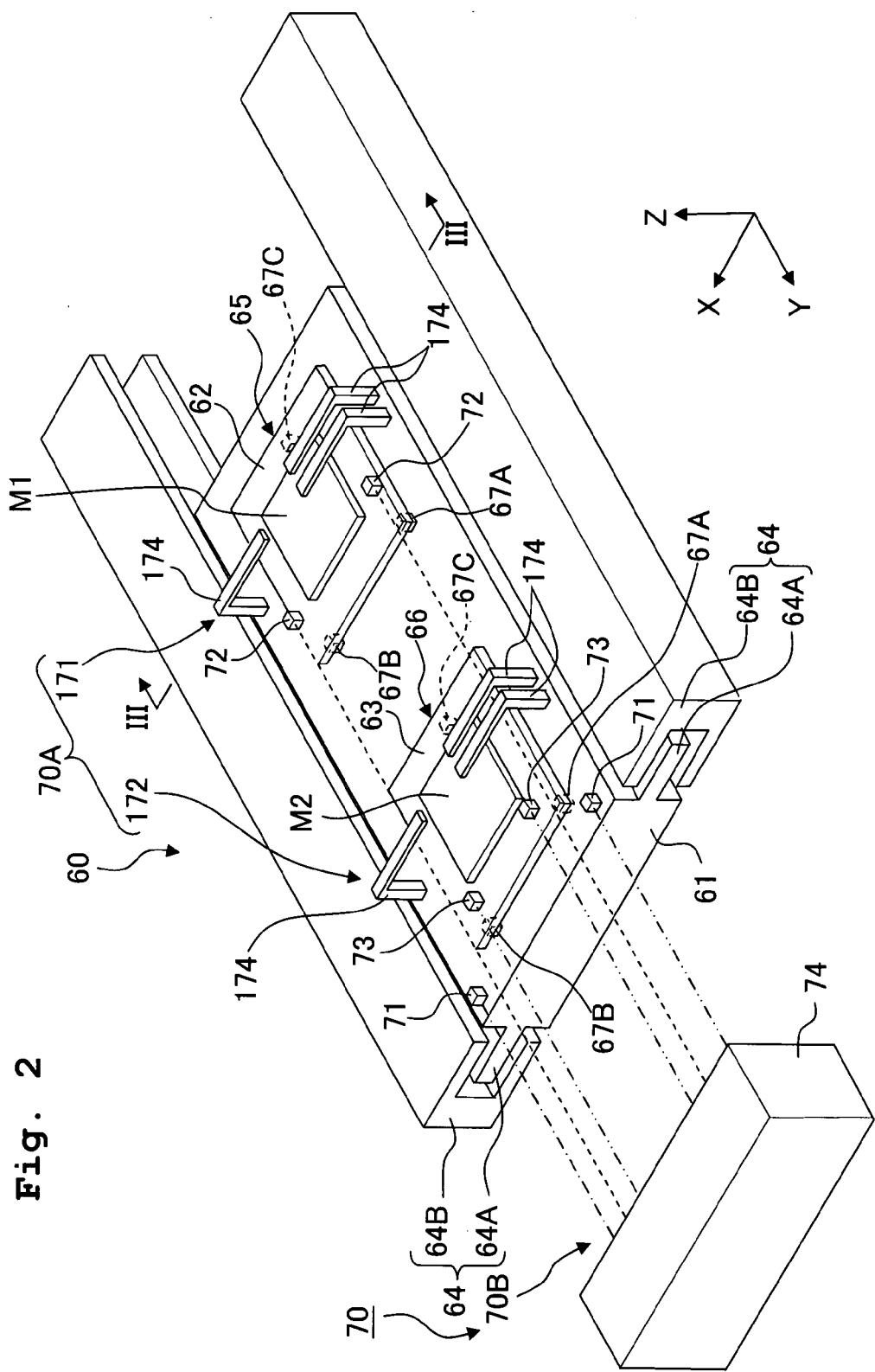
FIG. 2 shows a perspective view illustrating an exemplary mask stage.

FIG. 2 shows a perspective view illustrating the mask stage 60 and the measuring system 70 according to this embodiment. The mask stage 60 includes a main stage 61, a first substage 62 which is movable on the main stage 61 while holding the first mask M1, and a second substage 63 which is movable on the main stage 61 while holding the second mask M2.

The main stage 61 moves the first mask M1 and the second mask M2 in the Y axis direction. The main stage 61 holds the first mask M1 by the aid of the first substage 62, and the main stage 61 holds the second mask M2 by the aid of the second substage 63. The main stage 61 is capable of moving the first and second masks M1, M2 in the same scanning direction (Y axis direction) while holding the first mask M1 and the second mask M2 by the aid of the first substage 62 and the second substage 63, respectively.

The main stage 61 has a relatively large stroke in the Y axis direction so that the entire first pattern PA1 of the first mask M1 is allowed to pass across the first illumination area IA1 and the entire second pattern PA2 of the second mask M2 is allowed to pass across the second illumination area IA2 during the scanning exposure for one shot area S on the substrate P. The mask stage 60 is provided with a main stage-driving device 64 for moving the main stage 61 in the Y axis direction. The main stage-driving device 64 includes, for example, an actuator such as a linear motor. In this embodiment, the main stage-driving device 64 includes movers 64A which are provided on the both sides of the main stage 61 in the X axis direction, and stators 64B which are provided corresponding to the movers 64A. The controller 30 is capable of moving the main stage 61 in the Y axis direction by driving the main stage-driving device 64. When the main stage 61 is moved in the Y axis direction, the first and second substages 62, 63 are also moved in the Y axis direction together with the main stage 61. Therefore, when the main stage 61 is moved in the Y axis direction, the first and second masks M1, M2, which are held by the first and second substages 62, 63, are also moved in the Y axis direction together with the main stage 61.

The first substage 62 is provided to be finely movably in the directions of six degrees of freedom of the X axis, Y axis, Z axis, θX, θY, and θZ directions with respect to the main stage 61. Similarly, the second substage 63 is also provided to be finely movably in the directions of six degrees of freedom of the X axis, Y axis, Z axis, θX, θY, and θZ directions with respect to the main stage 61.

The mask stage 60 is provided with a first substage-driving device 65 which is capable of moving the first substage 62 with respect to the main stage 61, and a second substage-driving device 66 which is capable of moving the second substage 63 with respect to the main stage 62. The first mask M1, which is held by the first substage 62, is finely movable by the first substage-driving device 65 in the directions of six degrees of freedom of the X axis, Y axis, Z axis, θX, θY, and θZ directions by moving the first substage 62 with respect to the main stage 61. Similarly, the second mask M2, which is held by the second substage 63, is finely movable by the second substage-driving device 66 in the X axis, Y axis, Z axis, θX, θY, and θZ directions by moving the second substage 63 with respect to the main stage 61. The controller 30 is capable of adjusting the positions, in relation to the directions of six degrees of freedom, of the first and second masks M1, M2 held by the first and second substages 62, 63 by controlling the first and second substage-driving devices 65, 66 to move the first and second substages 62, 63.

Figure 3:
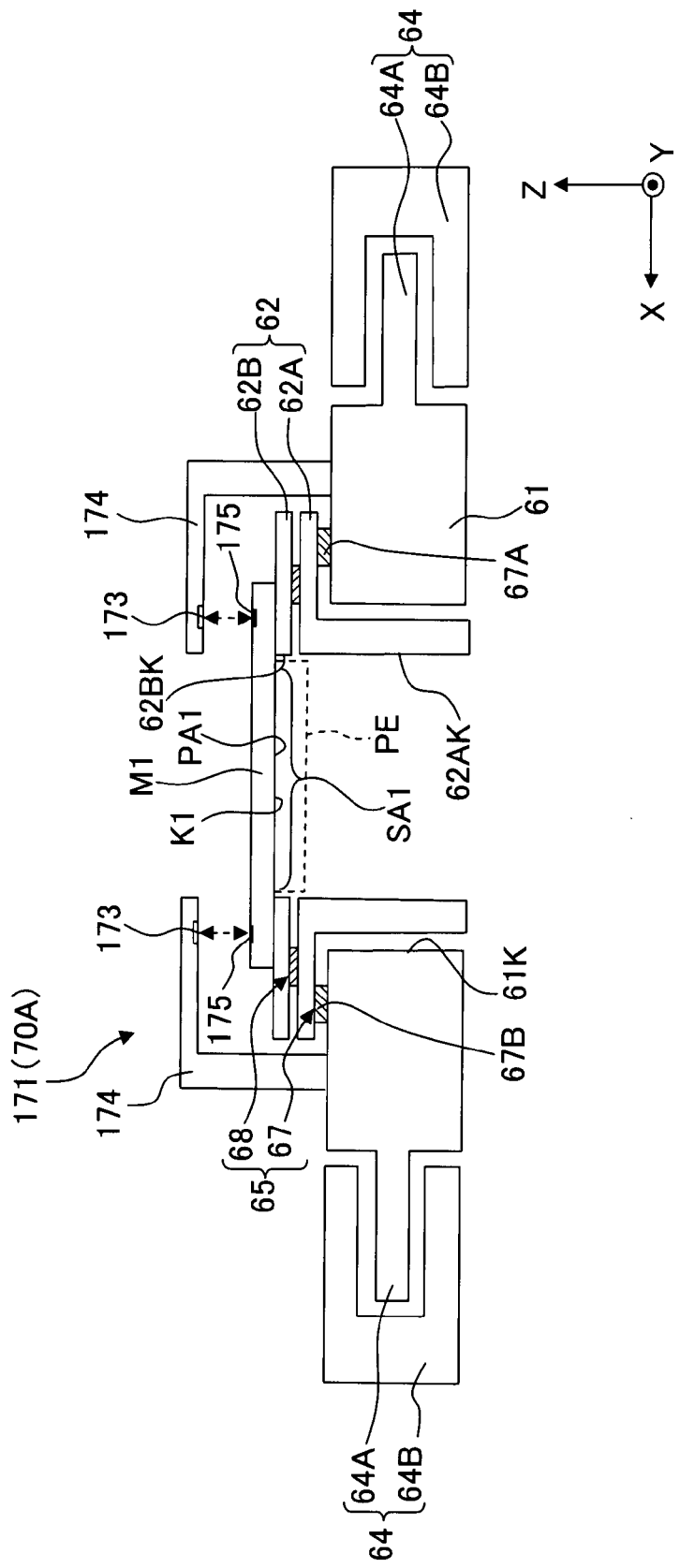
FIG. 3 shows a sectional view taken along a line III-III as indicated by arrows shown in FIG. 2.

FIG. 3 shows a sectional view taken along a line III-III as indicated by arrows shown in FIG. 2. With reference to FIG. 3, the first pattern PA1 is formed on the lower surface of the first mask M1. The lower surface of the first mask M1 is the first pattern formation surface K1. The first pattern formation area SA1, which is included in the lower surface of the first mask M1 and in which the first pattern PA1 is formed, is covered with a pellicle PE. The pellicle PE and the lower surface of the first mask M1 are connected by a pellicle frame.

The first substage 62 has a table 62A which is provided on the main stage 61, and a holder 62B which is provided on the table 62A and which holds the first mask M1. An opening 61K is formed for the main stage 61. In this embodiment, a part of the table 62A is arranged in the opening 61K. Openings 62AK, 62BK are formed for the table 62A and the holder 62B respectively as well. The holder 62B holds the first mask M1 at an area, of the lower surface thereof, disposed outside the first pattern formation area SA1 so that the first pattern formation area SA1 of the first mask M1 is arranged inside the openings 62AK, 62BK. The first exposure light beam EL1, which is emitted from the illumination system IL and which illuminates the first pattern PA1 of the first mask M1, is allowed to pass through the openings 62AK, 62BK to come into the projection optical system PL without being shielded by the mask stage 60.

The table 62A is provided to be movable in the Z axis, θX, and θY directions with respect to the main stage 61. The holder 62B is provided to be movable in the X axis, Y axis, and θZ directions with respect to the table 62A. The first substage-driving device 65 includes a Z driving mechanism 67 which is provided between the main stage 61 and the table 62A and which is capable of moving the table 62A in the Z axis, θX, and θY directions with respect to the main stage 61; and an XY driving mechanism 68 which is provided between the table 62A and the holder 62B and which is capable of moving the holder 62B in the X axis, Y axis, and θZ directions with respect to the table 62A. The Z driving mechanism 67 includes a plurality of (three) actuators 67A, 67B, 67C including, for example, voice coil motors (see FIG. 2). The controller 30 is capable of moving the table 62A in the Z axis, θX, and θY directions with respect to the main stage 61 by adjusting driving amounts of the plurality of actuators 67A, 67B, 67C of the Z driving mechanism 67 respectively. The controller 30 is capable of adjusting the position of the first mask M1 held by the holder 62B on the table 62A in relation to the Z axis, θX, and θY directions by controlling the Z driving mechanism 67 to adjust the position of the table 62A in relation to the Z axis, θX, and θY directions. The XY driving mechanism 68 includes a plurality of actuators including, for example, voice coil motors. The controller 30 is capable of moving the holder 62B in the X axis, Y axis, and θZ directions with respect to the table 62A by driving the XY driving mechanism 68. The controller 30 is capable of adjusting the position of the first mask M1 held by the holder 62B in relation to the X axis, Y axis, and θZ directions by controlling the XY driving mechanism 68 to adjust the position of the holder 62B in relation to the X axis, Y axis, and θZ directions.

As described above, in this embodiment, the controller 30 is capable of moving the first mask M1 in the directions of six degrees of freedom of the X axis, Y axis, Z axis, θX, θY, and θZ directions with respect to the main stage 61 by controlling the first substage-driving device 65 including the Z driving mechanism 67 and the XY driving mechanism 68, and thus the controller 30 is capable of adjusting the position of the first mask M1 in the directions of six degrees of freedom of the X axis, Y axis, Z axis, θX, θY, and θZ directions with respect to the main stage 61.

The second substage 63 also has a table which is provided on the main stage 61, and a holder which is provided on the table and which holds the second mask M2 in the same manner as the first substage 62. An opening 61K corresponding to the second substage 63 is formed for the main stage 61. The second substage-driving device 66 also includes a Z driving mechanism which is capable of moving the table of the second substage 63 in the Z axis, θX, and θY directions with respect to the main stage 61, and an XY driving mechanism which is capable of moving the holder in the X axis, Y axis, and θZ directions with respect to the table of the second substage 63 in the same manner as the first substage-driving device 65. The controller 30 is capable of moving the second mask M2 in the directions of six degrees of freedom of the X axis, Y axis, Z axis, θX, θY, and θZ directions with respect to the main stage 61 by controlling the second substage-driving device 66 including the Z driving mechanism and the XY driving mechanism, and thus the controller 30 is capable of adjusting the position of the second mask M2 in relation to the directions of six degrees of freedom of the X axis, Y axis, Z axis, θX, θY, and θZ directions with respect to the main stage 61.

Next, the measuring system 70 will be explained. The measuring system 70 is capable of measuring the position information about the first mask M1 and the position information about the second mask M2. With reference to FIG. 2, the measuring system 70 includes a Z measuring device 70A which measures the position information about the first mask M1 and the second mask M2 in relation to the Z axis, θX, and θY directions with respect to the main stage 61; and an XY measuring device 70B which measures the position information about the first mask M1 on the first substage 62 and the second mask M2 on the second substage 63 in relation to the X axis, Y axis, and θZ directions by measuring the position information about the main stage 61, the first substage 62, and the second substage 62 in relation to the X axis, Y axis, and θZ directions. That is, the measuring system 70 of this embodiment is capable of measuring the position information about each of the first mask M1 and the second mask M2 in relation to the directions of six degrees of freedom of the X axis, Y axis, Z axis, θX, θY, and θZ directions.

The Z measuring device 70A includes a first mask measuring device 171 which radiates a measuring beam onto the first mask M1 and which receives a reflected light beam thereof to optically obtain the position information of the first mask M1 with respect to the main stage 61, and a second mask measuring device 172 which radiates a measuring beam onto the second mask M2 and which receives a reflected light beam thereof to optically obtain the position information of the second mask M2 with respect to the main stage 61.

As shown in FIG. 3, the first mask measuring device 171 includes a laser interferometer 173 which radiates a measuring beam onto the first mask M1 and which receives a reflected light beam of the measuring beam radiated onto the first mask M1 to obtain the position information about the first mask M1 on the basis of the light-receiving result. The laser interferometer 173 of the first mask measuring device 171 is supported by a support member 174. The support member 174 is attached onto the main stage 61. That is, the laser interferometer 173 of the first mask measuring device 171 is attached onto the main stage 61 by the aid of the support member 174. The first mask measuring device 171 is provided so that the radiation of the first exposure light beam EL1 onto the first mask M1 is not inhibited or disturbed thereby.

The first mask measuring device 171 radiates the measuring beam onto the area disposed outside the area, among the upper surface of the first mask M1, onto which the first exposure light beam EL1 is radiated. A reflective area 175 is formed in the area, among the upper surface of the first mask M1, onto which the measuring beam from the laser interferometer 173 is radiated in order to satisfactorily reflect the radiated measuring beam. The laser interferometer 173 of the first mask measuring device 171 is capable of obtaining the position information about the upper surface of the first mask M1 in relation to the Z axis direction by radiating the measuring beam onto the reflective area 175 of the upper surface of the first mask M1 from the position separated and away from the first mask M1 and by receiving the reflected light beam thereof. As shown in FIG. 2, the interferometer 173 is provided for one first mask M1 as a plurality of (three) laser interferometers 173, each of which is supported by a support member 174. The results of measurement performed by the plurality of (three) laser interferometers 173 are outputted to the controller 30 respectively. The controller 30 is capable of obtaining the position information about the first mask M1 in relation to the Z axis, θX, and θY directions with respect to the main stage 61 on the basis of the results of measurement performed by the plurality of laser interferometers 173 of the first mask measuring device 171.

The second mask measuring device 172 also includes a laser interferometer 173 which radiates a measuring beam onto a reflective area 175 provided on the upper surface of the second mask M2 and which receives a reflected light beam of the measuring beam radiated onto the second mask M2 to obtain the position information about the second mask M2 on the basis of the light-receiving result in the same manner as the first mask measuring device 171. The laser interferometer 173 is supported by a support member 174 attached onto the main stage 61. The interferometer 173 is provided for one second mask M2 as a plurality of (three) laser interferometers 173 each of which is supported by a support member 174. The controller 30 is capable of obtaining the position information about the second mask M2 in relation to the Z axis, θX, and θY directions with respect to the main stage 61 on the basis of the results of measurement performed by the plurality of laser interferometers 173 of the second mask measuring device 172.

In this embodiment, the Z measuring device 70A receives the measuring beams radiated from the laser interferometers 173 and reflected by the reflective areas 175 provided on the upper surfaces of the first and second masks M1, M2. However, the reflective areas 175 may be provided on the lower surfaces rather than providing the reflective areas 175 on the upper surfaces of the first and second masks M1, M2; and the position information about the first and second masks M1, M2 may be obtained on the basis of reflected light beams of the measuring beams allowed to pass through the first and second masks M1, M2 and reflected by the reflective areas 175 provided on the lower surfaces of the first and second masks M1, M2. Further, only a part of the laser interferometers 173 may be supported by the support member 174.

As shown in FIG. 2, the XY measuring device 70B of the measuring system 70 includes reflecting members 71 which are provided on the main stage 61, reflecting members 72 which are provided on the first substage 62, reflecting members 73 which are provided on the second substage 63, and a laser interferometer 74 which radiates measuring beams onto reflecting surfaces of the reflecting members 71, 72, 73 and which receives the reflected light beams to obtain the position informations about the main stage 61, the first substage 62, and the second substage 63 respectively. In this embodiment, a part (for example, the optical system) of the laser interferometer 74 is arranged on the +Y side of the mask stage 60. The reflecting member 71 includes, for example, a corner cube mirror (retroreflector), and two pieces of the reflecting member 71 are provided at predetermined positions on the main stage 61 at which the measuring beams from the laser interferometer 74 can be radiated. The reflecting member 72 also includes, for example, a corner cube mirror, and two pieces of the reflecting member 72 are provided at predetermined positions on the first substage 62 at which the measuring beams from the laser interferometer 74 can be radiated. The reflecting member 73 also includes, for example, a corner cube mirror, and two pieces of the reflecting member 73 are provided at predetermined positions on the second substage 63 at which the measuring beams from the laser interferometer 74 can be radiated. The measuring system 70 is capable of measuring the position information in the Y axis direction and the θZ direction about each of the main stage 61, the first substage 62, and the second substage 63 by using the laser interferometer 74 and the reflecting members 71, 72, 73. Although not shown, the XY measuring device 70B of the measuring system 70 is also provided with a laser interferometer and reflecting members (reflecting surfaces) in order to measure the position information in the X axis direction about the main stage 61, the first substage 62, and the second substage 63.

The XY measuring device 70B of the measuring system 70 measures the position informations of the main stage 61 in relation to the X axis direction, the Y axis direction, and the θZ direction by using the laser interferometer 74 and the reflecting members 71 provided on the main stage 61. The XY measuring device 70B of the measuring system 70 measures the position informations of the first and second substages 62, 63 in relation to the X axis direction, the Y axis direction, and the θZ direction by using the laser interferometer 74 and the reflecting members 72, 73 provided on the first and second substages 62, 63.

The controller 30 appropriately drives the main stage 61, the first substage 62, and the second substage 63, on the basis of the measurement result of the measuring system 70, by using the main stage-driving device 64, the first substage-driving device 65, and the second substage-driving device 66 to control the positions of the first and second masks M1, M2 held by the first and second substages 62, 63. The controller 30 moves at least one of the first substage 62 and the second substage 63 with respect to the main stage 61. Accordingly, the controller 30 is capable of adjusting the relative positional relationship between the first mask M1 and the second mask M2.

Figure 4:
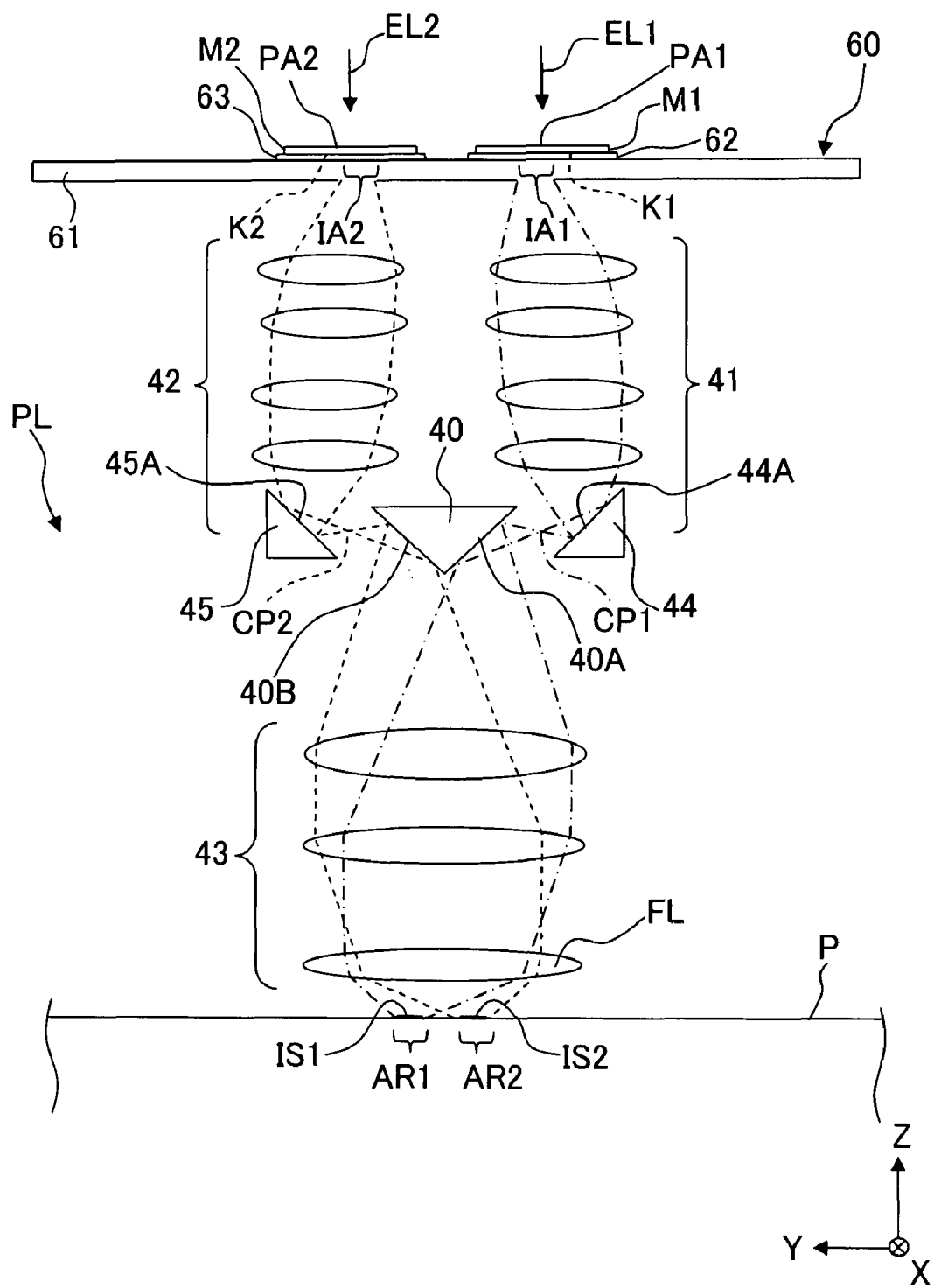
FIG. 4 shows a view illustrating an exemplary projection optical system.

Next, the projection optical system PL will be explained with reference to FIG. 4. The projection optical system PL projects, at a predetermined projection magnification onto the substrate P, the image of the first pattern PA1 of the first mask M1 illuminated with the first exposure light beam EL1 and the image of the second pattern PA2 of the second mask M2 illuminated with the second exposure light beam EL2. The projection optical system PL of this embodiment is a reduction system having its projection magnification which is, for example, ¼, ⅕, ⅛ or the like. The projection optical system PL of this embodiment forms an inverted image.

The projection optical system PL of this embodiment has a plurality of optical elements including a final (last) optical element FL which is arranged opposite to or facing a surface of the substrate P and which is closest to the image plane of the projection optical system PL. The projection optical system PL radiates the first exposure light beam EL1 and the second exposure light beam EL2 onto the first exposure area AR1 and the second exposure area AR2 respectively via the final optical element FL to form the image of the first pattern PA1 and the image of the second pattern PA2.

The projection optical system PL includes a first reflecting surface 40A which is arranged in the vicinity of a position optically conjugate with the first exposure area AR1 and the second exposure area AR2, a second reflecting surface 40B which is arranged in the vicinity of the position optically conjugate with the first exposure area AR1 and the second exposure area AR2, a first optical system 41 which guides the first exposure light beam EL1 from the first pattern PA1 to the first reflecting surface 40A, a second optical system 42 which guides the second exposure light beam EL2 from the second pattern PA2 to the second reflecting surface 40B, and a third optical system 43 which includes the final optical element FL and which guides the first exposure light beam EL1 from the first reflecting surface 40A and the second exposure light beam EL2 from the second reflecting surface 40B to the first exposure area AR1 and the second exposure area AR2 respectively.

The first optical system 41 includes a plurality of lenses, and a reflecting member 44 having a reflecting surface 44A which reflects, toward the first reflecting surface 40A, the first exposure light beam EL1 allowed to pass through the plurality of lenses. The second optical system 42 includes a plurality of lenses, and a reflecting member 45 having a reflecting surface 45A which reflects, toward the second reflecting surface 40B, the second exposure light beam EL2 allowed to pass through the plurality of lenses.

In this embodiment, the first reflecting surface 40A and the second reflecting surface 40B are provided on an intermediate optical member 40 arranged at a predetermined position. In this embodiment, the intermediate optical member 40 includes a prism.

The first exposure light beam EL1 from the first pattern PA1 of the first mask M1 and the second exposure light beam EL2 from the second pattern PA2 of the second mask M2 are guided by the first optical system 41 and the second optical system 42 to the first reflecting surface 40A and the second reflecting surface 40B of the intermediate optical member 40 respectively. In this case, the first and second exposure light beams EL1, EL2, which are patterned by the first and second masks M1, M2, are intermediately imaged respectively at first conjugate position CP1 and second conjugate position CP2 as positions optically conjugate with the first and second masks M1, M2 respectively, and then the first and second exposure light beams EL1, EL2 are guided to the intermediate optical member 40. The first exposure light beam EL1 from the first pattern PA1 of the first mask M1 and the second exposure light beam EL2 from the second pattern PA2 of the second mask M2 are reflected by the intermediate optical member 40, and then are radiated onto the first exposure area AR1 and the second exposure area AR2 respectively via the third optical system 43 which includes the final optical element FL. As described above, the projection optical system PL of this embodiment is capable of radiating the first exposure light beam EL1 from the first pattern PA1 onto the first exposure area AR1, and the projection optical system PL is capable of radiating the second exposure light beam EL2 from the second pattern PA2 onto the second exposure area AR2.

As shown in FIG. 1, the first optical system 41, the second optical system 42, the third optical system 43, and the intermediate optical member 40 of the projection optical system PL are held by a barrel PK. The projection optical system PL of this embodiment is provided with a first imaging characteristic-adjusting device LC1 and a second imaging characteristic-adjusting device LC2 which are capable of adjusting the imaging characteristics (imaging states) of the image of the first pattern PA1 and the image of the second pattern PA2 brought about by the projection optical system PL. Each of the first and second imaging characteristic-adjusting devices LC1, LC2 includes an optical element-driving mechanism which is capable of moving at least one of the plurality of optical elements of the projection optical system PL.

The first imaging characteristic-adjusting device LC1 is capable of moving at least one specified or predetermined optical element of the first optical system 41 in the Z axis direction parallel to the optical axis of the first optical system 41 and the directions (X axis and Y axis directions) perpendicular to the optical axis. Further, the first imaging characteristic-adjusting device LC1 is capable of inclining at least one predetermined optical element of the first optical system 41 with respect to the XY plane perpendicular to the optical axis (i.e., capable of rotating the at least one predetermined optical element in the $\theta X$ and $\theta Y$ directions). The first exposure light beam EL1 from the first pattern PA1 is radiated onto the first exposure area AR1 via the first optical system 41, the intermediate optical member 40, and the third optical system 43. The first imaging characteristic-adjusting device LC1 is capable of adjusting the imaging characteristic of the image of the first pattern PA1 formed with the first exposure light beam EL1 radiated onto the first exposure area AR1 by driving the predetermined optical element of the first optical system 41.

The second imaging characteristic-adjusting device LC2 is capable of moving at least one predetermined optical element of the second optical system 42 in the Z axis direction parallel to the optical axis of the second optical system 42 and the X axis and Y axis directions. Further, the second imaging characteristic-adjusting device LC2 is capable of inclining at least one predetermined optical element of the second optical system 42 with respect to the XY plane perpendicular to the optical axis (i.e., capable of rotating the at least one predetermined optical element in the $\theta X$ and $\theta Y$ directions). The second exposure light beam EL2 from the second pattern PA2 is radiated onto the second exposure area AR2 via the second optical system 42, the intermediate optical member 40, and the third optical system 43. The second imaging characteristic-adjusting device LC2 is capable of adjusting the imaging characteristic of the image of the second pattern PA2 formed with the second exposure light beam EL2 radiated onto the second exposure area AR2 by driving the predetermined optical element of the second optical system 42.

The first and second imaging characteristic-adjusting devices LC1, LC2 are controlled by the controller 30. The controller 30 drives the predetermined optical element of the projection optical system PL (first and second optical systems 41, 42) by using the first and second imaging characteristic-adjusting devices LC1, LC2. Accordingly, the controller 30 is capable of adjusting the imaging characteristic of the projection optical system PL including, for example, various aberrations (for example, the distortion, the astigmatism, the spherical aberration, the wave front aberration, and the like), the projection magnification, the image plane position (focus position), and the like.

The controller 30 is also capable of performing the positional adjustment (i.e., shift adjustment and/or rotation adjustment) in the XY directions and/or the $\theta Z$ direction of the images of the first and second patterns PA1, PA2 by using the first and second imaging characteristic-adjusting devices LC1, LC2.

That is, the controller 30 is capable of adjusting the position of the first image plane IS1 on which the image of the first pattern PA1 is to be formed, by using the first imaging characteristic-adjusting device LC1; and the controller 30 is capable of adjusting the position of the second image plane IS2 on which the image of the second pattern PA2 is to be formed, by using the second imaging characteristic-adjusting device LC2. Specifically, the first imaging characteristic-adjusting device LC1 is capable of performing the positional adjustment in the Z axis direction (focus direction) of the first image plane IS1 and the positional adjustment (inclination adjustment) in the $\theta X$ and $\theta Y$ directions (inclination directions of the first image plane IS1). Similarly, the second imaging characteristic-adjusting device LC2 is capable of performing the positional adjustment in the Z axis direction of the second image plane IS2 and the positional adjustment in the $\theta X$ and $\theta Y$ directions of the second image plane IS2.

In this embodiment, at least one of the optical element of each of the first and second optical systems 41, 42, which is moved by one of the first and second imaging characteristic-adjusting devices LC1, LC2, is a lens. However, the at least one optical element may be any other optical element such as a plane-parallel, a reflecting element or the like. In this embodiment, the two imaging characteristic-adjusting devices (LC1, LC2) are provided. However, it is also allowable that only one imaging characteristic-adjusting device is provided. Alternatively, it is also allowable that three or more imaging characteristic-adjusting devices are provided. For example, it is also allowable to provide an imaging characteristic-adjusting device which is capable of moving at least one of the optical elements of the third optical system 43 in the Z axis direction that is parallel to the optical axis of the third optical system 43, and which is capable of rotating at least one of the optical elements of the third optical system 43 in the θX and θY directions. In this embodiment, the imaging characteristic-adjusting device moves the optical element in the directions of five degrees of freedom (in the X axis, Y axis, Z axis, θX, and θY directions). However, the direction of movement of the optical element is not limited to the directions of five degrees of freedom. This embodiment adopts the system in which the imaging characteristic-adjusting device moves the optical element. However, it is also allowable to use any other system in place of the imaging characteristic-adjusting device or in combination therewith. For example, a pressure-adjusting mechanism, which adjusts the pressure of a gas retained in a space between parts of the optical elements held in the barrel PK, may be used as the first and second imaging characteristic-adjusting devices LC1, LC2.

The exposure apparatus, which is provided with the imaging characteristic-adjusting device capable of adjusting the imaging characteristic of the image of the pattern brought about by the projection optical system, is disclosed, for example, in Japanese Patent Application Laid-open No. 60-78454 (corresponding to U.S. Pat. No. 4,666,273), Japanese Patent Application Laid-open No. 11-195602 (corresponding to U.S. Pat. No. 6,235,438), and International Publication No. 03/65428 (corresponding to United States Patent Application Publication No. 2005/0206850). The disclosures of, for example, U.S. Pat. Nos. 4,666,273 and 6,235,438, United States Patent Application Publication No. 2005/0206850 and the like described above are incorporated herein by reference within a range of permission of the domestic laws and ordinances of the designated or selected state.

Next, the substrate stage 80 will be explained. The substrate stage 80 is movable while holding the substrate P in a predetermined area including the first exposure area AR1 and the second exposure area AR2 onto which the first exposure light beam EL1 and the second exposure light beam EL2 are radiated respectively. For example, the substrate stage 80 is capable of moving the shot area S on the substrate P in the Y axis direction with respect to the first exposure area AR1 and the second exposure area AR2 during the scanning exposure.

As shown in FIG. 1, the substrate stage 80 includes a stage body 80B, a substrate table 80T which is provided on the stage body 80B, and a substrate holder 80H which is provided on the substrate table 80T and which holds the substrate P. The stage body 80B is supported in a non-contact manner with respect to the upper surface (guide surface) of the base member BP by air bearings 80A. The exposure apparatus EX has a substrate stage-driving device 80D which is capable of moving the substrate P held by the substrate holder 80H. The substrate P can be moved in the directions of six degrees of freedom of the X axis, Y axis, Z axis, θX, θY, and θZ directions in accordance with the driving operation of the substrate stage-driving device 80D.

The substrate stage-driving device 80D is provided with an XY driving mechanism 81 which is capable of moving the stage body 80B in the X axis, Y axis, and θZ directions on the base member BP, and a Z driving mechanism 82 which is capable of moving the substrate table 80T in the Z axis, θX, and θY directions with respect to the stage body 80B.

The XY driving mechanism 81 includes, for example, an actuator such as a linear motor. The controller 30 is capable of moving the stage body 80B in the X axis, Y axis, and θZ directions on the base member BP by controlling the XY driving mechanism 81. The Z driving mechanism 82 includes three actuators 83A, 83B, 83C (actuator 83C provided on the back side of the sheet surface of FIG. 1 is not shown) which are provided between the stage body 80B and the substrate table 80T, and encoders 84A, 84B, 84C (encoder 84C provided on the back side of the sheet surface of FIG. 1 is not shown) which measure the driving amount of the substrate table 80T in the Z axis direction brought about by the actuators 83A, 83B, 83C. The actuators 83A, 83B, 83C of the Z driving mechanism 82 include, for example, voice coil motors or the like. Linear encoders of, for example, the optical system or the capacitance system may be used as the encoders 84A, 84B, 84C.

The controller 30 is capable of moving the substrate table 80T in the Z axis, θX, and θY directions with respect to the stage body 80B by adjusting the driving amounts of the plurality of actuators 83A, 83B, 83C of the Z driving mechanism 82 respectively. The controller 30 is capable of adjusting the position of the substrate P held by the substrate holder 80H of the substrate table 80T in relation to the Z axis, θX, and θY directions by controlling the Z driving mechanism 82 to adjust the position of the substrate table 80T in relation to the Z axis, θX, and θY directions. In addition, the controller 30 is capable of moving the stage body 80B in the X axis, Y axis, and θZ directions by driving the XY driving mechanism 81. The controller 30 is capable of adjusting the position of the substrate P, held by the substrate holder 80H of the substrate table 80T on the stage body 80B, in relation to the X axis, Y axis, and θZ directions by controlling the XY driving mechanism 81 to adjust the position of the stage body 80B in relation to the X axis, Y axis, and θZ directions.

As described above, in this embodiment, the controller 30 controls the substrate stage-driving device 80D including the XY driving mechanism 81 and the Z driving mechanism 82, to thereby move the substrate P, which is held by the substrate holder 80H of the substrate stage 80, in the directions of six degrees of freedom of the X axis, Y axis, Z axis, θX, θY, and θZ directions; and the controller 30 is capable of adjusting the position of the substrate P in relation to the directions of six degrees of freedom of the X axis, Y axis, Z axis, θX, θY, and θZ directions.

The position information about the substrate table 80T of the substrate stage 80 (as well as the substrate P) in relation to the X axis, Y axis, and θZ directions is measured by a laser interferometer 75 of the measuring system 70. The laser interferometer 75 measures the position information about the substrate table 80T in relation to the X axis, Y axis, and θZ directions by using a reflecting surface 76 provided on the substrate table 80T. The measuring system 70 may measure, for example, the position information about the substrate table 80T in relation to the Z axis, θX, and θY directions by using the laser interferometer 75.

The encoders 84A, 84B, 84C of the Z driving mechanism 82 are capable of measuring the driving amounts in the Z axis direction at the respective support points of the actuators 83A, 83B, 83C with respect to the substrate table 80T. The measurement results are outputted to the controller 30. The controller 30 can determine the position of the substrate table 80T in relation to the Z axis, θX, and θY directions on the basis of the measurement results of the encoders 84A, 84B, 84C.

The surface information about the substrate P held by the substrate holder 80H of the substrate table 80T (including the position information in relation to the Z axis, θX, and θY directions) is detected by the focus/leveling-detecting system 130 before the exposure operation for the substrate P is started. The controller 30 drives the substrate stage-driving device 80D to control the position of the substrate P held by the substrate holder 80H of the substrate table 80T on the basis of the measurement result of the interferometer 75, the measurement results of the encoders 84A, 84B, 84C and the detection result of the focus/leveling-detecting system 130.

Next, the measuring stage 90 will be explained. The measuring stage 90 is movable while having thereon the measuring instrument or the measuring device which performs the measurement in relation to the exposure in a predetermined area including the first exposure area AR1 and the second exposure area AR2 onto which the first exposure light beam EL1 and the second exposure light beam EL2 are radiated. The measuring instrument is exemplified by a measuring instrument (measuring member) for measuring the state of the exposure light beam EL and the imaging characteristic (optical characteristic) of the projection optical system PL. The measurement result with the measuring instrument is outputted to the controller 30.

As shown in FIG. 1, the measuring stage 90 is provided with a stage body 90B, and a measuring table 90T which is provided on the stage body 90B. The measuring instrument is provided on the measuring table 90T. The stage body 90B is supported in a non-contact manner with respect to the upper surface (guide surface) of the base member BP by air bearings 80A. The exposure apparatus EX has a measuring stage-driving device 90D which is capable of moving the measuring table 90T having the measuring instrument thereon; and the exposure apparatus EX is capable of moving the measuring table 90T in the directions of six degrees of freedom of the X axis, Y axis, Z axis, θX, θY, and θZ directions in accordance with the driving operation of the measuring stage-driving device 90D.

The measuring stage-driving device 90D is constructed substantially equivalently to the substrate stage-driving device 80D. The measuring stage-driving device 90D is provided with an XY driving mechanism 91 which is capable of moving the stage body 90B in the X axis, Y axis, and θZ directions on the base member BP, and a Z driving mechanism 92 which is capable of moving the measuring table 90T in the Z axis, θX, and θY directions with respect to the stage body 90B.

The XY driving mechanism 91 includes, for example, an actuator such as a linear motor. The controller 30 is capable of moving the stage body 90B supported in the non-contact manner in the X axis, Y axis, and θZ directions on the base member BP by controlling the XY driving mechanism 91. The Z driving mechanism 92 of the measuring stage-driving device 90D includes three actuators 93A, 93B, 93C (actuator 93C provided on the back side of the sheet surface of FIG. 1 is not shown), and encoders 94A, 94B, 94C (encoder 94C provided on the back side of the sheet surface of FIG. 1 is not shown) which measure the driving amount of the measuring table 90T in the Z axis direction brought about by the actuators 93A, 93B, 93C, in the same manner as the Z driving mechanism 92 of the measuring stage-driving device 90D.

The controller 30 is capable of moving the measuring table 90T in the Z axis, θX, and θY directions with respect to the stage body 90B by adjusting the driving amounts of the plurality of actuators 93A, 93B, 93C of the Z driving mechanism 92 respectively. The controller 30 is capable of adjusting the position of the measuring table 90T on the stage body 90B in relation to the X axis, Y axis, and θZ directions by controlling the XY driving mechanism 91 to adjust the position of the stage body 90B in relation to the X axis, Y axis, and θZ directions.

As described above, in this embodiment, the controller 30 controls the measuring stage-driving device 90D including the XY driving mechanism 91 and the Z driving mechanism 92. Accordingly, the controller 30 is capable of moving the measuring table 90T of the measuring stage 90 in the directions of six degrees of freedom of the X axis, Y axis, Z axis, θX, θY, and θZ directions; and the controller 30 is capable of adjusting the position of the measuring table 90T in relation to the directions of six degrees of freedom of the X axis, Y axis, Z axis, θX, θY, and θZ directions.

The position information about the measuring table 90T of the measuring stage 90 in relation to the X axis, Y axis, and θZ directions is measured by a laser interferometer 77 of the measuring system 70. The laser interferometer 77 measures the position information about the measuring table 90T in relation to the X axis, Y axis, and θZ directions by using a reflecting surface 78 provided on the measuring table 90T. The measuring system 70 may measure, for example, the position information about the measuring table 90T in relation to the Z axis, θX, and θY directions by using the laser interferometer 77.

The encoders 94A, 94B, 94C of the Z driving mechanism 92 are capable of measuring the driving amounts in the Z axis direction (displacement amounts from a reference position) at the respective support points of the actuators 93A, 93B, 93C with respect to the measuring table 90T. The measurement results are outputted to the controller 30. The controller 30 can determine the position of the measuring table 90T in relation to the Z axis, θX, and θY directions on the basis of the measurement results of the encoders 94A, 94B, 94C.

The controller 30 drives the measuring stage-driving device 90D to control the position of the measuring table 90T on the basis of measurement result of the laser interferometer 77 and the measurement results of the encoders 94A, 94B, 94C.

The exposure apparatus, which is provided with the substrate stage which holds the substrate P and the measuring stage which is provided with the measuring instrument, is disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). The disclosure of U.S. Pat. No. 6,897,963 is incorporated herein by reference within a range of permission of the domestic laws and ordinances of the designated or selected state.

As shown in FIG. 1, the exposure apparatus EX of this embodiment is provided with a first detecting system 10 which determines the position information about the image of the first pattern PA1 formed in the first exposure area AR1 and the position information about the image of the second pattern PA2 formed in the second exposure area AR2. The first detecting system 10 of this embodiment is an alignment system of TTR (Through The Reticle) system using a light beam having an exposure wavelength, which is such an alignment system of VRA (Visual Reticle Alignment) system that a light beam is radiated onto a mark, and image data of the mark photographed or imaged by a CCD camera or the like is subjected to image processing to detect the mark position, as disclosed, for example, in Japanese Patent Application Laid-open No. 7-176468 (corresponding to U.S. Pat. No. 6,498,352).

Reference marks FM are provided on the measuring stage 90 (see FIG. 7). The first detecting system 10 is capable of detecting the reference marks FM provided on the measuring stage 90 via the projection optical system PL. The first detecting system 10 can determine the positional relationship between the first pattern PA1 and the reference marks FM and the positional relationship between the second pattern PA2 and the reference marks FM by detecting the reference marks FM via the projection optical system PL. The first detecting system 10 of this embodiment includes a first sub-detecting system 11 which detects the positional relationship between the first pattern PA1 and the reference marks FM, and a second sub-detecting system 12 which detects the positional relationship between the second pattern PA2 and the reference marks FM. The first and second sub-detecting systems 11, 12 are arranged over or above the mask stage 60.

Figure 5:
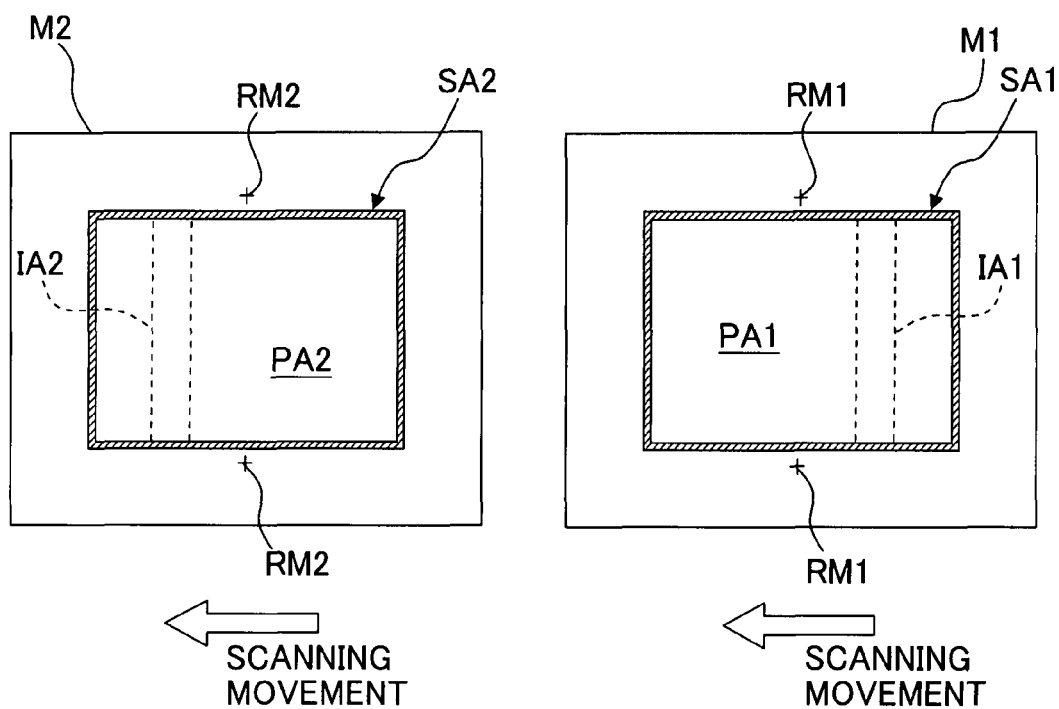
FIG. 5 schematically shows a relationship between first and second masks and first and second illumination areas.

A first alignment mark RM1 is provided on the first mask M1 (see FIG. 5). The first sub-detecting system 11 simultaneously observes the first alignment mark RM1 and a conjugate image of the reference mark FM via the projection optical system PL. The first sub-detecting system 11 of the first detecting system 10 is capable of detecting the positional relationship between the first pattern PA1 and the reference mark FM by simultaneously observing the first alignment mark RM1 which is provided in the predetermined positional relationship with respect to the first pattern PA1 and the reference mark FM via the projection optical system PL.

Similarly, a second alignment mark RM2 is provided on the second mask M2 (see FIG. 5). The second sub-detecting system 12 simultaneously observes the second alignment mark RM2 and a conjugate image of the reference mark FM via the projection optical system PL. The second sub-detecting system 12 of the first detecting system 10 is capable of detecting the positional relationship between the second pattern PA2 and the reference mark FM by simultaneously observing the second alignment mark RM2 which is provided in the predetermined positional relationship with respect to the second pattern PA2 and the reference mark FM via the projection optical system PL.

Figure 6:
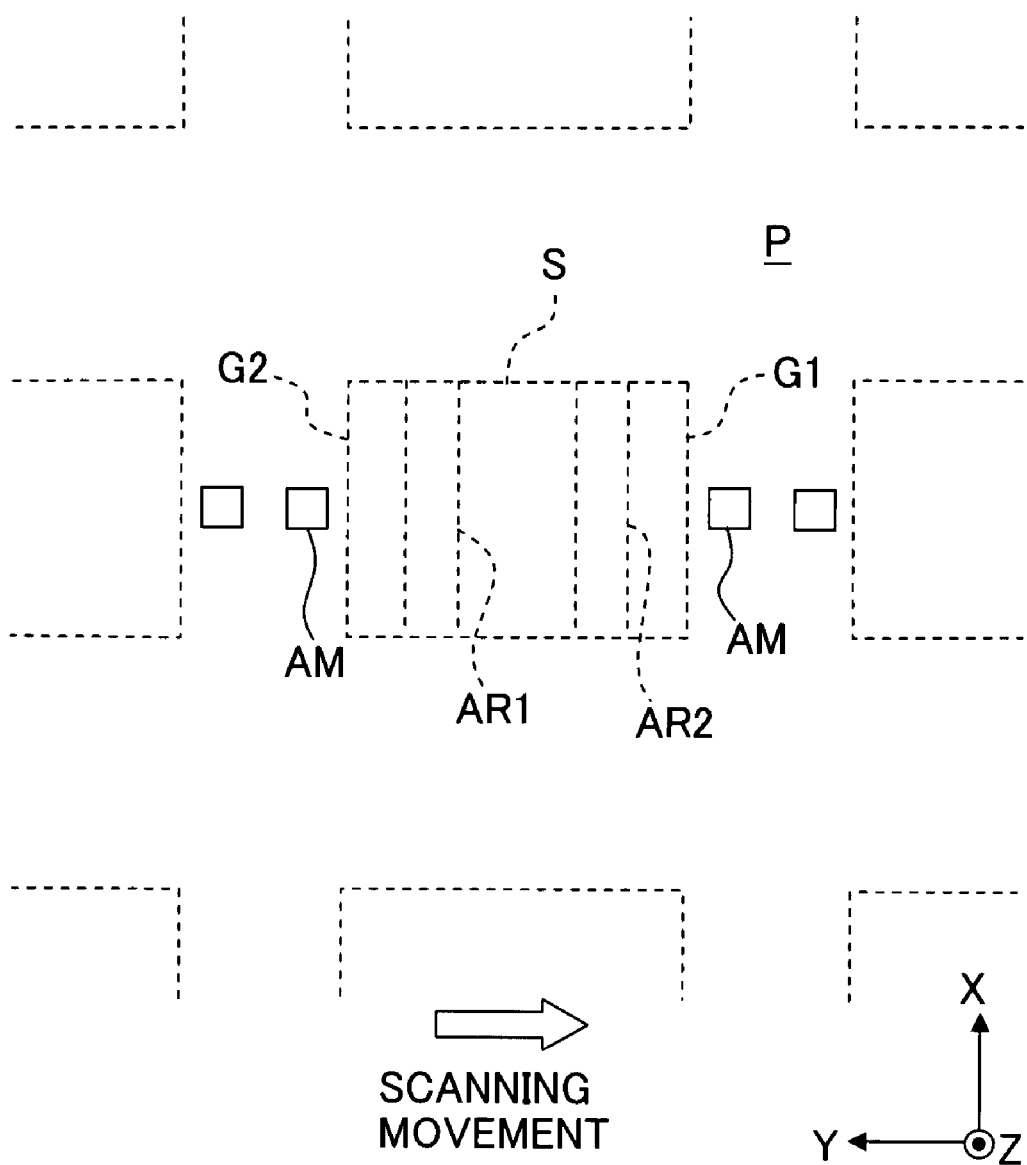
FIG. 6 schematically shows a relationship between a shot area of a substrate and first and second exposure areas according to the first embodiment.

The exposure apparatus EX of this embodiment is provided with a second detecting system 20 which detects a reference mark FP provided on the measuring stage 90 (see FIG. 7) and alignment marks AM provided on the substrate P (see FIGS. 6 and 7). The second detecting system 20 of this embodiment is an alignment system of the off-axis system provided in the vicinity of the projection optical system PL, and is such an alignment system of FIA (Field Image Alignment) system that a broad band detecting light flux, which does not photosensitize the photosensitive material on the substrate P, is radiated onto an objective mark (alignment mark AM, reference mark FP), and an image of the objective mark imaged or formed on a light-receiving surface with the reflected light beam from the objective mark and an image of an index (index mark or reference mark on a reference plate provided in the second detecting system 20) are photographed or imaged by using an image pickup device (CCD or the like) to perform the image processing for the image pickup signals thereof, thereby measuring the position of the mark, as disclosed, for example, in Japanese Patent Application Laid-open No. 4-65603 (corresponding to U.S. Pat. No. 5,493,403). The contents of U.S. Pat. No. 5,493,403 is incorporated herein by reference within a range of permission of the domestic laws and ordinances of the designated or selected state.

The reference marks FM and the reference mark FP are provided in a predetermined positional relationship on the measuring stage 90. The second detecting system 20 detects the reference mark FP and the alignment mark AM provided on the substrate P. The controller 30 is capable of adjusting the positional relationship among the image of the first pattern PA1, the image of the second pattern PA2, and the shot area S on the substrate P on the basis of the detection results of the first detecting system 10 and the second detecting system 20.

FIG. 5 schematically shows the relationship between the first illumination area IA1 and the second illumination area IA2 and the first mask M1 and the second mask M2. FIG. 6 schematically shows the relationship among the first exposure area AR1 and the second exposure area AR2 and the shot area S as the exposure-objective area on the substrate P. In this embodiment, the first exposure area AR1 onto which the first exposure light beam EL1 is radiated and the second exposure area AR2 onto which the second exposure light beam EL2 is radiated are the projection areas of the projection optical system PL conjugate with the first and second illumination areas IA1, IA2, respectively.

The illumination system IL radiates the first exposure light beam EL1 onto the first pattern PA1. Further, the illumination system IL radiates the second exposure light beam EL2 onto the second pattern PA2. The projection optical system PL forms the image of the first pattern PA1 in the first exposure area AR1 by radiating the first exposure light beam EL1 from the first pattern onto the first exposure area AR1. The projection optical system PL forms the image of the second pattern PA2 in the second exposure area AR2 by radiating the second exposure light beam EL2 from the second pattern PA2 onto the second exposure area AR2.

The controller 30 radiates the first exposure light beam EL1 and the second exposure light beam EL2 onto the first exposure area AR1 and the second exposure area AR2 respectively via the first mask M1 and the second mask M2 by the illumination system IL and the projection optical system PL while moving the shot area S on the substrate P in the Y axis direction with respect to the first exposure area AR1 and the second exposure area AR2 by using the substrate stage 80 in synchronization with the movement effected by the mask stage 60 of the first mask M1 and the second mask M2 in the Y axis direction with respect to the first illumination area IA1 and the second illumination area IA2. Accordingly, the shot area S on the substrate P is subjected to the multiple exposure (double exposure) with the image of the first pattern PA1 formed in the first exposure area AR1 and the image of the second pattern PA2 formed in the second exposure area AR2.

The controller 30 performs the multiple exposure for the shot area S on the substrate P by radiating the first exposure light beam EL1 from the first pattern PA1 and the second exposure light beam EL2 from the second pattern PA2 onto the first exposure area AR1 and the second exposure area AR2 respectively while controlling the mask stage 60 and the substrate stage 80 so that the movement in the Y axis direction of the first mask M1 with respect to the first illumination area IA1, the movement in the Y axis direction of the second mask M2 with respect to the second illumination area IA2, and the movement in the Y axis direction of the substrate P with respect to the first and second exposure areas AR1, AR2 are synchronously performed.

As shown in FIG. 5, in this embodiment, the first mask M1 and the second mask M2 are arranged and aligned in the Y axis direction. The first mask M1 is arranged on the −Y side with respect to the second mask M2. The first illumination area IA1, which is brought about by the first exposure light beam EL1 on the first mask M1, is defined to have a rectangular shape (slit-shaped form) in which the X axis direction is the longitudinal direction. The second illumination area IA2, which is brought about by the second exposure light beam EL2 on the second mask M2, is also defied to have a rectangular shape (slit-shaped form) in which the X axis direction is the longitudinal direction.

As shown in FIG. 6, in this embodiment, the first exposure area AR1 and the second exposure area AR2 are set at the different positions in the Y axis direction in the field of the projection optical system PL. The substrate stage 80 is capable of moving the shot area S on the substrate P in the Y axis direction with respect to the first exposure area AR1 and the second exposure area AR2. Each of the first exposure area AR1 and the second exposure area AR2 is rectangular (slit-shaped), wherein the X axis direction is the longitudinal direction. The first exposure area AR1 and the second exposure area AR2 can be simultaneously arranged in one shot area S. That is, in this embodiment, the distance between the first exposure area AR1 (center of the first exposure area AR1) and the second exposure area AR2 (center of the second exposure area AR2) in the Y axis direction is smaller than the width of one shot area S on the substrate P in the Y axis direction. In this embodiment, the first exposure area AR1 and the second exposure area AR2 are separated from each other in the Y axis direction. The first exposure area AR1 is defined on the +Y side with respect to the second exposure area AR2.

The controller 30 moves the first mask M1 having the first pattern PA1 and the second mask M2 having the second pattern PA2 in the scanning directions (Y axis directions respectively) by using the mask stage 60 during the exposure for the shot area S on the substrate P. Further, the controller 30 moves the substrate P in the scanning direction (Y axis direction) with respect to the first exposure area AR1 and the second exposure area AR2 by using the substrate stage 80 so that the shot area S on the substrate P passes across the first exposure area AR1 and the second exposure area AR2. In this embodiment, the controller 30 illuminates the first pattern PA1 of the first mask M1 and the second pattern PA2 of the second mask M2 with the first exposure light beam EL1 and the second exposure light beam EL2 respectively while moving the first mask M1 and the second mask M2 in the same scanning direction (Y axis direction) by using the mask stage 60 during the exposure for the shot area S on the substrate P. The first mask M1 and the second mask M2 are placed on the main stage 61. The controller 30 drives the main stage 61 by using the main stage-driving device 64. Accordingly, the first mask M1 and the second mask M2 are moved in the same scanning direction (Y axis direction). For example, when the first mask M1 is moved in the +Y direction by the main stage 61 of the mask stage 60 during the exposure for the shot area S on the substrate P, the second mask M2 is also moved together in the +Y direction. When the first mask M1 is moved in the -Y direction, the second mask M2 is also moved together in the -Y direction. The projection optical system PL of this embodiment forms the inverted image. The controller 30 moves the first and second masks M1, M2 and the substrate P in the mutually opposite scanning directions (Y axis directions) during the exposure for the shot area S on the substrate P. For example, upon moving the first and second masks M1, M2 in the +Y direction by using the mask stage 60, the controller 30 moves the substrate P in the -Y direction by using the substrate stage 80. Upon moving the first and second masks M1, M2 in the -Y direction, the controller 30 moves the substrate P in the +Y direction.

FIGS. 5 and 6 show a state in which the substrate P is moved in the -Y direction in synchronization with the movement of the first and second masks M1, M2 in the +Y direction during the exposure for the shot area S on the substrate P.

As described above, in this embodiment, the first exposure area AR1 and the second exposure area AR2 are set at the different positions in the scanning direction (Y axis direction) of the substrate P on the substrate P. The first exposure area AR1 is set on the +Y side with respect to the second exposure area AR2. The first mask M1 and the second mask M2 are moved in the same scanning direction (Y axis direction). The projection optical system PL of this embodiment forms the inverted image, and the first and second masks M1, M2 and the substrate P are moved in the mutually opposite scanning directions (Y axis directions). Therefore, in this embodiment, as shown in FIG. 5, the first mask M1 is arranged on the -Y side with respect to the second mask M2; and the first illumination area IA1 and the second illumination area IA2 are defined at the mutually different positions with respect to the centers of the first and second masks M1, M2 respectively during the scanning exposure. In other words, the positions of the first and second masks M1, M2 in relation to the first and second illumination areas IA1, IA2 are defined, for example, as shown in FIG. 5 depending on the positional relationship between the first and second exposure areas AR1, AR2. With this, the image of the first pattern PA1 and the image of the second pattern PA2 can be formed in the desired positional relationship in the shot area S on the substrate P.

In this embodiment, when the shot area S on the substrate P is subjected to the exposure, the controller 30 is operated such that one of the illumination for the first pattern PA1 with the first exposure light beam EL1 and the illumination for the second pattern PA2 with the second exposure light beam EL2 is started and then the other of the illuminations is started, and one of the illuminations is completed and then the other of the illuminations is completed. Further, the controller 30 is operated such that one of the radiation of the first exposure light beam EL1 onto the shot area S (projection of the image of the first pattern PA1 by the first exposure light beam EL1) and the radiation of the second exposure light beam EL2 onto the shot area S (projection of the image of the second pattern PA2 by the second exposure light beam EL2) is started and then the other of the radiations is started, and one of the radiations is completed and the other of the radiations is completed.

For example, as shown in FIG. 6, when the exposure is performed while moving the shot area S of the substrate P in the -Y direction, the controller 30 is operated as follows. That is, the illumination for the first pattern PA1 with the first exposure light beam EL1 is started, and then the illumination for the second pattern PA2 with the second exposure light beam EL2 is started; afterwards, the illumination for the first pattern PA1 with the first exposure light beam EL1 is completed, and then the illumination for the second pattern PA2 with the second exposure light beam EL2 is completed. Further, the controller 30 is operated as follows. That is, the projection of the first pattern PA1 with the first exposure light beam EL1 onto the shot area S is started, and then the projection of the second pattern PA2 with the second exposure light beam EL2 onto the shot area S is started; afterwards, the projection of the first pattern PA1 with the first exposure light beam EL1 onto the shot area S is completed, and then the projection of the second pattern PA2 with the second exposure light beam EL2 onto the shot area S is completed.

An explanation will be made with reference to FIGS. 5 and 6 about an exemplary sequence adopted when the first and second exposure light beams EL1, EL2 are radiated onto the shot area S on the substrate P. The following description will be made as exemplified by a case in which the shot area S on the substrate P is exposed while synchronously performing the movement of the first mask M1 and the second mask M2 in the +Y direction effected by the mask stage 60 and the movement of the shot area S on the substrate P in the −Y direction with respect to the first exposure area AR1 and the second exposure area AR2 effected by the substrate stage 80.

The positions of the first exposure area AR1 and the second exposure area AR2 in the XY coordinate system (including the relative positional relationship between the first exposure area AR1 and the second exposure area AR2), which are defined by the measuring system 70 (laser interferometer 75), are determined depending on, for example, the position of the fixed blind in the illumination system IL and the arrangement of the respective optical elements for constructing the projection optical system PL including, for example, the intermediate optical member 40 and the like. The first and second exposure areas AR1, AR2 have a same shape and a same size, and they are the rectangular areas which are long in the X axis direction respectively. Further, the first and second exposure areas AR1, AR2 are located at a same position in the X axis direction, and the first and second exposure areas AR1, AR2 are separated from each other by a predetermined distance in the Y axis direction. The positions of the first and second exposure areas AR1, AR2 can be adjusted by using the first and second imaging characteristic-adjusting devices LC1, LC2, respectively.

With reference to FIG. 5, the controller 30 starts the illumination for the first pattern PA1 with the first exposure light beam EL1 at a point of time when an edge, of the first pattern formation area SA1, on the +Y side at which the first pattern PA1 of the first mask M1 is formed, arrives at an edge of the first illumination area IA1 on the −Y side. With reference to FIG. 6, an edge G1 of the shot area S on the −Y side on the substrate P arrives at an edge, of the first exposure area AR1, on the +Y side at the point of time at which an edge, of the first pattern formation area SA1, on the +Y side of the first mask M1 arrives at the first illumination area IA1; and the radiation of the first exposure light beam EL1 onto the first exposure area AR1 is started.

The controller 30 continuously illuminates the first pattern PA1 with the first exposure light beam EL1 by continuing the movement of the mask stage 60 (main stage 61) in the +Y direction. The first pattern PA1 passes across the first illumination area IA1 by the continuous movement of the mask stage 60 in the +Y direction.

The controller 30 continuously performs the radiation of the first exposure light beam EL1 onto the first exposure area AR1, namely the projection of the image of the first pattern PA1 with the first exposure light beam EL1 onto the shot area S on the substrate P by continuing the movement of the substrate stage 80 in the −Y direction in synchronization with the movement of the mask stage 60 in the +Y direction. The shot area S on the substrate P passes across the first exposure area AR1 by the continuous movement of the substrate stage 80 in the −Y direction.

Then, the illumination for the first pattern PA1 with the first exposure light beam EL1 is completed at the point of time at which the edge, of the first pattern formation area SA1, on the −Y side of the first mask M1 arrives at edge, of the first illumination area IA1, on the +Y side. With reference to FIG. 6, the edge G2 of the shot area S on the substrate P on the +Y side arrives at the edge of the first exposure area AR1 on the −Y side at the point of time at which the edge, of the first pattern formation area SA1 of the first mask M1, on the −Y side arrives at the edge, of the first illumination area IA1, on the +Y side; and the radiation of the first exposure light beam EL1 onto the first exposure area AR1 is stopped at the point of time at which the edge G2 of the shot area S on the +Y side arrives at the edge of the first exposure area AR1 on the −Y side. With this, the exposure of the shot area S with the first exposure light beam EL1 radiated onto the first exposure area AR1, namely the projection of the image of the first pattern PA1 with the first exposure light beam EL1 onto the shot area S comes to an end.

The edge on the +Y side of the second pattern formation area SA2 of the second mask M2 arrives at the edge on the −Y side of the second illumination area IA2 at a predetermined timing during the period of time in which the first pattern formation area SA1 of the first mask M1 is passing across the first illumination area IA1; and the illumination for the second pattern PA2 with the second exposure light beam EL2 is started. With reference to FIG. 6, the edge G1 on the −Y side of the shot area S on the substrate P arrives at the edge on the +Y side of the second exposure area AR2 at the point of time at which the edge on the +Y side of the second pattern formation area SA2 of the second mask M2 arrives at the second illumination area IA2; and the radiation of the second exposure light beam EL2 onto the second exposure area AR2 is started. That is, the edge G1 on the −Y side of the shot area S arrives at the second exposure area AR2 at a predetermined timing during the period of time in which the shot area S on the substrate P is passing across the first exposure area AR1; and the projection of the image of the second pattern PA2 with the second exposure light beam EL2 onto the shot area S is started.

The controller 30 continuously illuminates the second pattern PA2 with the second exposure light beam EL2 by continuing the movement of the mask stage 60 (main stage 61) in the +Y direction. The second pattern PA2 passes across the second illumination area IA2 by the continuous movement of the mask stage 60 in the +Y direction.

The controller 30 continuously performs the projection of the image of the second pattern PA2 with the second exposure light beam EL2 onto the shot area S on the substrate P by continuing the movement of the substrate stage 80 in the −Y direction in synchronization with the movement of the mask stage 60 in the +Y direction. The shot area S on the substrate P passes across the second exposure area AR2 by the continuous movement of the substrate stage 80 in the −Y direction.

The illumination with the second exposure light beam EL2 for the second pattern PA2 is completed at the point of time at which the edge, of the second pattern formation area SA2, on the −Y side of the second mask M2 arrives at edge, of the second illumination area IA2, on the +Y side. With reference to FIG. 6, the edge G2, of the shot area S on the substrate P, on the +Y side arrives at the edge, of the second exposure area AR2, on the −Y side at the point of time at which the edge, of the second pattern formation area SA2 of the second mask M2, on the −Y side arrives at the edge, of the second illumination area IA2, on the +Y side; and the radiation of the second exposure light beam EL2 onto the second exposure area AR2 is stopped at the point of time at which the edge G2 of the shot area S on the +Y side arrives at the edge of the second exposure area AR2 on the −Y side. With this, the exposure of the shot area S with the second exposure light beam EL2 radiated onto the second exposure area AR2, namely the projection of the image of the second pattern PA2 with the second exposure light beam EL2 onto the shot area S comes to an end.

Thus, the photosensitive material layer of the shot area S on the substrate P, which has been exposed with the first exposure light beam EL1 radiated onto the first exposure area AR1, is exposed again (subjected to the double exposure) with the second exposure light beam EL2 radiated onto the second exposure area AR2 without performing, for example, the developing step and the like.

The illumination with the first exposure light beam EL1 for the first pattern PA1 is completed at the predetermined timing during the period of time in which the second pattern formation area SA2 is passing across the second illumination area IA2. The radiation of the first exposure light beam EL1 onto the shot area S is completed at the predetermined timing during the period of time in which the shot area S on the substrate P is passing across the second exposure area AR2.

As described above, in this embodiment, one shot area S on the substrate P can be subjected to the multiple exposure (double exposure) with the image of the first pattern PA1 and the image of the second pattern PA2 by one time of the scanning operation.

FIG. 7 shows a plan view illustrating the substrate stage 80 and the measuring stage 90. As shown in FIG. 7, a plurality of shot areas S1 to S21 as exposure-objective areas are set in a matrix form on the substrate P. Further, a plurality of alignment marks AM are provided corresponding to the shot areas S1 to S21 respectively. When the shot areas S1 to S21 of the substrate P are subjected to the exposure respectively, the controller 30 radiates the first and second exposure light beams EL1, EL2 onto the substrate P by radiating the exposure light beams EL1, EL2 onto the first and second exposure areas AR1, AR2 respectively while relatively moving the first and second exposure areas AR1, AR2 and the substrate P, for example, as indicated by arrows y1 in FIG. 7. The controller 30 controls the operation of the substrate stage 80 so that the first and second exposure areas AR1, AR2 are moved along the arrows y1 with respect to the substrate P.

A reference plate 50, on which a plurality of reference marks are formed, is provided as one of the measuring instrument (measuring member) at a predetermined position of the upper surface of the measuring stage 90. The reference marks FM to be detected by the first detecting system 10 and the reference mark FP to be detected by the second detecting system 20 as described above are formed in the predetermined positional relationship on the upper surface of the reference plate 50.

An aperture 158, through which a light beam is passable, is formed on the upper surface of the measuring stage 90 at a position separated and away from the reference plate 50. At least a part of a wave front aberration-measuring instrument 159, which is as disclosed, for example, in International Publication No. 99/60361 (corresponding to European Patent No. 1,079,223), is arranged at a position below or under the aperture 158 (in the −Z direction).

Although not shown, the measuring stage 90 is provided with an exposure light beam-measuring instrument arranged thereon which measures information (for example, light amount, illuminance, and uneven illuminance) about the exposure energy of the first and second exposure light beams EL1, EL2 radiated onto the measuring stage 90 via the projection optical system PL. Instruments usable as the exposure light beam-measuring instrument include an unevenness measuring instrument for measuring the uneven illuminance as disclosed, for example, in Japanese Patent Application Laid-open No. 57-117238 (corresponding to U.S. Pat. No. 4,465,368) or for measuring the fluctuation amount of the transmittance of the projection optical system PL with respect to the exposure light beam EL as disclosed in Japanese Patent Application Laid-open No. 2001-267239, and an radiation amount measuring instrument (illuminance measuring instrument) as disclosed, for example, in Japanese Patent Application Laid-open No. 11-16816 (corresponding to United States Patent Application Publication No. 2002/0061469).

A plate member 50' is arranged on the upper surface of the measuring stage 90 at a position separated and away from the reference plate 50. An aperture 161, through the light beam is passable, is formed at a substantially central portion of the plate member 50'. At least a part of a spatial image-measuring instrument 162, which is as disclosed, for example, in Japanese Patent Application Laid-open No. 2002-14005 (corresponding to United States Patent Application Publication No. 2002/0041377) and U.S. Pat. No. 4,629,313, is arranged at a position below or under the aperture 161 (in the −Z direction). The spatial image-measuring instrument 162 is capable of measuring the position of the first image plane IS1 on which the image of the first pattern PA1 is formed and the position of the second image plane IS2 on which the image of the second pattern PA2 is formed. The contents of U.S. Pat. No. 4,465,368, United States Patent Application Publication No. 2002/0061469, United States Patent Application Publication No. 2002/0041377, and U.S. Pat. No. 4,629,313, which disclose the measuring instrument as described above, are incorporated herein by reference within a range of permission of the domestic laws and ordinances of the designated or selected state.

Figure 8:
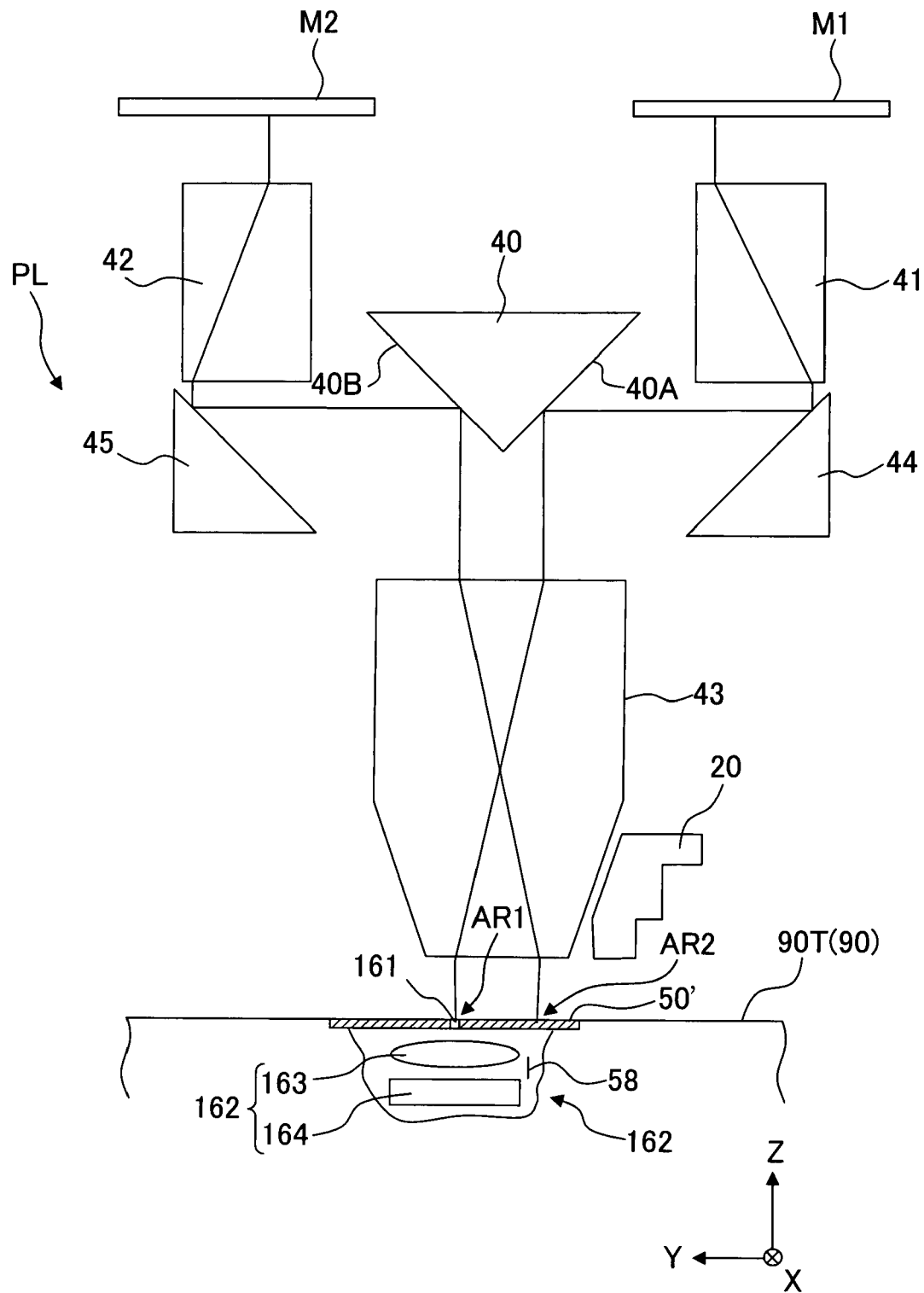
FIG. 8 illustrates a spatial image-measuring instrument.

FIG. 8 schematically shows the spatial image-measuring instrument 162. In FIG. 8, the first, second, and third optical systems 41, 42, 43 of the projection optical system PL are schematically shown.

The spatial image-measuring instrument 162 is provided for the measuring stage 90 (measuring table 90T) arrangeable on the side of the image plane of the projection optical system PL. As described above, the aperture 161, through the light beam is passable, is formed in the measuring stage 90. In this embodiment, the aperture 161 is formed in the plate member 50' provided on the measuring stage 90. The plate member 50' is formed of a material such as silica glass through which the light beam is transmissive. A substantially entire region of the surface of the plate member 50' is a light-shielding area covered with a metal such as chromium (Cr) or the like. The aperture 161 is an aperture formed through a part of the light-shielding area, through which the light beam is transmissive. In this embodiment, the aperture 161 is a slit pattern. In this embodiment, the upper surface (light-shielding area) of the plate member 50' has a function as the reference reflecting surface for defining the measurement reference surface of the focus/leveling-detecting system 130. The reference reflecting surface of the upper surface of the plate member 50' is an ideal plane having a predetermined reflectance capable of reflecting the detecting light beam of the focus/leveling-detecting system 130, and has such an area size that both of the first exposure area AR1 and the second exposure area AR2 can be simultaneously arranged therein.

An internal space 58 of the measuring stage 90 is defined below or under the plate member 50' (in the −Z direction). A part of the spatial image-measuring instrument 162, which measures a spatial image projected onto the measuring stage 90 by the projection optical system PL, is provided in the internal space 58. The spatial image-measuring instrument 162 is provided with an optical system 163 which is provided below or under the plate member 50', and a light-receiving element 164 which receives the light beam via the optical system 163.

The aperture 161 is formed to have such a size that an image of the measuring mark formed at a predetermined point in each of the first and second exposure areas AR1 and AR2 via the projection optical system PL can be detected, the size being smaller than the first exposure area AR1 and the second exposure area AR2. The controller 30 is capable of arranging the aperture 161 in each of the first exposure area AR1 and the second exposure area AR2 to adjust the position in the XY directions of the measuring stage 90 by using the measuring stage-driving device 90D. The aperture 161 is capable of receiving the first and second exposure light beams EL1, EL2 radiated onto the first and second exposure areas AR1, AR2 respectively on the side of the image plane of the projection optical system PL. The light beam, which is radiated onto the aperture 161 of the plate member 50' and which is allowed to pass through the aperture 161, is received by the light-receiving element 164 via the optical system 163 of the spatial image-measuring instrument 162. The controller 30 can determine the position information about the first image plane IS1 on which the image of the first pattern PA1 is formed and the position information about the second image plane IS2 on which the image of the second pattern PA2 is formed, on the basis of the measurement result of the spatial image-measuring instrument 162.

Figure 9A:
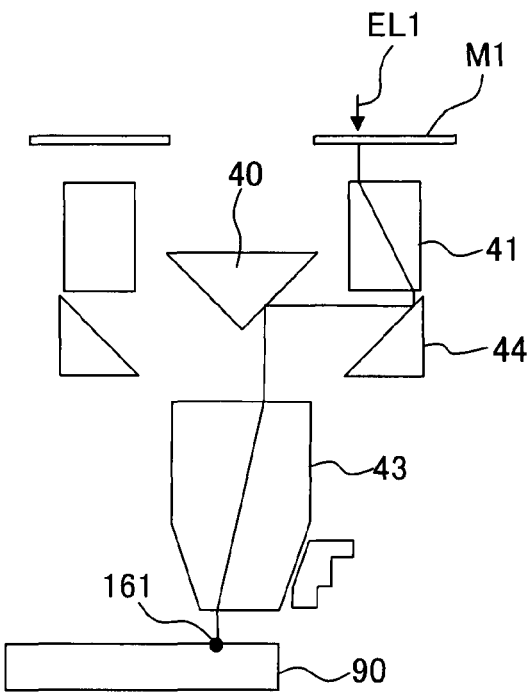
FIGS. 9A and 9B schematically illustrate the operation of the spatial image-measuring instrument.
Figure 9B:
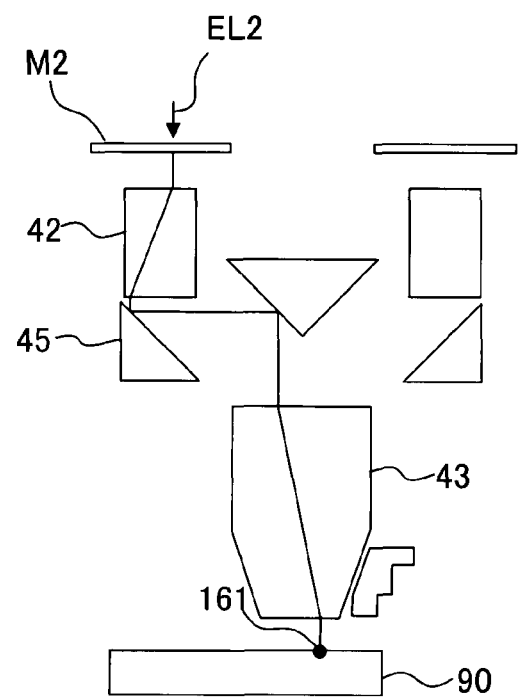

Next, an explanation will be made with reference to FIGS. 8, 9A, and 9B about an example of the operation for measuring the position information about the first image plane IS1 and the position information about the second image plane IS2 by using the spatial image-measuring instrument 162. FIGS. 8 and 9A show a state in which the position of the first image plane IS1 is measured by using the spatial image-measuring instrument 162. FIG. 9B shows a state in which the position of the second image plane IS2 is measured.

As described above, the positions of the first exposure area AR1 and the second exposure area AR2 are determined depending on, for example, the position of the fixed blind included in the illumination system IL, the arrangement of the respective optical elements such as the intermediate optical member 40 for constructing the projection optical system PL, and the like. The position information about the first exposure area AR1 and the second exposure area AR2 in the XY coordinate system defined by the measuring system 70 is known (obtained). The aperture 161 is formed to be smaller than the first and second exposure areas AR1, AR2. Therefore, the controller 30 is capable of arranging the aperture 161 on the measuring stage 90 at an arbitrary position in the first exposure area AR1 and the second exposure area AR2 by driving the measuring stage-driving device 70D while measuring the position of the measuring stage 90 (measuring table 90T) by using the measuring system 70 (laser interferometer 77).

When the position of the first image plane IS1 is measured by using the spatial image-measuring instrument 162, the controller 30 adjusts the position of the measuring stage 90 in the XY directions by using the measuring stage-driving device 90D to arrange the aperture 161 in the first exposure area AR1 while measuring the position information about the measuring stage 70 by using the laser interferometer 77 of the measuring system 70 as shown in FIGS. 8 and 9A. When the position of the first image plane IS1 is measured by using the spatial image-measuring instrument 162, the first mask M1 is placed on the first substage 62 of the mask stage 60.

After the first mask M1 is held by the first substage 62 of the mask stage 60, the controller 30 adjusts the position of the mask stage 60 so that the first pattern PA1 of the first mask M1 is arranged on the optical path for the first exposure light beam EL1. The controller 30 controls the mask stage 60 (first substage 62) so that the first pattern formation surface K1 of the first mask M1 is arranged at a predetermined position in relation to the Z axis direction. The controller 30 radiates the first exposure light beam EL1 onto the first mask M1 by the illumination system IL. A measuring mark is formed on the lower surface of the first mask M1 (pattern formation surface K1), and by radiating the first exposure light beam EL1 onto the first mask M1, a spatial image (projected image) of the measuring mark is formed in the first exposure area AR1 via the projection optical system PL. In this embodiment, the measuring mark is arranged at a position in the first illumination area IA1 corresponding to a certain measuring point among a plurality of measuring points for which the image plane positions are to be measured in the first exposure area AR1, so that the spatial image is formed at the certain measuring point. The aperture 161 is arranged in the first exposure area AR1. The controller 30 moves the substrate stage 90 in the X axis direction or the Y axis direction to perform the relative scanning for the aperture 161 and the spatial image of the measuring mark formed at the certain measuring point. The first exposure light beam EL1, which passes through the aperture 161 during the relative scanning, is received by the light-receiving element 164 of the spatial image-measuring instrument 162. That is, the spatial image of the measuring mark is measured by the spatial image-measuring instrument 162. The spatial image-measuring instrument 162 outputs the measurement result (light intensity signal of the spatial image) to the controller 30.

When the position of the first image plane IS1 is measured by using the spatial image-measuring instrument 162, the controller 30 repeatedly performs the measurement of the spatial image of the measuring mark a plurality of times while moving the measuring table 90T (upper surface of the plate member 50') at predetermined pitches in the Z axis direction by using the actuators 93A, 93B, 93C of the measuring stage-driving device 90D to thereby store a plurality of light intensity signals (photoelectric conversion signals) for the measurements performed respectively. The controller CONT 30 determines the contrast of each of the light intensity signals obtained by the measurement repeatedly performed the plurality of times. The controller 30 determines a position of the measuring table 90T (upper surface of the plate member 50') in the Z axis direction corresponding to a light intensity signal, among the light intensity signals, at which the contrast is maximized. The position is determined as the position at which the first image plane IS1 is formed, namely the best focus position of the projection optical system PL among the measuring points in the first exposure area AR1. Here, the controller 30 measures the spatial image by moving the measuring table 90T in the Z axis direction at the predetermined pitch while measuring the driving amounts of the actuators 93A, 93B, 93C by using the encoders 94A, 94B, 94C provided for the measuring stage 90. The encoders 94A, 94B, 94C are capable of measuring the driving amounts of the actuators 93A, 93B, 93C in the Z axis direction with respect to the predetermined reference position. Therefore, the controller 30 can determine the position in the Z axis direction of the measuring table 90T (upper surface of the plate member 50') with respect to the predetermined reference position during the measurement of the spatial image on the basis of the measurement results of the encoders 94A, 94B, 94C. Therefore, the controller 30 can determine the position of the first image plane IS1 (position in the Z axis direction) on the basis of the measurement result of the spatial image-measuring instrument 162 and the measurement results of the encoders 94A, 94B, 94C. The plurality of measuring marks are provided on the pattern formation surface K1 of the mask M1. The plurality of measuring marks are arranged at the plurality of positions in the first illumination area IA1 corresponding to the plurality of measuring points in the first exposure area AR1 respectively. Accordingly, by detecting the spatial images of the respective measuring marks with the spatial image-measuring instrument 162 in the same manner as described above, the position of the first image plane IS1 (i.e., the best focus position of the projection optical system PL) can be determined at the plurality of measuring points in the first exposure area AR1 respectively. Therefore, even when the first image plane IS1 is inclined and/or curved in the first exposure area AR1, the position of the first image plane IS1 can be measured accurately.

When the position of the second image plane IS2 is measured by using the spatial image-measuring instrument 162, the controller 30 adjusts the position of the measuring stage 90 in the XY directions, by using the measuring stage-driving device 90D, on the basis of the positional relationship between the first exposure area AR1 and the second exposure area AR2 to arrange the aperture 161 in the second exposure area AR2 while measuring the position information about the measuring stage 70 by using the laser interferometer 77 of the measuring system 70, as shown in FIG. 9B. When the position of the second image plane IS2 is measured by using the spatial image-measuring instrument 162, the second mask M2 is placed on the second substage 63 of the mask stage 60.

After the second mask M2 is held by the second substage 63 of the mask stage 60, the controller 30 adjusts the position of the mask stage 60 so that the second pattern PA2 of the second mask M2 is arranged on the optical path for the second exposure light beam EL2. The controller 30 controls the mask stage 60 (second substage 63) so that the second pattern formation surface K2 of the second mask M2 is arranged at a predetermined position in relation to the Z axis direction. The controller 30 radiates the second exposure light beam EL2 onto the second mask M2 by the illumination system IL. A measuring mark is also formed on the lower surface of the second mask M2 (pattern formation surface K2), and by radiating the second exposure light beam EL2 onto the second mask M2, a spatial image of the measuring mark is formed in the second exposure area AR2 via the projection optical system PL. In this embodiment, the measuring mark is arranged at a position in the second illumination area IA2 corresponding to a certain measuring point among a plurality of measuring points for which the image plane positions are to be measured in the second exposure area AR2, so that the spatial image is formed at the certain measuring point. The aperture 161 is arranged in the second exposure area AR2. The controller 30 moves the substrate stage 90 in the X axis direction or the Y axis direction to perform the relative scanning for the aperture 161 and the spatial image of the measuring mark formed at the certain measuring point. The second exposure light beam EL2, which passes through the aperture 161 during the relative scanning, is received by the light-receiving element 164 of the spatial image-measuring instrument 162. That is, the spatial image of the measuring mark is measured by the spatial image-measuring instrument 162. The spatial image-measuring instrument 162 outputs the measurement result (light intensity signal of the spatial image) to the controller 30.

When the position of the second image plane IS2 is measured by using the spatial image-measuring instrument 162, the controller 30 repeatedly performs the measurement of the spatial image of the measuring mark a plurality of times while moving the measuring table 90T (upper surface of the plate member 50') at predetermined pitches in the Z axis direction by using the actuators 93A, 93B, 93C of the measuring stage-driving device 90D to store the light intensity signals (photoelectric conversion signals) for the measurements performed respectively in the same manner as in the procedure for measuring the position of the first image plane IS1 described above. The controller CONT 30 determines the contrast for each of the plurality of light intensity signals obtained by the measurement repeatedly performed the plurality of times. The controller 30 determines a position of the measuring table 90T (upper surface of the plate member 50') in the Z axis direction corresponding to a light intensity signal, among the light intensity signals, at which the contrast is maximized; and the controller 30 determines the position as the position at which the second image plane IS2 is formed, namely the best focus position of the projection optical system PL among the measuring points in the second exposure area AR2. The controller 30 can determine the position of the second image plane IS2 (position in the Z axis direction) on the basis of the measurement result of the spatial image-measuring instrument 162 and the measurement results of the encoders 94A, 94B, 94C. A plurality of measuring marks are also provided on the pattern formation surface K2 of the mask M2. The plurality of measuring marks are arranged at a plurality of positions in the second illumination area IA2 corresponding to the plurality of measuring points in the second exposure area AR2 respectively. Accordingly, by detecting the spatial images of the respective measuring marks with the spatial image-measuring instrument 162 in the same manner as described above, the position of the second image plane IS2 (i.e., the best focus position of the projection optical system PL) can be determined at the plurality of measuring points in the second exposure area AR2 respectively. Therefore, even when the second image plane IS2 is inclined and/or curved in the second exposure area AR2, the position of the second image plane IS2 can be measured accurately.

As described above, in this embodiment, the spatial image-measuring instrument 162, which receives the first and second exposure light beams EL1, EL2 on the light-exit side of the projection optical system PL, can be used to determine the position (position in the Z axis, θX, and θY directions) of the first image plane IS1 on which the image of the first pattern PA1 is formed and the position (position in the Z axis, θX, and θY directions) of the second image plane IS2 on which the image of the second pattern PA2 is formed.

A plurality of apertures 161 may be provided to the plate member 50' of the measuring stage 90 on the basis of the positional relationship between the first exposure area AR1 and the second exposure area AR2. A part of the plurality of apertures may be arranged in the first exposure area AR1, and the remaining part of the apertures may be arranged in the second exposure area AR2. The spatial image of the measuring mark of the first mask M1 and the spatial image of the measuring mark of the second mask M2 may be detected substantially simultaneously by using the spatial image-measuring instrument 162 to obtain the position information about the first image plane IS1 in the first exposure area AR1 and the position information about the second image plane IS2 in the second exposure area AR2. For example, the reference marks provided for the mask stage 60 may be used, instead of the measuring marks of the first and second masks M1, M2, to measure the position information about the first and second image planes IS1, IS2. In this embodiment, the same number of the measuring marks (or the reference marks) as that of the plurality of measuring points described above are arranged on the object plane of the projection optical system PL to measure the position information about the first image plane IS1 or the second image plane IS2. However, a number of measuring marks (or reference marks) fewer than a number of measuring points may be used to measure the position information about the first and second image planes IS1, IS2. In this case, the mask stage 60 may be moved to arrange the measuring marks (or the reference marks) at a plurality of positions in the illumination area corresponding to the plurality of measuring points respectively. The position of the upper surface of the plate member 50' in the Z axis direction may be measured by using the focus/leveling-detecting system 130 instead of using the encoders 94A, 94B, 94C.

In this embodiment, the shot area S on the substrate P is subjected to the multiple exposure with the image of the first pattern PA1 and the image of the second pattern PA2. Accordingly, it is important to satisfactorily adjust the positional relationship among the surface of the substrate P, the first image plane IS1 on which the image of the first pattern PA1 is formed, and the second image plane IS2 on which the image of the second pattern PA2 is formed, in relation to the first exposure area AR1 and the second exposure area AR2 respectively, in order to form a desired pattern on the substrate P. That is, the multiple exposure for the shot area S on the substrate P includes a first scanning exposure for the shot area S with the first exposure light beam EL1 radiated onto the first exposure area AR1 and a second scanning exposure for the shot area S with the second exposure light beam EL2 radiated onto the second exposure area AR2. Accordingly, it is important to substantially match the first image plane IS1 and the surface of the shot area S in the first exposure area AR1 during the first scanning exposure (i.e., maintain the surface of the shot area S within the depth of focus of the projection optical system PL in the first exposure area AR1) and substantially match the second image plane IS2 and the surface of the shot area S in the second exposure area AR2 during the second scanning exposure (i.e., maintain the surface of the shot area S within the depth of focus of the projection optical system PL in the second exposure area AR2). In this embodiment, the first exposure area AR1 in which the image of the first pattern PA1 is formed in the field of the projection optical system PL and the second exposure area AR2 in which the image of the second pattern PA2 is formed in the field of the projection optical system PL are set at different positions. Therefore, there is such a possibility that during the multiple exposure for the shot area S the position of the surface of the substrate P in the Z direction, θX direction, and θY direction in the first exposure area AR1 may be different from the position of the surface of the substrate P in the Z direction, θX direction, and θY direction in the second exposure area AR2. This is caused, for example, by the low flatness of the surface of the substrate P and the presence of concave/convex portions (unevenness, irregularities) on the surface of the substrate. Therefore, it is important to adjust the surface positional relationship among the first image plane IS1, the second image plane IS2, and the surface of the substrate P so that the desired pattern image is formed in each of the first exposure area AR1 and the second exposure area AR2 in order to form the desired pattern on the substrate P by the multiple exposure for the shot area S of the substrate P.

When the shot area S on the substrate P is subjected to the multiple exposure with the image of the first pattern PA1 and the image of the second pattern PA2, the controller 30 adjusts at least one of the positions of the first pattern formation surface K1 of the first mask M1 and the second pattern formation surface K2 of the second mask M2 by using the mask stage 60 to adjust at least one of the positions of the first image plane IS1 and the second image plane IS2. By doing so, the controller 30 is capable of adjusting the surface positional relationship among the first image plane IS1 on which the image of the first pattern PA1 is formed, the second image plane IS2 on which the image of the second pattern PA2 is formed, and the surface of the substrate P.

Figure 10:
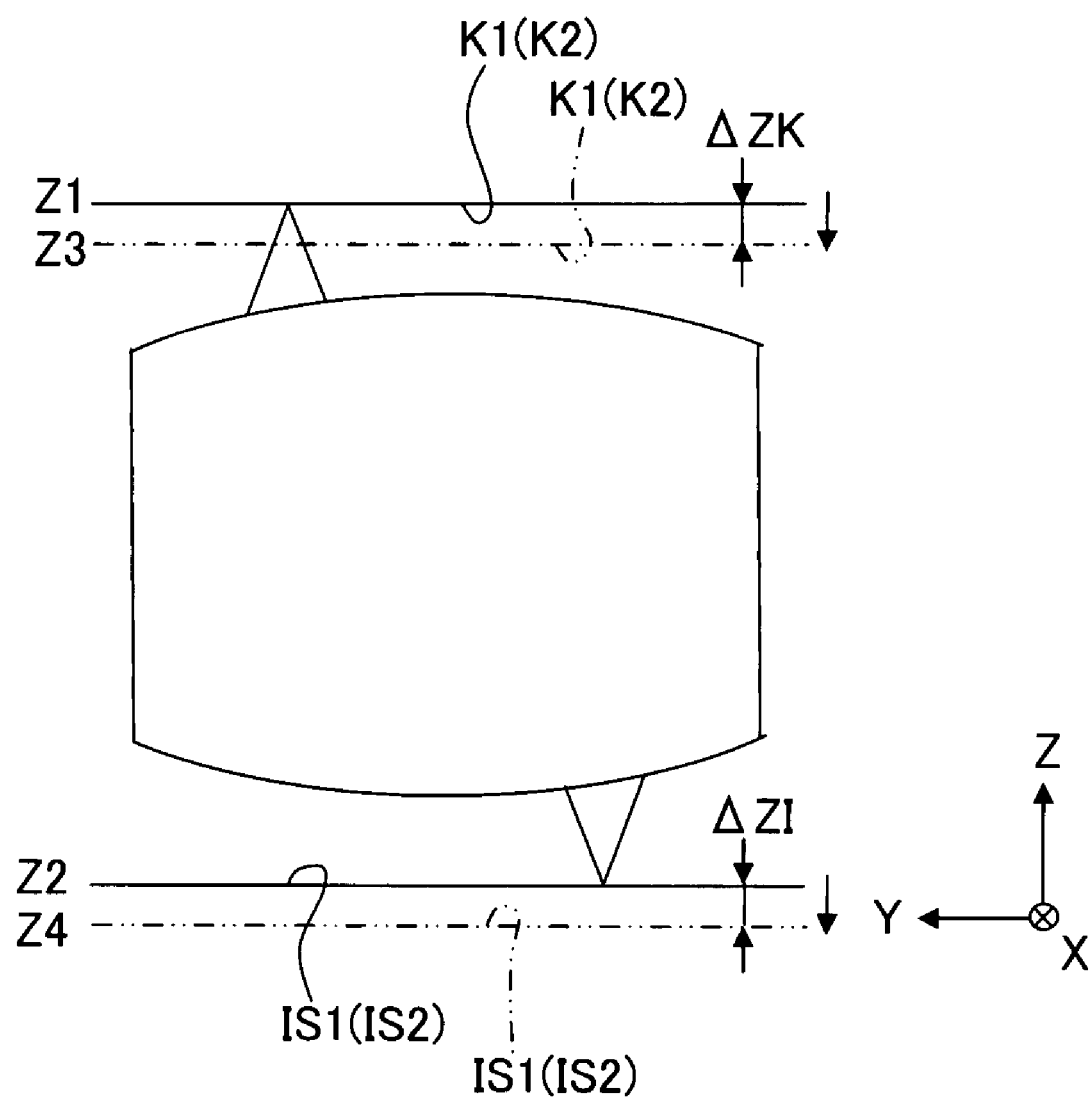
FIG. 10 schematically illustrates the positional relationship between the pattern formation surface and the image plane.

FIG. 10 schematically illustrates an example of the positional relationship between the position of the first pattern formation surface K1 of the first mask M1 and the position of the first image plane IS1 on which the image of the first pattern PA1 is formed by the projection optical system PL. As shown in FIG. 10, it is assumed that the first pattern formation surface K1 of the first mask M1 is arranged at a first position Z1 in relation to the Z axis direction, and the first image plane IS1, on which the image of the first pattern PA1 of the first pattern formation surface K1 is formed, is formed at a second position Z2 in relation to the Z axis direction. On this assumption, when the first pattern formation surface K1 is displaced by a value ΔZK in the −Z direction from the first position Z1 to be arranged at a third position Z3, then the first image plane IS1 is also displaced by a value ΔZI corresponding to the value ΔZK in the −Z direction to be formed at a fourth position Z4. As described above, when the first pattern formation surface K1 is moved in the −Z direction, the first image plane IS1 is also moved in the −Z direction. When the first pattern formation surface K1 is moved in the +Z direction, the first image plane IS1 is also moved in the +Z direction. When the first pattern formation surface K1 is inclined in the θX direction, the first image plane IS1 is also inclined in the θX direction. When the first pattern formation surface K1 is inclined in the θY direction, the first image plane IS1 is also inclined in the θY direction.

As described above, the Z driving mechanism 67 of the first substage-driving device 65 provided for the mask stage 60 is capable of adjusting the position of the first mask M1 held by the first substage 62 in the Z axis, θX, and θY directions as well as the position of the first pattern formation surface K1 in the Z axis, θX, and θY directions. Therefore, the controller 30 is capable of adjusting the position of the first image plane IS1 by adjusting the position of the first pattern formation surface K1 of the first mask M1 held by the first substage 62 by using the Z driving mechanism 67 of the first substage-driving device 65.

The relationship between the position of the first pattern formation surface K1 and the position of the first image plane IS1 (for example, the relationship between the movement amount of the first pattern formation surface K1 and the change amount of the first image plane IS1) can be determined by using the spatial image-measuring instrument 162 described above. For example, the controller 30 can determine the position of the first image plane IS1 corresponding to each of the positions of the first pattern formation surface K1 in the Z axis direction by measuring the spatial image of the measuring mark of the first mask M1 in accordance with the same procedure as the procedure explained with reference to FIGS. 8 and 9A while changing the position in the Z axis direction of the first pattern formation surface K1 of the first mask M1 at the predetermined pitch in the state shown in FIGS. 8 and 9A.

Similarly, when the second pattern formation surface K2 is moved in the −Z direction, the second image plane IS2 is also moved in the −Z direction. When the second pattern formation surface K2 is moved in the +Z direction, the second image plane IS2 is also moved in the +Z direction. When the second pattern formation surface K2 is inclined in the θX direction, the second image plane IS2 is also inclined in the θX direction. When the second pattern formation surface K2 is inclined in the θY direction, the second image plane IS2 is also inclined in the θY direction. The Z driving mechanism 67 of the second substage-driving device 66 provided for the mask stage 60 is capable of adjusting the position of the second mask M2 held by the second substage 63 in the Z axis, θX, and θY directions as well as the position of the second pattern formation surface K2 in the Z axis, θX, and θY directions. Therefore, the controller 30 is capable of adjusting the position of the second image plane IS2 by adjusting the position of the second pattern formation surface K2 of the second mask M2 held by the second substage 63 by using the Z driving mechanism 67 of the second substage-driving device 66. The relationship between the position of the second pattern formation surface K2 and the position of the second image plane IS2 (for example, the relationship between the movement amount of the second pattern formation surface K2 and the change amount of the second image plane IS2) can be also determined by using the spatial image-measuring instrument 162.

The controller 30 can also determine in advance, for example, the relationship between the positions of the first and second pattern formation surfaces K1, K2 and the positions of the first and second image planes IS1, IS2 by using, for example, simulation or the like, on the basis of the optical characteristic (imaging characteristic) of the projection optical system PL.

The relationship between the positions of the first and second pattern formation surfaces K1, K2 and the positions of the first and second image planes IS1, IS2 is stored in the controller 30.

Next, an explanation will be made with reference to a flow chart shown in FIG. 11 about a method for exposing the substrate P by using the exposure apparatus EX constructed as described above.

At first, the controller 30 determines the position of the first image plane IS1 and the position of the second image plane IS2 at the initial state (for example, immediately after the first mask M1 and the second mask M2 are placed on the mask stage 60) (Step SA1). As described above, the positions in the Z axis, θX, and θY directions of the first image plane IS1 and the second image plane IS2 at the initial state are detected respectively by detecting the spatial image of the measuring mark formed on the first pattern formation surface K1 and the spatial image of the measuring mark formed on the second pattern formation surface K2 by using the spatial image-measuring instrument 162 provided for the measuring stage 90.

Next, the controller 30 adjusts at least one of the position of the first image plane IS1 and the position of the second image plane IS2 (Step SA2). More specifically, the controller 30 moves at least one of the first pattern formation surface K1 and the second pattern formation surface K2 by controlling the Z driving mechanism 67 to adjust at least one of the position of the first image plane IS1 and the position of the second image plane IS2. In this embodiment, the controller 30 adjusts for example, the position of the first image plane IS1 so that the first image plane IS1 and the second image plane IS2 are substantially parallel to the XY plane, and that the positions of the first image plane IS1 and the second image plane IS2 in the Z axis direction are substantially coincident with each other. That is, in this embodiment, the adjustment is performed such that the first image plane IS1 and the second image plane IS2 are formed in a same plane, and that the position of the first image plane IS1 is matched to the position of the second image plane IS2. However, only the position of the second image plane IS2 may be adjusted, or the positions of both of the first image plane IS1 and the second image plane IS2 may be adjusted, so that the first image plane IS1 and the second image plane IS2 are formed in the same plane. At least one of the position of the first image plane IS1 and the position of the second image plane IS2 may be adjusted by using at least one of the first and second imaging characteristic-adjusting devices LC1, LC2 instead of using the Z driving mechanism 67, or to be used together with the Z driving mechanism 67. The positions (positions in the Z axis, θX, and θY directions) of the first image plane IS1 and the second image plane IS2 after the adjustment are stored in the memory 31. The positions of the first and second image planes IS1, IS2 may be measured again after the adjustment, and the measured positions may be stored in the memory 31. When only one of the positions of the first and second image planes IS1, IS2 is adjusted during the adjustment as described above, it is also allowable to only measure the position of the image plane of one of the first image plane IS1 and the second image plane IS2.

The controller 30 moves the substrate stage 80 to a substrate-exchange position (loading position) separated and away from the projection optical system PL concurrently with at least a part or parts of Step SA1 and Step SA2 described above.

FIG. 12 schematically shows those disposed in the vicinity of the substrate-exchange position RP. As shown in FIG. 12, the controller 30 loads at the substrate-exchange position RP the substrate P to be subjected to the exposure onto the substrate stage 80 by using a transport system 300.

Subsequently, the controller 30 obtains the surface information about the substrate P held by the substrate holder 80H of the substrate stage 80 by using the focus/leveling-detecting system 130 (Step SA3). As shown in FIG. 12, the focus/leveling-detecting system 130 is arranged away from the projection optical system PL. In this embodiment, the focus/leveling-detecting system 130 is arranged between the substrate-exchange position RP and an exposure process position EP disposed just below the projection optical system PL. The focus/leveling-detecting system 130 obtains the surface information about the substrate P before starting the exposure operation for the substrate P.

As described above, the focus/leveling-detecting system 130 of this embodiment is provided with the light-emitting system 131 which radiates the detecting light beam La onto the surface of the substrate P, and the light-receiving system 132 which is capable of receiving the reflected light beam of the detecting light beam La radiated onto the surface of the substrate P. The focus/leveling-detecting system 130 is capable of determining the position information about the surface of the substrate P onto which the detecting light beam La is radiated, on the basis of the light-receiving result of the light-receiving system 132. In this embodiment, the focus/leveling-detecting system 130 outputs the positional relationship between the position of the first image plane IS1 adjusted in Step SA2 and the position of the surface of the substrate P (information about the positional deviation of the surface of the substrate P with respect to the first image plane IS1). In this embodiment, the adjustment is made in Step SA2 so that the first image plane IS1 and the second image plane IS2 are positioned on the same plane. Therefore, the surface information about the substrate P obtained by using the focus/leveling-detecting system 130 is also the positional relationship between the second image plane IS2 and the surface of the substrate P (information about the positional deviation of the surface of the substrate P with respect to the second image plane IS2).

It is possible to confirm whether or not the focus/leveling-detecting system 130 outputs the positional relationship between the first image plane IS1 adjusted in Step SA2 and the surface of the substrate P (information about the positional deviation of the surface of the substrate P with respect to the first image plane IS1) by determining the position information about the reference reflecting surface formed on the upper surface of the plate member 50' used to detect the positions of the first and second image planes IS1, IS2 with the focus/leveling-detecting system 130.

The focus/leveling-detecting system 130 may output the positional relationship between the second image plane IS2 adjusted in Step SA2 and the surface of the substrate P (information about the positional deviation of the surface of the substrate P with respect to the second image plane IS2), or the focus/leveling-detecting system 130 may output the positional relationship between the surface of the substrate P and any reference surface with a known surface positional relationship with respect to the first image plane IS1 and the second image plane IS2 (surface information about the surface of the substrate P with respect to the reference surface).

The controller 30 radiates the detecting light beam La onto the surface of the substrate P from the light-emitting system 131 of the focus/leveling-detecting system 130 while moving the substrate stage 80 which holds the substrate P in the XY directions while measuring the position information about the substrate stage 80 by using the measuring system 70 (laser interferometer 75). The reflected light beam of the detecting light beam La reflected by the surface of the substrate P is received by the light-receiving system 132. That is, the controller 30 moves the substrate stage 80 so that the detecting light beam La from the focus/leveling-detecting system 130 is radiated onto the substantially entire region of the surface of the substrate P, and the reflected light beam of the detecting light beam La reflected by the surface of the substrate P is received by the light-receiving system 132. Accordingly, the controller 30 can determine the surface information about the substrate P on the basis of the light-receiving result of the light-receiving system 132 of the focus/leveling-detecting system 130. As described above, the surface information about the substrate P includes the position information about the surface of the substrate P (positional deviation information in the Z axis, θX, and θY directions about the surface of the substrate P with respect to the first image plane IS1) and the information about the shape of the surface of the substrate P (irregularity information about the surface of the substrate P with respect to the first image plane IS1).

The position information about the substrate table 80T during the operation for obtaining the surface information about the substrate P by the focus/leveling-detecting system 130 is measured by the encoders 84A, 84B, 84C provided for the substrate stage 80. The controller 30 can obtain the surface information about the substrate P with respect to the first image plane IS1 on the basis of the detection result of the focus/leveling-detecting system 130 and the measurement results of the encoders 84A, 84B, 84C. In this embodiment, it is preferable that the surface information is determined on the substantially entire region of the substrate P. However, it is also enough that the surface information is determined about only a part of the substrate P.

Next, the controller 30 determines a movement profile in the Z axis direction of the first substage 62 which holds the first mask M1 during the exposure for the substrate P (for example, information indicating the relationship between the position in the Y axis direction of the first mask M1 and a target position in the Z axis direction of the first substage 62); a movement profile in the Z axis direction of the second substage 63 which holds the second mask M2 during the exposure for the substrate P (for example, information indicating the relationship between the position in the Y axis direction of the second mask M2 and the target position in the Z axis direction of the second substage 63); and a movement profile in the Z axis direction of the substrate stage 80 which holds the substrate P during the exposure for the substrate P (for example, information indicating the relationship between a position of the substrate P in the XY coordinate system and a target position of the substrate stage 80 in the Z axis direction), before starting the exposure for the shot area S on the substrate P on the basis of the position information about the first and second image planes IS1, IS2 and the surface information about the substrate P (Step SA4).

That is, the controller 30 determines, on the basis of the position information about the first and second image planes IS1, IS2 and the surface information about the substrate P, a position adjustment amount in the Z axis direction for the first image plane IS1 and the second image plane IS2 and/or the surface of the substrate P so that the first image plane IS1 and the surface of the substrate P are in the predetermined positional relationship in the first exposure area AR1 and the second image plane IS2 and the surface of the substrate P are in the predetermined positional relationship in the second exposure area AR2 during the multiple exposure for each of the shot areas on the substrate P. The determined position adjustment amount can be used to adjust the surface positional relationship between the first image plane IS1 and the surface of the substrate P and the surface positional relationship between the second image plane IS2 and the surface of the substrate P respectively. The position adjustment amount may also include at least one of the position adjustment amounts in the θX and θY directions, in addition to in the Z-axis direction.

In the first embodiment, the controller 30 adjusts the positional relationship between the surface of the substrate P and the first image plane IS1 in the first exposure area AR1 only by the positional adjustment for the first image plane IS1; and the controller 30 adjusts the positional relationship between the surface of the substrate P and the second image plane IS2 in the second exposure area AR2 only by the positional adjustment for the surface of the substrate P. That is, in this embodiment, the controller 30 moves the first image plane IS1 so that the first image plane IS1 and the surface of the substrate P are in the predetermined positional relationship in the first exposure area AR1 on the basis of the surface information about the substrate P determined in Step SA3, and the controller 30 moves the surface of the substrate P so that the second image plane IS2 and the surface of the substrate P are in the predetermined positional relationship in the second exposure area AR2.

Figure 14:
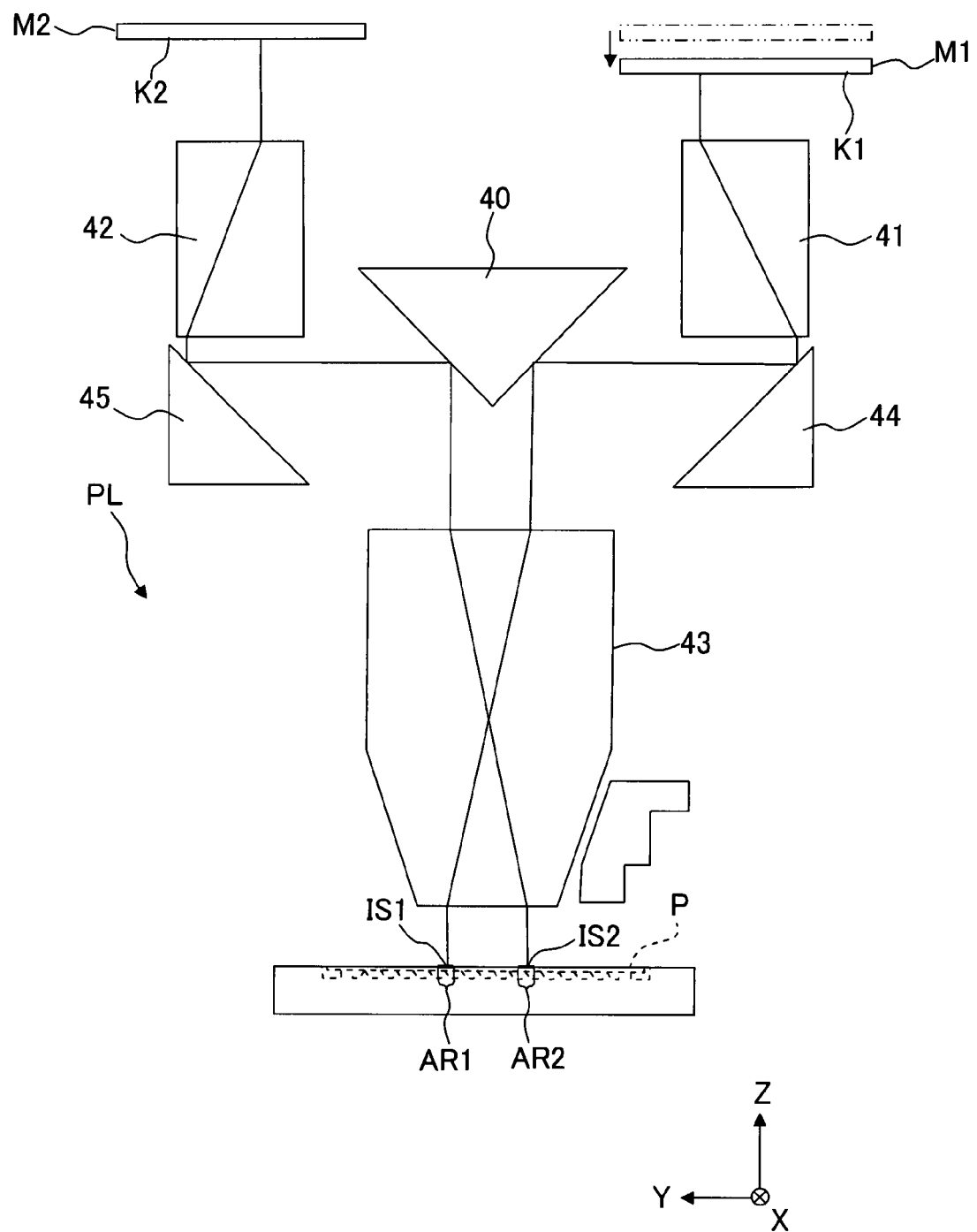
FIG. 14 schematically illustrates the operation of the exposure apparatus according to the first embodiment.

An explanation will now be made about a method for adjusting the surface positional relationship between the positions of the first and second image planes IS1, IS2 and the position of the surface of the substrate P according to this embodiment with reference to schematic drawings shown in FIGS. 13A, 13B, and 14. FIGS. 13A and 13B schematically show an example of the surface positional relationship among the first image plane IS1, the second image plane IS2, and the surface of the substrate P. FIG. 14 schematically shows an example of the exposure apparatus EX in a state in which the surface positional relationship is adjusted for the first and second image planes IS1, IS2 and the surface of the substrate P during the multiple exposure for the shot area S on the substrate P.

FIG. 13A schematically shows the relationship between the positions of the first and second image planes IS1, IS2 and the surface of the substrate P when the first and second pattern formation surfaces K1, K2 are arranged at the predetermined positions in the Z axis direction (in the same plane) immediately after Step SA2 described above. Although not shown in FIG. 13A, the horizontal axis indicates the position in the Y axis direction (scanning direction), and the vertical axis indicates the position in the Z axis direction (this assumption is applied to FIG. 13B as well). In the state shown in FIG. 13A, the surface positional relationship is not adjusted for the first image plane IS1, the second image plane IS2, and the surface of the substrate P. As shown in FIG. 13A, the position in the Z axis direction differs between a partial area of the surface of the substrate P desired to be matched to the first image plane IS1 in the first exposure area AR1 and another partial area of the surface of the substrate P which is desired to be matched to the second image plane IS2 in the second exposure area AR2. In this embodiment, the controller 30 moves the first image plane IS1 and the substrate P so that the first image plane IS1 and the surface of the substrate P are matched to each other or consistent with each other in the first exposure area AR1, and that the second image plane IS2 and the surface of the substrate P are matched to each other or consistent with each other in the second exposure area AR2.

That is, as shown in FIG. 13B, the controller 30 moves the first image plane IS1 in the Z axis direction so that the first image plane IS1 and the surface of the substrate P are matched to each other in the first exposure area AR1, and the controller 30 moves the substrate P in the Z axis direction so that the second image plane IS2 and the surface of the substrate P are matched to each other in the second exposure area AR2. In the example shown in FIG. 13B, the first image plane IS1 is moved in the −Z direction from the state shown in FIG. 13A, and the surface of the substrate P is moved in the +Z direction from the state shown in FIG. 13A.

In order to adjust the position of the first image plane IS1 in the Z axis direction, the controller 30 moves the first substage 62 which holds the first mask M1 in the Z axis direction. That is, the controller 30 controls the first substrate 62 to adjust the position in the Z axis direction of the first pattern formation surface K1 of the first mask M1 as schematically shown in FIG. 14. The position of the first image plane IS1 can be moved in the −Z direction as shown in FIG. 13B by moving the first pattern formation surface K1 of the first mask M1 in the −Z direction from the predetermined position indicated by broken lines as shown in FIG. 14. The controller 30 can provide the desired positional relationship for the surface of the substrate P and the first image plane IS1 in the first exposure area AR1 by adjusting the position in the Z axis direction of the first pattern formation surface K1 to adjust the position of the first image plane IS1 in the Z axis direction.

The controller 30 can provide the desired positional relationship for the surface of the substrate P and the second image plane IS2 in the second exposure area AR2 by controlling the substrate stage 80 to adjust the position of the surface of the substrate P in the Z axis direction. In this embodiment, the controller 30 makes the control such that the position in the Z axis direction of the second substage 63 which holds the second mask M2 is substantially unmoved.

The relationship between the position of the first pattern formation surface K1 and the position of the first image plane IS1 is previously stored in the controller 30. The positions of the first image plane IS1 and the second image plane IS2 before the start of the exposure for the substrate P are measured in Step SA1, and are adjusted in Step SA2. The positions of the first and second image planes IS1, IS2 after the adjustment are also stored in the controller 30. The surface information of the substrate P is determined in Step SA3. Therefore, the controller 30 can know an appropriate extent of the movement of the first pattern formation surface K1 of the first mask M1 in the Z axis direction in order that the first image plane IS1 is matched to the surface of the substrate P in the first exposure area AR1 on the basis of the results of Steps SA1, SA2, and SA3. Similarly, the controller 30 can know an appropriate extent of the movement of the surface of the substrate P in the Z axis direction in order that the surface of the substrate P is matched to the second image plane IS2 in the second exposure area AR2 on the basis of the results of Steps SA1, SA2, and SA3.

The explanation has been made above with reference to FIGS. 13A, 13B, and 14 about the method for adjusting the surface positional relationship between the first and second image planes IS1, IS2 and the surface of the substrate P according to this embodiment. The controller 30 of this embodiment determines the amounts of positional adjustment of the first image plane IS1 and the surface of the substrate P during the scanning exposure so that the first image plane IS1 and the surface of the substrate P are in the desired positional relationship in the first exposure area AR1, and that the second image plane IS2 and the surface of the substrate P are in the desired positional relationship in the second exposure area AR2 during the scanning exposure for the shot area S of the substrate P. That is, in this step (Step SA4), the controller 30 determines the movement profile in the Z axis direction of the first substage 62 which holds the first mask M1 during the exposure for the substrate P, the movement profile in the Z axis direction of the second substage 63 which holds the second mask M2 during the exposure for the substrate P, and the movement profile in the Z axis direction of the substrate stage 80 which holds the substrate P during the exposure for the substrate P, before the start of the exposure for the shot area S on the substrate P on the basis of the position information about the first and second image planes IS1, IS2 and the surface information about the substrate P.

The exposure apparatus EX of this embodiment successively performs the multiple exposure for each of the plurality of shot areas S(S1 to S21) on the substrate P with the image of the first pattern PA1 and the image of the second pattern PA2 while synchronously moving the first mask M1, the second mask M2, and the substrate P in the Y axis direction. Therefore, the controller 30 prepares the movement profiles in the Z axis direction of the first substage 62, the second substage 63, and the substrate stage 80 for each of the shot areas on the substrate P.

FIGS. 15A, 15B schematically show an example of the relationship among the surface information of the substrate P, the movement profile in the Z axis direction of the first substage 62, and the movement profile in the Z axis direction of the substrate table 80T. As described above, in this embodiment, the second substage 63 is not moved in the Z axis direction during the exposure for the substrate P. Therefore, the movement profile in the Z axis direction of the second substage 63 is not shown in FIGS. 15A and 15B. FIG. 15A shows the surface information about one shot area S of the substrate P (distribution of positions in the Z axis direction of the surface of the substrate P in relation to the Y axis direction). FIG. 15B shows the movement profile in the Z axis direction of the substrate table 80T during the scanning exposure for the shot area S, and the movement profile in the Z axis direction of the first substage 62. FIGS. 15A and 15B shows a state in which the exposure is performed while moving the shot area S on the substrate P in the −Y direction with respect to the first and second exposure areas AR1, AR2.

As shown in FIGS. 15A and 15B, the controller 30 determines the movement profile of the first substage 62 in the Z axis direction when the main stage 61 and the substrate stage 80 are synchronously moved in the Y axis direction so that the first image plane IS1 is matched to the surface of the substrate P in the first exposure area AR1 during the scanning exposure for the shot area S of the substrate P. Further, the controller 30 determines the movement profile of the substrate stage 80 in the Z axis direction when the main stage 61 and the substrate stage 80 are synchronously moved in the Y axis direction so that the surface of the substrate P is matched to the second image plane IS2 in the second exposure area AR2 during the scanning exposure for the shot area S of the substrate P.

In FIG. 15B, a point of time, at which the projection of the image of the first pattern PA1 with the first exposure light beam EL1 onto the shot area S on the substrate P is started, is regarded as the origin. The movement of the substrate stage 80 in the Z axis direction is started to allow the surface of the substrate P to be matched to the second image plane IS2 in the second exposure area AR2 with a delay of the time $\Delta T$ corresponding to the movement velocity of the substrate stage 80 in the Y axis direction and the distance between the first exposure area AR1 and the second exposure area AR2.

The controller 30 starts the multiple exposure for the shot area S on the substrate P with the image of the first pattern PA1 and the image of the second pattern PA2 while controlling the mask stage 60 and the substrate stage 80 on the basis of the movement profiles determined in Step SA4 (Step SA5).

The projection position of the image of the first pattern PA1, the projection position of the image of the second pattern PA2, and the positions of the respective shot areas on the substrate P (positional relationship between each of the shot areas and the respective projection positions) are determined in the XY coordinate system defined by the measuring system 70 by using the first detecting system 10 and the second detecting system 20 prior to the exposure for the substrate P. The multiple exposure is performed for each of the shot areas while adjusting the positional relationship among the image of the first pattern PA1, the image of the second pattern PA2, and the substrate P during the exposure for each of the shot areas on the substrate P.

The controller 30 synchronously moves the main stage 61 and the substrate stage 80 in the Y axis direction while moving the first substage 62 in the Z axis direction by using the Z driving mechanism 67 of the first substage-driving device 65 on the basis of the movement profile determined in Step SA4 so that the first image plane IS1 is matched to the surface of the substrate P in the first exposure area AR1 during the scanning exposure for the shot area S of the substrate P. Further, the controller 30 synchronously moves the main stage 61 and the substrate stage 80 in the Y axis direction while moving the substrate table 80T in the Z axis direction by using the Z driving mechanism 82 of the substrate stage-driving device 80D on the basis of the movement profile determined in Step SA4 so that the surface of the substrate P is matched to the second image plane IS2 in the second exposure area AR2 during the scanning exposure for the shot area S of the substrate P.

The controller 30 performs the scanning exposure for the shot area S on the substrate P while measuring the position information about the first mask M1 (first pattern formation surface K1) by using the Z measuring device 70A (first mask measuring device 171) provided for the mask stage 60 and measuring the position information about the substrate table 80T (surface of the substrate P) by using the encoders 84A, 84B, 84C provided for the substrate stage 80. The controller 30 exposes the shot area S on the substrate P while adjusting the position of the first mask M1 by using the Z driving mechanism 67 of the first substage-driving device 65 on the basis of the measurement result of the Z measuring device 70A (first mask measuring device 171) by using the movement profile determined in Step SA3 as the target value and adjusting the position of the substrate P by using the Z driving mechanism 82 of the substrate stage-driving device 80D on the basis of the measurement results of the encoders 84A, 84B, 84C. With this, the controller 30 can perform the multiple exposure for the shot area S on the substrate P while providing the desired states of the surface positional relationship between the surface of the substrate P and the first image plane IS1 in the first exposure area AR1 and the surface positional relationship between the surface of the substrate P and the second image plane IS2 in the second exposure area AR2.

It is also possible to adjust the relative inclination (adjust the position in the $\theta X$ and $\theta Y$ directions) between the first and second image planes IS1, IS2 and the surface of the substrate P during the scanning exposure for the shot area S of the substrate P. In this case, it is appropriate that the movement profiles in the $\theta X$ and $\theta Y$ directions of the first substage 62, the second substage 63, and the substrate stage 80 are prepared in Step SA4.

For example, when the surface of the substrate P is inclined with respect to the first image plane IS1 in the first exposure area AR1, the controller 30 can match the first image plane IS1 with respect to the surface of the substrate P in the first exposure area AR1 by inclining the first pattern formation surface K1 by using the Z driving mechanism 67 of the first substage-driving device 65 depending on the inclination information about the surface of the substrate P (position information in the $\theta X$ and $\theta Y$ directions) and the position information about the first image plane IS1 in the $\theta X$ and $\theta Y$ directions.

Further, the controller 30 can incline the surface of the substrate P by inclining the substrate table 80T by using the Z driving mechanism 82 depending on the position information in the $\theta X$ and $\theta Y$ directions about the surface of the substrate P and the second image plane IS2 so that the surface of the substrate P is matched to the second image plane IS2 in the second exposure area AR2.

As explained above, the shot area S of the substrate P can be subjected to the multiple exposure efficiently by radiating the first exposure light beam EL1 and the second exposure light beam EL2 onto the first exposure area AR1 and the second exposure area AR2 respectively and by moving the substrate P in the Y axis direction so that the shot area S on the substrate P passes across the first exposure area AR1 and the second exposure area AR2. In this embodiment, each of the plurality of shot areas S on the substrate P is processed such that each of shot areas S can be subjected to the multiple exposure (double exposure) with the image of the first pattern PA1 and the image of the second pattern PA2 by one time of the scanning operation, thereby making it possible to improve the throughput. The plurality of shot areas S on the substrate P can be efficiently subjected to the multiple exposure by repeating the scanning operation in the −Y direction and the scanning operation in the +Y direction for the substrate P. The image of the first pattern PA1 and the image of the second pattern PA2 can be formed in the desired positional relationship in each of the shot areas S, because each of the shot areas S can be subjected to the multiple exposure by one time of the scanning operation.

In this embodiment, the shot area S of the substrate P is subjected to the multiple exposure by adjusting the surface positional relationship among the first image plane IS1, the second image plane IS2, and the surface of the substrate P. Therefore, even when the position of the surface of the substrate P differs between the first and second exposure areas AR1, AR2, the first image plane IS1 and the surface of the substrate P can be in the desired positional relationship in the first exposure area AR1, and the second image plane IS2 and the surface of the substrate P can be in the desired positional relationship in the second exposure area AR2. Therefore, it is possible to form the desired pattern on the substrate P.

In this embodiment, the adjustment of the positional relationship between the surface of the substrate P and the second image plane IS2 in the second exposure area AR2 is executed only by the adjustment of the surface position of the substrate P (movement of the substrate stage 80); and the adjustment of the positional relationship between the surface of the substrate P and the first image plane in the first exposure area AR1 is executed only by the positional adjustment of the first pattern formation surface K1 of the first mask M1 in the first illumination area IA1 conjugate with the first exposure area AR1. Therefore, the image planes (IS1, IS2) and the surface of the substrate P can be matched to one another or consistent with each other by the relatively easy control in both of the first and second exposure areas AR1, AR2.

In this embodiment, the first exposure light beam EL1 radiated onto the first exposure area AR1 and the second exposure light beam EL2 radiated onto the second exposure area AR2 are radiated onto the substrate P via one final optical element FL. Therefore, it is possible to simplify the structure of the projection optical system PL. In addition, since the first exposure area AR1 and the second exposure area AR2 are defined at the different positions in the field of the projection optical system PL, the first exposure light beam EL1 from the first mask M1 and the second exposure light beam EL2 from the second mask M2 can be guided to the third optical system 43 by arranging the reflecting surfaces 40A, 40B in the vicinity of the positions optically conjugate with the first and second exposure areas AR1, AR2. Thus, the first exposure light beam EL1 and the second exposure light beam EL2 can be radiated onto the first and second exposure areas AR1, AR2 respectively.

In this embodiment, the adjustment of the positional relationship between the surface of the substrate P and the first image plane IS1 in the first exposure area AR1 is performed only by the positional adjustment of the first image plane IS1 effected by the positional adjustment of the first pattern formation surface K1; and the adjustment of the positional relationship between the surface of the substrate P and the second image plane IS2 in the second exposure area AR2 is performed only by the positional adjustment of the surface of the substrate P. However, the adjustment of the positional relationship between the surface of the substrate P and the first image plane IS1 in the first exposure area AR1 may be performed only by the positional adjustment of the surface of the substrate P; and the adjustment of the positional relationship between the surface of the substrate P and the second image plane IS2 in the second exposure area AR2 may be performed only by the positional adjustment of the second image plane IS2 effected by the positional adjustment of the second pattern formation surface K2 using the second substage-driving device 66. In this case, for example, the controller 30 can adjust the position of the second mask M2 (second pattern formation surface K2) by using the Z driving mechanism 67 of the second substage-driving device 66 while detecting the position information about the second pattern formation surface K2 of the second mask M2 by using the Z measuring device 70A (second mask measuring device 172). Further, in this case, the controller 30 can incline the second pattern formation surface K2 by using the Z driving mechanism 67 of the second substage-driving device 66 depending on the inclination information about the surface of the substrate P in the second exposure area AR2 during the scanning exposure for the shot area S of the substrate P; and the controller 30 can incline the surface of the substrate P by using the Z driving mechanism 82 of the substrate stage 80 so that the surface of the substrate P is matched to the first image plane IS1 in the first exposure area AR1. In this embodiment, the position (and the inclination) of the image plane may be adjusted in one of the first and second exposure areas AR1, AR2, and the position (and the inclination) of the substrate may be adjusted in the other of the first and second exposure areas AR1, AR2 so that the surface of the substrate is arranged within the depth of focus of the projection optical system in the first and second exposure areas AR1, AR2 respectively. That is, it is also allowable that the surface of the substrate is not matched to the image plane in at least one of the first and second exposure areas AR1, AR2.

Second Embodiment

The second embodiment will be explained. In the first embodiment described above, the controller 30 performs the adjustment of the positional relationship between the surface of the substrate P and the first image plane IS1 in the first exposure area AR1 only by the positional adjustment of the first image plane IS1, and the controller 30 performs the adjustment of the positional relationship between the surface of the substrate P and the second image plane IS2 only by the positional adjustment of the surface of the substrate P. However, the feature of the second embodiment is that the controller 30 performs the adjustment of the positional relationship between the surface of the substrate P and the first image plane IS1 in the first exposure area AR1 and the adjustment of the positional relationship between the surface of the substrate P and the second image plane IS2 in the second exposure area AR2 only by the positional adjustment of the first image plane IS1 and the second image plane IS2 without performing the positional adjustment of the surface of the substrate P.

In the following description, the constitutive parts or components, which are same as or equivalent to those of the embodiment described above, are designated by the same reference numerals, any explanation of which will be simplified or omitted.

Figure 16A:
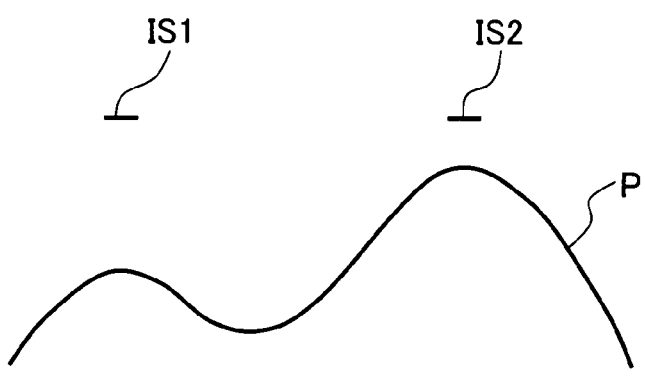
FIGS. 16A and 16B illustrate an exemplary method for adjusting the surface positional relationship between the first and second image planes and the surface of the substrate according to a second embodiment.
Figure 16B:
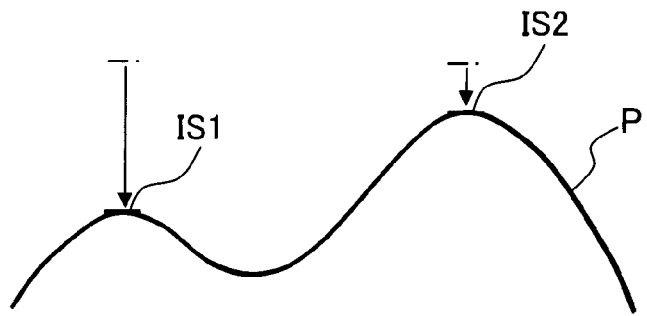

FIGS. 16A and 16B schematically illustrate a method for adjusting the surface positional relationship among the first and second image planes IS1, IS2 and the surface of the substrate P according to the second embodiment. FIG. 16A schematically shows the positional relationship among the positions of the first and second image planes IS1, IS2 and the surface of the substrate P in the same manner as FIG. 13A. The surface positional relationship among the first and second image planes IS1, IS2 and the surface of the substrate P is not adjusted in the state shown in FIG. 16A.

In this embodiment, as shown in FIG. 16B, the controller 30 moves the first image plane IS1 in the Z axis direction so that the first image plane IS1 and the surface of the substrate P are matched to each other in the first exposure area AR1, and the controller 30 moves the second image plane IS2 in the Z axis direction so that the second image plane IS2 and the surface of the substrate P are matched to each other in the second exposure area AR2. In the example shown in FIG. 16B, the first image plane IS1 is moved in the −Z direction from the state shown in FIG. 16A, and the second image plane IS2 is also moved in the −Z direction from the state shown in FIG. 16A.

The controller 30 moves the first substage 62 which holds the first mask M1 in the Z axis direction in order to adjust the position of the first image plane IS1 in the Z axis direction in the first exposure area AR1. That is, the controller 30 controls the first substage 62 to adjust the position of the first pattern formation surface K1 of the first mask M1 in the Z axis direction. The controller 30 moves the second substage 63 which holds the second mask M2 in the Z axis direction in order to adjust the position of the second image plane IS2 in the Z axis direction in the second exposure area AR2. That is, the controller 30 controls the second substage 63 to adjust the position of the second pattern formation surface K2 of the second mask M2 in the Z axis direction. In this embodiment, the controller 30 controls the substrate stage 80 so that the position in the Z axis direction of the surface of the substrate P is substantially unmoved. Accordingly, the controller 30 can provide the desired positional relationship between the surface of the substrate P and the first image plane IS1 in the first exposure area AR1, and the controller 30 can provide the desired positional relationship between the surface of the substrate P and the second image plane IS2 in the second exposure area AR2.

The controller 30 prepares the movement profiles in the Z axis direction of the first substage 62, the second substage 63, and the substrate stage 80 prior to the scanning exposure for the substrate P in the same manner as in the first embodiment described above. The controller 30 determines the movement profile of the first substage 62 in the Z axis direction so that the first image plane IS1 is matched to the surface of the substrate P in the first exposure area AR1 during the scanning exposure for the shot area S of the substrate P. Further, the controller 30 determines the movement profile of the second substage 63 in the Z axis direction so that the second image plane IS2 is matched to the surface of the substrate P in the second exposure area AR2 during the scanning exposure for the shot area S of the substrate P. When the movement profiles of the first and second substages 62, 63 are determined, the position information about the first and second image planes IS1, IS2 and the surface information about the substrate P are used. The movement profile of the substrate stage 80 is determined so that the position of the surface of the substrate P in the Z axis direction is not changed during the exposure for the substrate P.

The controller 30 performs the multiple exposure for the shot area S on the substrate P with the image of the first pattern PA1 and the image of the second pattern PA2 while controlling the mask stage 60 and the substrate stage 80 on the basis of the determined movement profiles.

Also in this embodiment, the adjustment of the relative inclination of the first and second image planes IS1, IS2 and the surface of the substrate P (positional adjustment in the θX and θY directions) can be performed during the scanning exposure for the shot area S of the substrate P.

Also in this embodiment, even when the position of the surface of the substrate P differs between the first and second exposure areas AR1, AR2, the desired positional relationship can be provided between the surface of the substrate P and the first image plane IS1 in the first exposure area AR1, and the desired positional relationship can be provided between the surface of the substrate P and the second image plane IS2 in the second exposure area AR2. Therefore, it is possible to form the desired pattern on the substrate P. Also in this embodiment, the positions (and the inclinations) of the first and second image planes IS1, IS2 may be adjusted so that the surface of the substrate is arranged within the depth of focus of the projection optical system PL in the first and second exposure areas AR1, AR2 respectively. That is, it is also allowable that the image plane is not matched to the surface of the substrate in at least one of the first and second exposure areas AR1, AR2.

Third Embodiment

The third embodiment will be explained. The feature of this embodiment is that the controller 30 performs the adjustment of the positional relationship between the surface of the substrate P and the first image plane IS1 in the first exposure area AR1 and the adjustment of the positional relationship between the surface of the substrate P and the second image plane IS2 in the second exposure area AR2 only by the positional adjustment of the surface of the substrate P without performing the positional adjustment of the first image plane IS1 and the second image plane IS2. In the following description, the constitutive parts or components, which are the same as or equivalent to those of the embodiment described above, are designated by the same reference numerals, any explanation of which will be simplified or omitted.

Figure 17A:
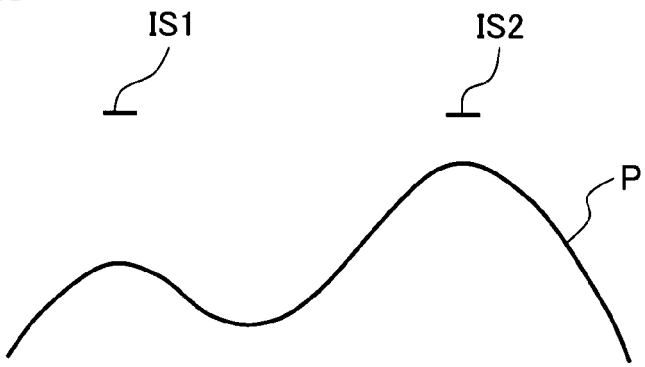
FIGS. 17A and 17B illustrate an exemplary method for adjusting the surface positional relationship between the first and second image planes and the surface of the substrate according to a third embodiment.
Figure 17B:
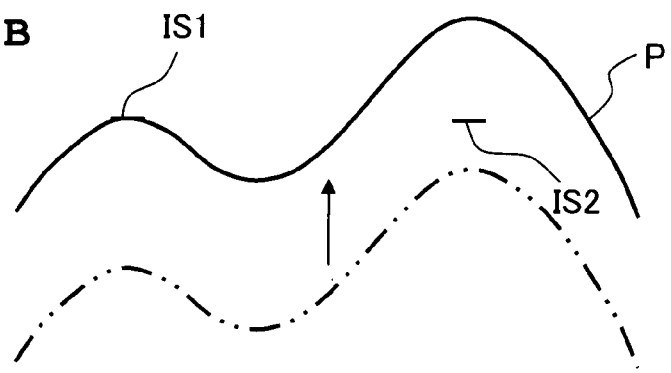

FIGS. 17A and 17B schematically illustrate a method for adjusting the surface positional relationship among the first and second image planes IS1, IS2 and the surface of the substrate P according to the third embodiment. FIG. 17A schematically shows the relationship among the positions of the first and second image planes IS1, IS2 and the surface of the substrate P in the same manner as FIG. 13A. The surface positional relationship among the first and second image planes IS1, IS2 and the surface of the substrate P is not adjusted in the state shown in FIG. 17A.

In this embodiment, as shown in FIG. 17B, the controller 30 adjusts the position of the surface of the substrate P so that the first image plane IS1 and the surface of the substrate P are matched to each other in the first exposure area AR1. In the example shown in FIG. 17B, the surface of the substrate P is moved in the +Z direction from the state shown in FIG. 17A.

The controller 30 controls the substrate stage 80 to adjust the position of the surface of the substrate P in the Z axis direction in the first exposure area AR1. In this embodiment, the controller 30 controls the first and second substages 62, 63 so that the positions of the first image plane IS1 and the second image plane IS2 are not changed, and that the position in the Z axis direction of the first substage 62 which holds the first mask M1 and the position in the Z axis direction of the second substage 63 which holds the second mask M2 are substantially unmoved. Accordingly, the controller 30 can match the first image plane IS1 and the surface of the substrate P in the first exposure area AR1. Further, the predetermined positional relationship can be provided between the second image plane IS2 and the surface of the substrate P in the second exposure area AR2.

The controller 30 prepares the movement profiles in the Z axis direction of the first substage 62, the second substage 63, and the substrate stage 80 prior to the scanning exposure for the substrate P in the same manner as in the respective embodiments described above. The controller 30 determines the movement profile of the substrate stage 80 (substrate table 80T) in the Z axis direction so that the first image plane IS1 is matched to the surface of the substrate P in the first exposure area AR1 during the scanning exposure for the shot area S of the substrate P. The movement profiles of the first and second substages 62, 63 are determined so that the positions of the first image plane IS1 and the second image plane IS2 in the Z axis direction are not changed during the scanning exposure for the shot area S of the substrate P.

The controller 30 performs the multiple exposure for the shot area S on the substrate P with the image of the first pattern PA1 and the image of the second pattern PA2 while controlling the mask stage 60 and the substrate stage 80 on the basis of the determined movement profiles.

In this embodiment, the first image plane IS1 and the surface of the substrate P are successfully allowed to be in the desired positional relationship in the first exposure area AR1. The shot area S of the substrate P can be subjected to the multiple exposure by using the method of this embodiment, for example, when the highly accurate adjustment of the positional relationship is required for the first pattern PA1 between the first image plane IS1 and the surface of the substrate P, and the highly accurate adjustment of the positional relationship is not required for the second pattern PA2 between the second image plane IS2 and the surface of the substrate P, or when the projection condition differs between the first pattern PA1 and the second pattern PA2, and the image of the second pattern PA2 is projected with a large depth of focus as compared with the image of the first pattern PA1, or when the surface of the substrate P is relatively flat, and the difference is small between the position of the surface of the substrate P in the first exposure area AR1 and the position of the surface of the substrate P in the second exposure area AR2. In this embodiment, even when the position of the substrate P is adjusted so that the first image plane IS1 and the surface of the substrate P are matched to each other in the first exposure area AR1, the surface of the substrate P is substantially maintained within the depth of focus of the projection optical system PL in the second exposure area AR2, and any defective resolution or the like is not caused for the second pattern PA2.

In this embodiment, the positional relationship between the first image plane IS1 and the surface of the substrate P is adjusted by using only the substrate stage 80 in only the first exposure area AR1. Therefore, it is possible to allow the first image plane IS1 and the surface of the substrate P to be in the desired state with ease. Further, in this embodiment, it is possible to simplify the apparatus, and it is possible to realize the low cost, for example, such that the Z driving mechanism 67 of the second substage-driving device 66 for driving the second substage 63 can be simplified or omitted.

In this embodiment, the positional adjustment of the surface of the substrate P is performed so that the first image plane IS1 and the surface of the substrate P are matched to each other in the first exposure area AR1 without performing the adjustment of the positional relationship between the second image plane IS2 and the surface of the substrate P in the second exposure area AR2. However, the positional adjustment of the surface of the substrate P may be performed so that the second image plane IS2 and the surface of the substrate P are matched to each other in the second exposure area AR2 without performing the adjustment of the positional relationship between the first image plane IS1 and the surface of the substrate P in the first exposure area AR1.

The adjustment of the positional relationship between the image plane (IS1 or IS2) and the surface of the substrate P, which is to be performed in one of the exposure areas (AR1 or AR2), may be executed only by the positional adjustment of the image plane (IS1 or IS2) without performing the positional adjustment of the surface of the substrate P. Alternatively, the adjustment of the positional relationship between the image plane (IS1 or IS2) and the surface of the substrate P, which is to be performed in one of the exposure areas (AR1 or AR2), may be executed by both of the positional adjustment of the surface of the substrate P and the positional adjustment of the image plane (IS1 or IS2).

Also in this embodiment, the adjustment of the relative inclination between the image plane (IS1 or IS2) and the surface of the substrate P (positional adjustment in the θX and θY directions) can be performed in one of the exposure areas (AR1 or AR2). Also in this embodiment, at least one of the positions (and the inclinations) of the image plane and the substrate may be adjusted in one of the first and second exposure areas AR1, AR2 so that the surface of the substrate is arranged within the depth of focus of the projection optical system PL in the first and second exposure areas AR1, AR2 respectively. That is, it is also allowable that the image plane and the surface of the substrate are not matched to each other in one of the exposure areas.

Fourth Embodiment

The fourth embodiment will be explained. The feature of this embodiment is that the controller 30 performs the positional adjustment of the surface of the substrate P so that an error between the first image plane IS1 and the surface of the substrate P in the first exposure area AR1 and an error between the second image plane IS2 and the surface of the substrate P in the second exposure area AR2 are approximately identical with each other. In the following description, the constitutive parts or components, which are the same as or equivalent to those of the embodiment described above, are designated by the same reference numerals, any explanation of which will be simplified or omitted.

Figure 18A:
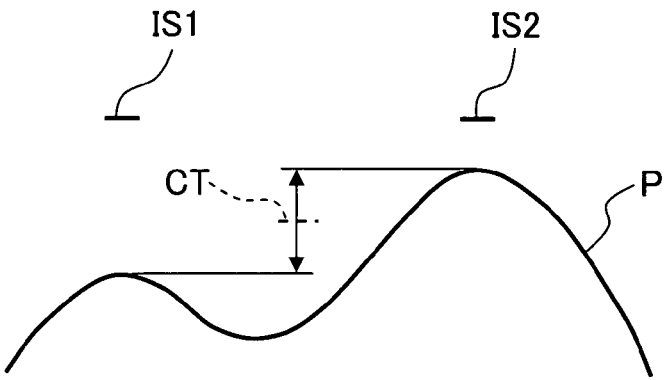
FIGS. 18A and 18B illustrate an exemplary method for adjusting the surface positional relationship between the first and second image planes and the surface of the substrate according to a fourth embodiment.
Figure 18B:
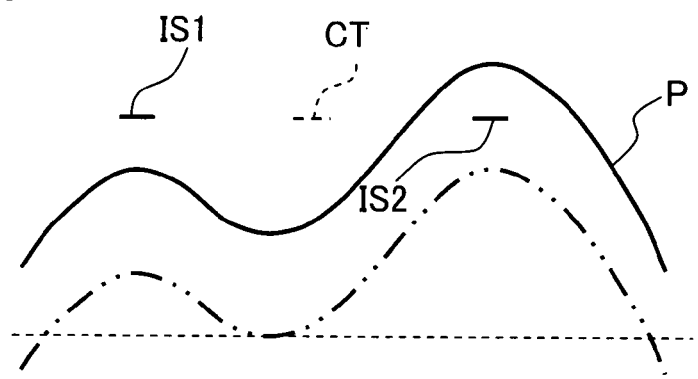

FIGS. 18A and 18B schematically illustrate a method for adjusting the surface positional relationship among the first and second image planes IS1, IS2 and the surface of the substrate P according to the fourth embodiment. FIG. 18A schematically shows the relationship among the positions of the first and second image planes IS1, IS2 and the surface of the substrate P in the same manner as FIG. 13A. The surface positional relationship among the first image plane IS1, the second image plane IS2, and the surface of the substrate P is not adjusted in the state shown in FIG. 18A.

In this embodiment, as shown in FIG. 18B, the controller 30 moves the surface of the substrate P in the Z axis direction P so that the error between the first image plane IS1 and the surface of the substrate P in the first exposure area AR1 and the error between the second image plane IS2 and the surface of the substrate P in the second exposure area AR2 are substantially equal to one another, to thereby perform the positional adjustment of the surface of the substrate P. The controller 30 performs the adjustment of the positional relationship between the first image plane IS1 and the surface of the substrate P in the first exposure area AR1 and the adjustment of the positional relationship between the second image plane IS2 and the surface of the substrate P in the second exposure area AR2 only by the positional adjustment of the surface of the substrate P without performing the positional adjustment of the first image plane IS1 and the second image plane IS2.

Also in this embodiment, the positions in the Z axis direction of the first image plane IS1 and the second image plane IS2 are substantially identical with each other. Therefore, the controller 30 performs the positional adjustment of the surface of the substrate P so that an intermediate position (average position) CT between the position in the Z axis direction of the surface of the substrate P in the first exposure area AR1 and the position in the Z axis direction of the surface of the substrate P in the second exposure area AR2 is matched to the first image plane IS1 and the second image plane IS2. In the example shown in FIG. 18B, the substrate P is moved in the +Z direction from the state shown in FIG. 18A so that the intermediate position CT between the position in the Z axis direction of the surface of the substrate P in the first exposure area AR1 and the position in the Z axis direction of the surface of the substrate P in the second exposure area AR2 is matched to the first image plane IS1 and the second image plane IS2.

The controller 30 controls the substrate stage 80 to adjust the position in the Z axis direction of the surface of the substrate P in the first exposure area AR1 and second exposure area AR2. The controller 30 controls the first and second substages 62, 63 so that the positions of the first image plane IS1 and the second image plane IS2 are not changed, and that the position in the Z axis direction of the first substage 62 which holds the first mask M1 and the position in the Z axis direction of the second substage 63 which holds the second mask M2 are substantially unmoved.

The controller 30 prepares the movement profiles in the Z axis direction of the first substage 62, the second substage 63, and the substrate stage 80 prior to the scanning exposure for the substrate P in the same manner as in the respective embodiments described above. The controller 30 determines the movement profile of the substrate stage 80 in the Z axis direction so that the intermediate position CT of the surface of the substrate P is matched to the first and second image planes IS1, IS2 during the scanning exposure for the shot area S of the substrate P. The movement profiles of the first and second substages 62, 63 are determined so that the positions of the first and second image planes IS1, IS2 in the Z axis direction are not changed during the scanning exposure for the shot area S of the substrate P.

The controller 30 performs the multiple exposure for the shot area S on the substrate P with the image of the first pattern PA1 and the image of the second pattern PA2 while controlling the mask stage 60 and the substrate stage 80 on the basis of the determined movement profiles.

The shot area S of the substrate P can be subjected to the multiple exposure by using the method for adjusting the surface position of this embodiment, for example, when the highly accurate adjustment of the positional relationship is not required for both of the image of the first pattern PA1 and the image of the second pattern PA2 between the image planes (IS1, IS2) and the surface of the substrate P, or when the surface of the substrate P is relatively flat, and the difference is small between the position of the surface of the substrate P in the first exposure area AR1 and the position of the surface of the substrate P in the second exposure area AR2. In this embodiment, even when the image plane and the surface of the substrate are not matched to each other in the first and second exposure areas AR1, AR2 respectively, the surface of the substrate is maintained within the depth of focus of the projection optical system PL.

According to this embodiment, the first image plane IS1 and the surface of the substrate P are successfully allowed to be in the predetermined positional relationship in the first exposure area AR1, and the second image plane IS2 and the surface of the substrate P are successfully allowed to be in the predetermined positional relationship in the second exposure area AR2 without performing the positional adjustment of the first image plane IS1 and the second image plane IS2. Further, it is possible to simplify or omit the Z driving mechanism 67 of the first and second substage-driving devices 65, 66 for performing the positional adjustment of the first and second image planes IS1, IS2.

Also in this embodiment, it is also allowable that the adjustment of the relative inclination between the image plane (IS1, IS2) and the surface of the substrate P (positional adjustment in the θX and θY directions) is performed in the first exposure area AR1 and the second exposure area AR2. In this embodiment, it is also allowable that the intermediate position CT of the position of the surface of the substrate is not matched to the first and second image planes IS1, IS2 in the first and second exposure areas AR1, AR2.

Fifth Embodiment

Figure 19:
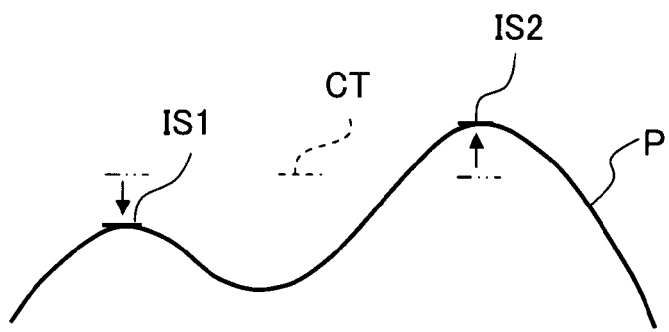
FIG. 19 illustrates an exemplary method for adjusting the surface positional relationship between the first and second image planes and the surface of the substrate according to a fifth embodiment.

The controller 30 can also perform the positional adjustment of the first image plane IS1 and the second image plane IS2 in addition to the positional adjustment of the surface of the substrate P so that the state shown in FIG. 19 is obtained from the state shown in FIG. 18B, i.e., the first image plane IS1 and the surface of the substrate P are matched to each other in the first exposure area AR1, and that the second image plane IS2 and the surface of the substrate P are matched to each other in the second exposure area AR2.

In the example shown in FIG. 19, the positions of the first image plane IS1 and the second image plane IS2 in the Z axis direction are adjusted respectively so that the first image plane IS1 is consistent in the first exposure area AR1, and the second image plane IS2 is consistent in the second exposure area AR2, in addition to the positional adjustment of the surface of the substrate P as explained in the fourth embodiment.

The controller 30 prepares the movement profiles in the Z axis direction of the first substage 62, the second substage 63, and the substrate stage 80 prior to the scanning exposure for the substrate P in the same manner as in the respective embodiments described above. The controller 30 determines the movement profiles in the Z axis direction of the first substage 62, the second substage 63, and the substrate table 80T respectively so that the surface of the substrate P and the first image plane IS1 are matched to each other in the first exposure area AR1, and the surface of the substrate P and the second image plane IS2 are matched to each other in the second exposure area AR2 during the scanning exposure for the shot area S of the substrate P.

Figure 11:
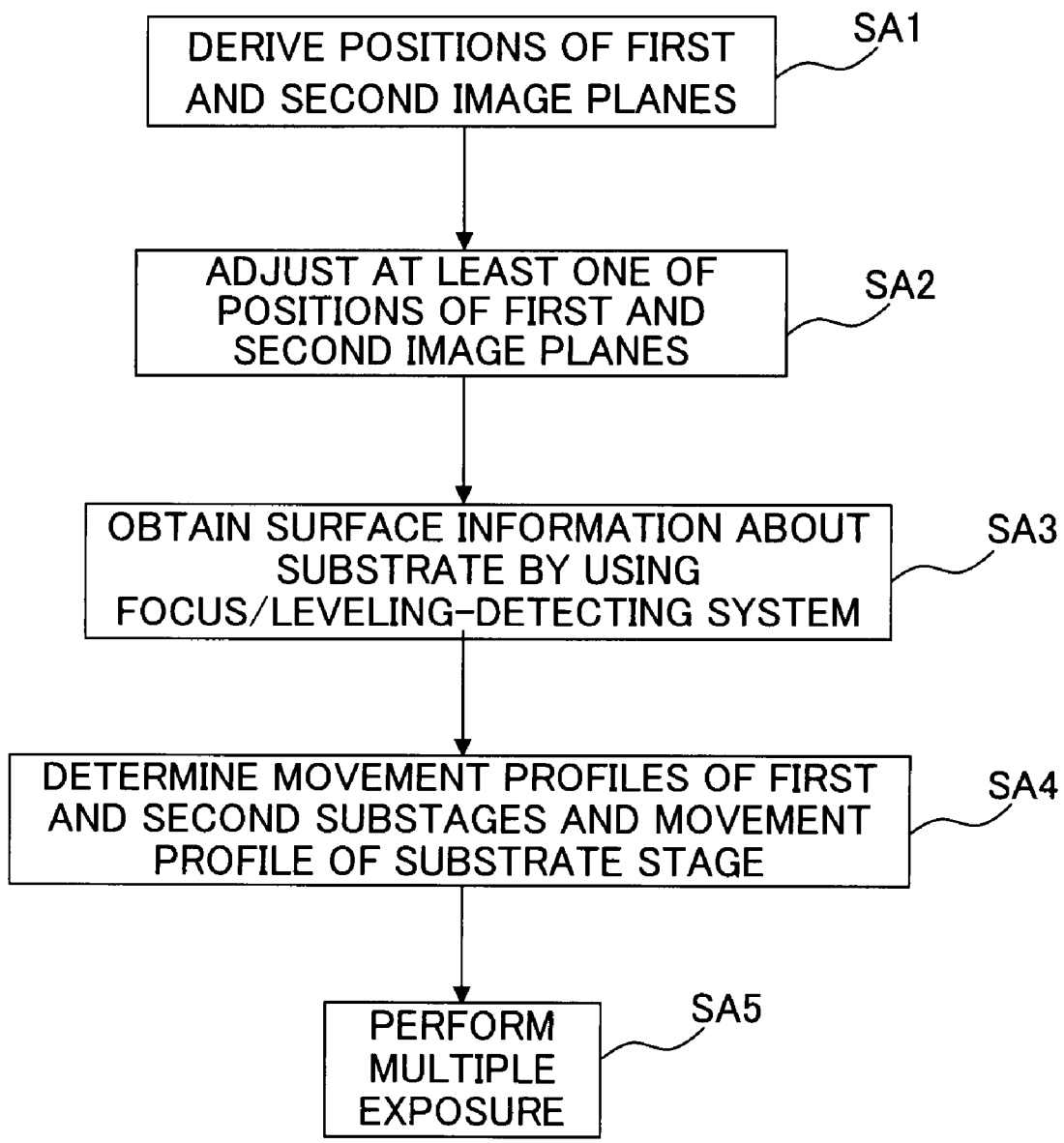
FIG. 11 shows a flow chart illustrating an exposure method according to the first embodiment.

In this embodiment, the first image plane IS1 and the second image plane IS2 are defined on a same plane after the initial adjustment (immediately after Step SA2 shown in FIG. 11 of the first embodiment). Therefore, the positional adjustment of the surface of the substrate P is performed as shown in FIG. 18B so that the intermediate position CT of the surface of the substrate P is matched to the first and second image planes IS1, IS2 which are substantially flush with each other as shown in FIG. 18A. Additionally, as shown in FIG. 19, the positional adjustment is performed for the first and second image planes IS1, IS2 respectively so that the first image plane IS1 is matched to the surface of the substrate P subjected to the positional adjustment as shown in FIG. 18B in the first exposure area AR1, and that the second image plane IS2 is matched to the surface of the substrate P subjected to the positional adjustment as shown in FIG. 18B in the second exposure area AR2. That is, the positional adjustment amounts of the first and second image planes IS1, IS2 moved from the state shown in FIG. 18B to the state shown in FIG. 19 are substantially equal to each other. That is, the controller 30 performs the positional adjustment of the surface of the substrate P so that the positional adjustment amount of the first image plane IS1 and the positional adjustment amount of the second image plane IS2 are substantially equal to each other in the positional adjustment from the state shown in FIG. 18A to the state shown in FIG. 18B.

As described above, the controller 30 can also perform the positional adjustment for the first image plane IS1, the second image plane IS2, and the surface of the substrate P respectively in both of the first exposure area AR1 and the second exposure area AR2. In this embodiment, the controller 30 performs the positional adjustment of the surface of the substrate P so that the error between the first image plane IS1 and the surface of the substrate P after the initial adjustment in the first exposure area AR1 is substantially same with the error between the second image plane IS2 and the surface of the substrate P after the initial adjustment in the second exposure area AR2. Accordingly, the positional adjustment amount of the first image plane IS1 is substantially equal to the positional adjustment amount of the second image plane IS2. By performing the positional adjustment for the first and second image planes IS1, IS2, the surface positional relationship between the first image plane IS1 and the surface of the substrate P can be in the desired state in the first exposure area AR1 and the surface positional relationship between the second image plane IS2 and the surface of the substrate P can be in the desired state in the second exposure area AR2.

Also in the fifth embodiment, it is possible to perform the adjustment of the relative inclination between the image plane (IS1, IS2) and the surface of the substrate P (positional adjustment in the θX and θY directions) in the first and second exposure areas AR1, AR2.

In the fifth embodiment, the positional adjustment amount of the first image plane IS1 may be different from the positional adjustment amount of the second image plane IS2. That is, in this embodiment, the positional relationship among the image plane IS1, the image plane IS2, and the surface of the substrate P can be appropriately adjusted so that the image planes (IS1, IS2) are matched to the surface of the substrate P in the first exposure area AR1 and the second exposure area AR2, respectively. Further, in the fifth embodiment, it is also allowable that the image plane and the surface of the substrate are not matched to each other in the first and second exposure areas AR1, AR2. That is, it is also enough that both the first and second image planes IS1, IS2 are merely allowed to approach the surface of the substrate than the state shown in FIG. 18B.

In the first to fifth embodiments described above, the first image plane IS1 and the second image plane IS2 are subjected to the positional adjustment so that the first image plane IS1 and the second image plane IS2 are formed in the substantially same plane in the initial adjustment (Step SA2 shown in FIG. 11 of the first embodiment). However, the adjustment may be made such that the first image plane IS1 and the second image plane IS2 are formed in mutually different planes. Alternatively, it is also allowable that the positional adjustment (Step SA2) is not performed for the first and second image planes IS1, IS2. That is, it is also allowable that the position in the Z axis direction differs between the first image plane IS1 and the second image plane IS2. In this case, as explained in Step SA1 shown in FIG. 10 of the first embodiment, the position information (including the inclination information) is measured for the first image plane IS1 and the second image plane IS2 respectively, and the positional relationship therebetween is known as well. Therefore, when the surface positional relationship between the first image plane IS1 and the second image plane IS2 is taken into consideration, it is possible to carry out the surface positional adjustment as explained in the first to fifth embodiments described above.

In the first to fifth embodiments described above, the first exposure area AR1 and the second exposure area AR2 are separated and away from each other in the Y axis direction. However, even when the first exposure area AR1 and the second exposure area AR2 are partially overlapped with each other in the Y axis direction, it is possible to carry out the surface positional adjustment as explained in the first to fifth embodiments described above. It is also enough that the exposure apparatus EX can execute only any one of all of the surface positional adjustment methods as explained in the first to fifth embodiments described above. Alternatively, it is also allowable to select any one of the plurality of surface positional adjustment methods depending on, for example, the surface information about the substrate P, the characteristic or feature of the pattern (for example, pattern line width, pattern pitch, pattern cluster degree, and the like), the exposure condition for the pattern (for example, dimension of the depth of focus and the like), and the like.

In the first to fifth embodiments described above, the controller 30 prepares the movement profiles of the first substage 62, the second substage 63, and the substrate stage 80 respectively prior to the scanning exposure for the substrate P. However, it is also allowable that the movement profile is not prepared for a stage among the stages which does not perform the surface positional adjustment operation in at least one of the directions of the Z axis direction, the θX direction, and the θY direction (for example, the second substage 63 in the first embodiment). It is also possible to omit the driving mechanism for the stage which does not perform the surface positional adjustment operation. The method for adjusting at least one of the positions of the first and second image planes IS1, IS2 is not limited to the positional adjustment of the mask. It is also allowable to use any other method including, for example, the adjustment of the imaging characteristic of the projection optical system PL or the like, instead of the positional adjustment of the mask or in combination with the positional adjustment of the mask.

Sixth Embodiment

The sixth embodiment will be explained. In the respective embodiments described above, the focus/leveling-detecting system 130, which is capable of obtaining the surface information about the substrate P, is arranged separately and away from the projection optical system PL. However, the feature of this embodiment is that a focus/leveling-detecting system 130' obtains the surface information about the substrate P on the side of the image plane of the projection optical system PL, i.e., in the vicinity of the first and second exposure areas AR1, AR2. In this embodiment, the focus/leveling-detecting system 130' is constructed in substantially the same manner as the focus/leveling-detecting system 130 described above. In the following description, the constitutive parts or components, which are the same as or equivalent to those of the embodiment described above, are designated by the same reference numerals, any explanation of which will be simplified or omitted.

Figure 20:
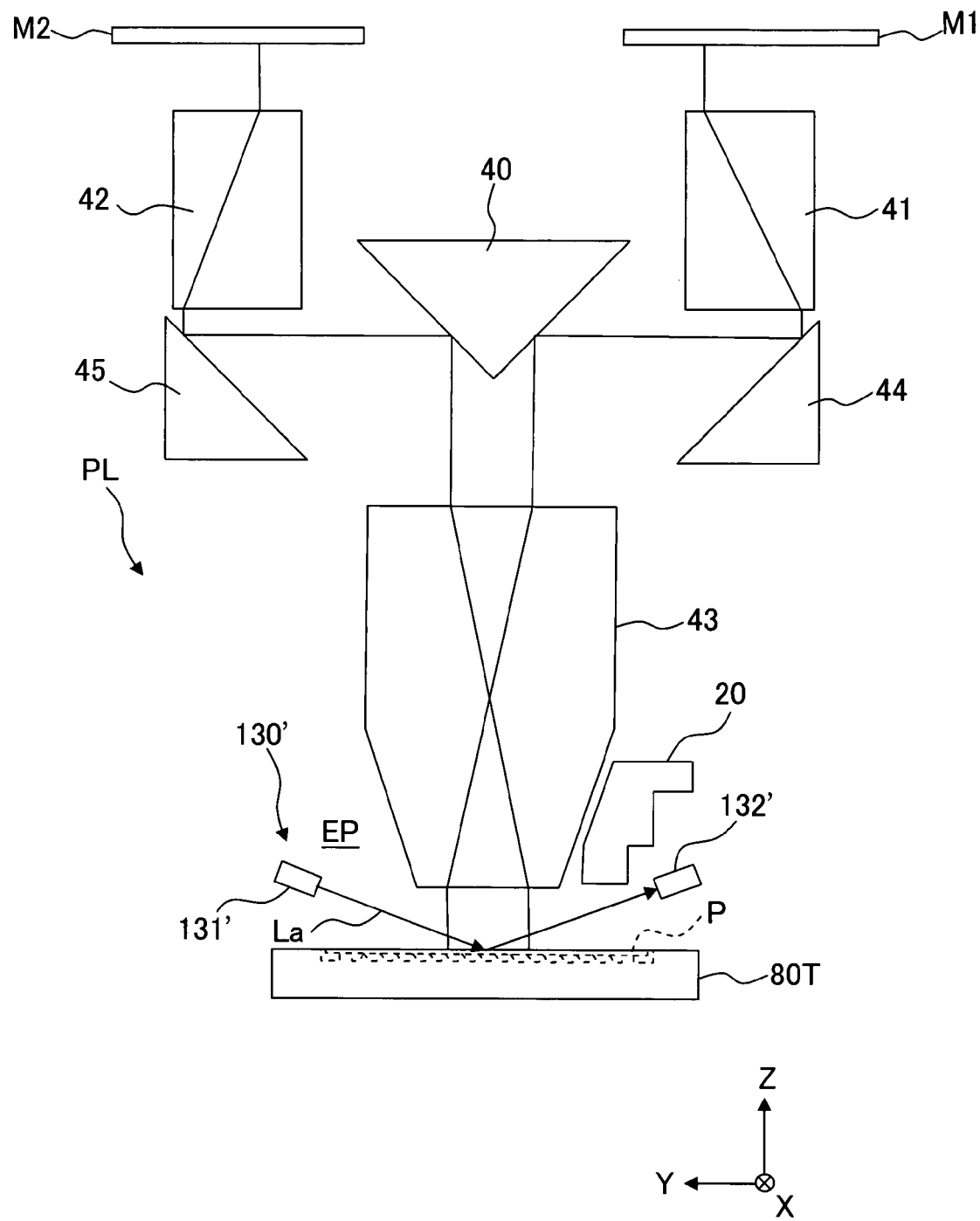
FIG. 20 shows an exposure apparatus according to a sixth embodiment.

FIG. 20 shows a schematic arrangement view illustrating an exposure apparatus EX according to the sixth embodiment. As shown in FIG. 20, the focus/leveling-detecting system 130' has a plurality of detection points which are arranged in a predetermined range including the exposure process position EP disposed just below the projection optical system PL. In this embodiment, the controller 30 performs the multiple exposure for the shot area S of the substrate P while obtaining the surface information about the substrate P by using the focus/leveling-detecting system 130'.

Figure 21:
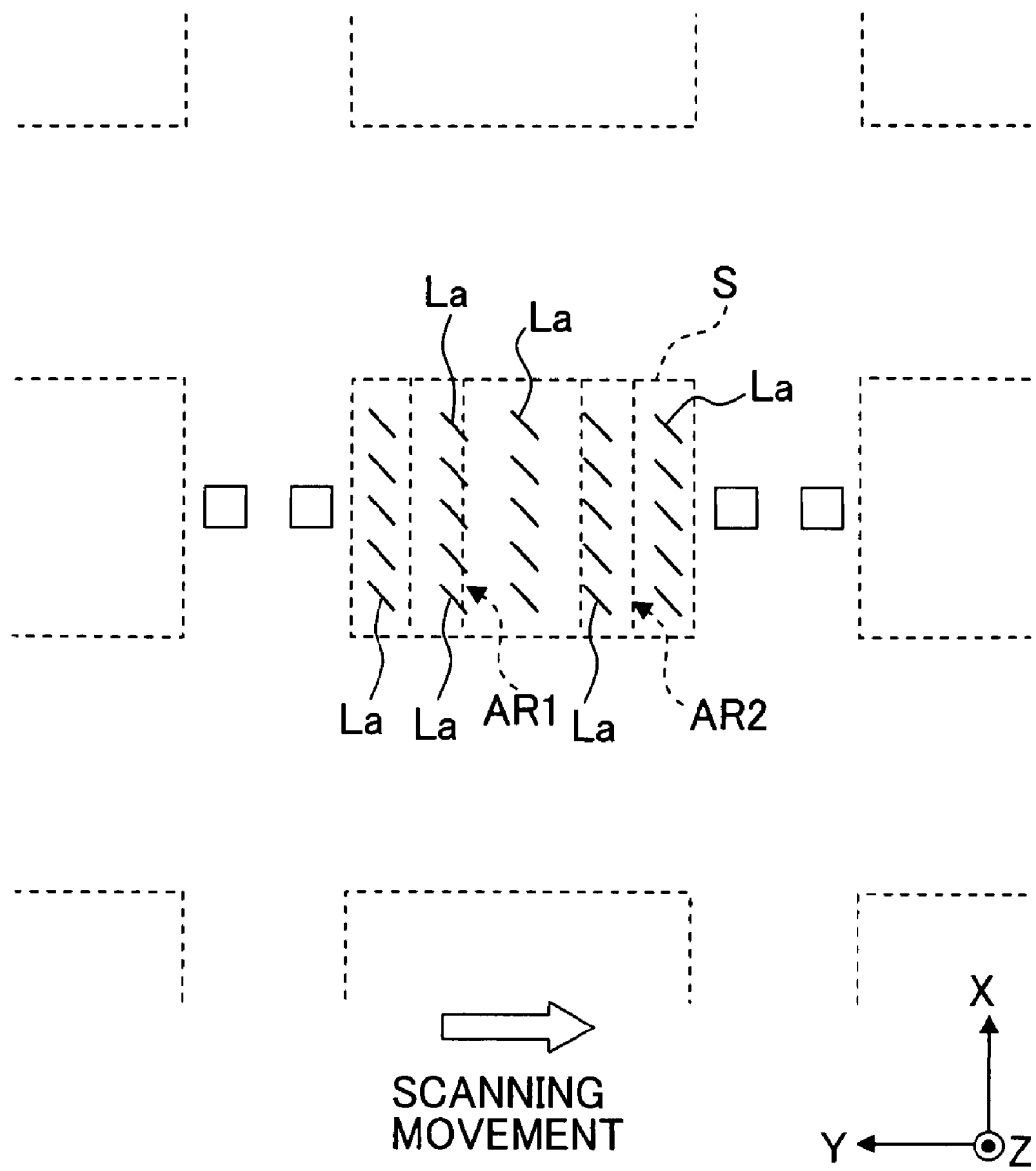
FIG. 21 schematically shows the relationship between the first and second exposure areas and radiation positions of a detecting light beam of a focus/leveling-detecting system according to the sixth embodiment.

FIG. 21 schematically shows the relationship between the radiation positions (detection points) of the detecting light beam La of the focus/leveling-detecting system 130' and the first and second exposure areas AR1, AR2. FIG. 21 shows a state in which the first and second exposure areas AR1, AR2 are set on the shot area S. A light-emitting system 131' of the focus/leveling-detecting system 130' radiates the detecting light beam La onto the plurality of positions on the substrate P respectively. The light-emitting system 131' radiates the detecting light beam La onto the substantially entire region of the shot area S. The light-emitting system 131' also radiates the detecting light beam La onto the inner portions of the first and second exposure areas AR1, AR2 respectively.

As described above, the focus/leveling-detecting system 130' radiates the detecting light beam La onto the substantially entire region of the shot area S of the substrate P. The focus/leveling-detecting system 130' can determine the surface information about the shot area S on the basis of the light-receiving result. The focus/leveling-detecting system 130' of this embodiment outputs the positional relationship between the surface of the substrate P irradiated with the detecting light beam La and the first image plane IS1 after the initial adjustment (after Step SA2 shown in FIG. 11) (information about the positional deviation of the surface of the substrate P with respect to the first image plane IS1).

The controller 30 can obtain the surface information about the substrate P by using the focus/leveling-detecting system 130' concurrently with the multiple exposure operation for the substrate P. Further, the controller 30 can perform the multiple exposure while adjusting the surface positional relationship among the first image plane IS1, the second image plane IS2, and the surface of the substrate P on the basis of the detection result of the focus/leveling-detecting system 130'.

In this embodiment, the focus/leveling-detecting system 130' obtains the surface information about the substrate P concurrently with the multiple exposure operation for the substrate P. However, the surface information about the entire surface of the substrate P may be obtained before starting the multiple exposure operation for the substrate P. In this case, the positional relationship among the first image plane IS1, the second image plane IS2, and the surface of the substrate P may be adjusted in the same manner as in the respective embodiments described above. In this embodiment, the detection points of the focus/leveling-detecting system 130' are arranged over the range which is approximately equivalent to the size of the shot area S. However, it is also allowable that the range, in which the detection points are arranged, is narrower than the case shown in FIG. 21, and/or the number of detection points is decreased. For example, it is also allowable that a plurality of detection points are arranged in only the inner portions of the first and second exposure areas AR1, AR2.

Seventh Embodiment

Figure 22:
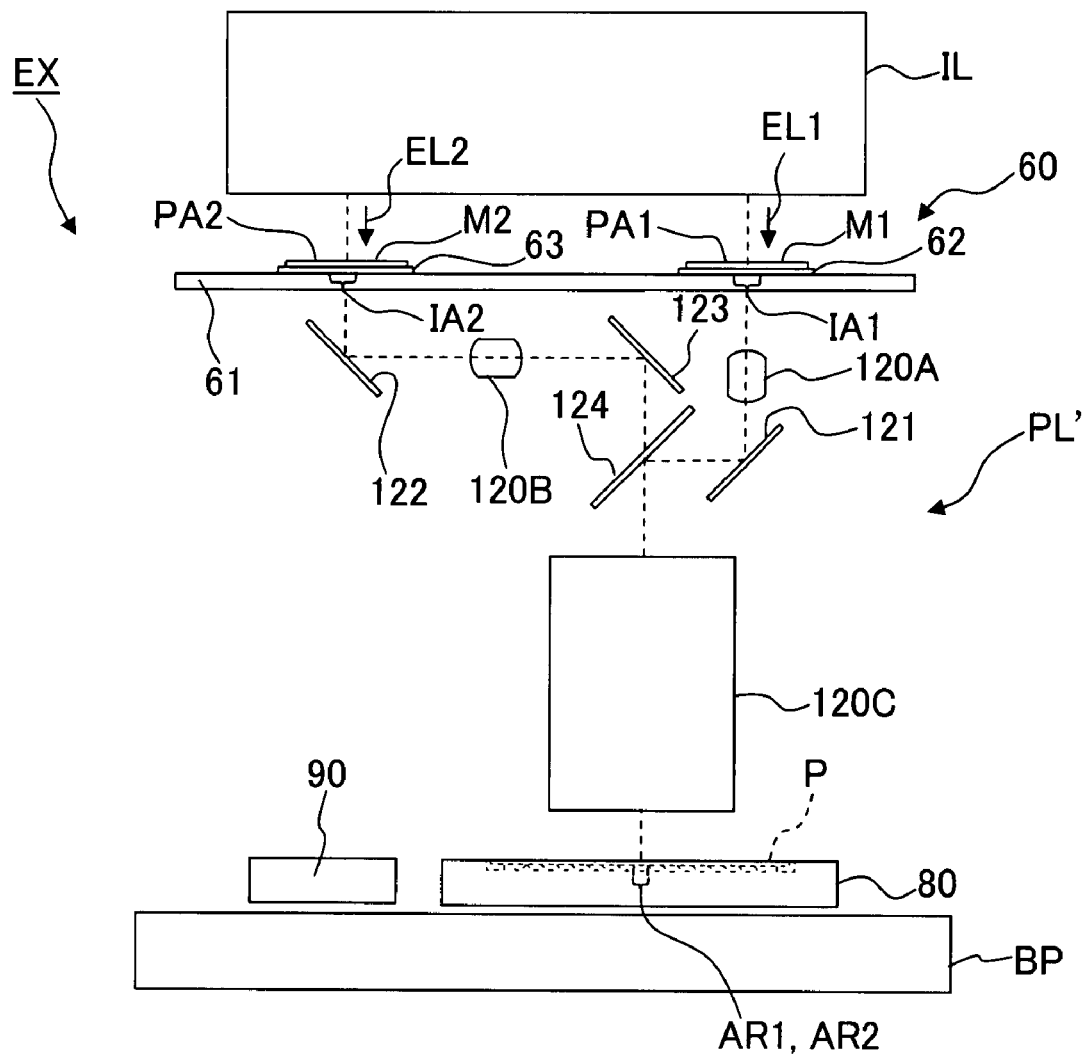
FIG. 22 shows an exposure apparatus according to a seventh embodiment.

The seventh embodiment will be explained. FIG. 22 shows a schematic arrangement view illustrating an exposure apparatus EX according to this embodiment. The feature of this embodiment, which is different from those of the respective embodiments described above, is that the first exposure area AR1 is overlapped at least partially with the second exposure area AR2 (is overlapped at least a part of the second exposure area AR2). Specifically, in this embodiment, the setting is made such that the first exposure area AR1 and the second exposure area AR2 are set to be overlapped with each other at a same position. In the following description, the constitutive parts or components, which are the same as or equivalent to those of the embodiment described above, are designated by the same reference numerals, any explanation of which will be simplified or omitted.

Also in this embodiment, the controller 30 illuminates the first pattern PA1 and the second pattern PA2 with the first exposure light beam EL1 and the second exposure light beam EL2 from the illumination system IL respectively while moving the first mask M1 and the second mask M2 in the same scanning direction (for example, in the +Y direction) by using the mask stage 60 which has the main stage 61. The controller 30 performs the scanning exposure for the shot area S on the substrate P by moving the substrate stage 80 which holds the substrate P in the Y axis direction in synchronization with the movement of the first mask M1 and the second mask M2 in the Y axis direction. The shot area S on the substrate P is subjected to the multiple exposure (double exposure) with the image of the first pattern PA1 formed with the first exposure light beam EL1 radiated onto the first exposure area AR1 and the image of the second pattern PA2 formed with the second exposure light beam EL2 radiated onto the second exposure area AR2.

The projection optical system PL' of this embodiment is provided with a beam splitter 124 into which the first exposure light beam EL1 from the first mask M1 and the second exposure light beam EL2 from the second mask M2 are allowed to come. The projection optical system PL' includes a first imaging optical system 120A which is provided on an optical path for the first exposure light beam EL1 between the first mask M1 and the beam splitter 124, a second imaging optical system 120B which is provided on an optical path for the second exposure light beam EL2 between the second mask M2 and the beam splitter 124, and an optical system 120C which is arranged between the beam splitter 124 and the substrate P. The first and second imaging optical systems 120A, 120B of this embodiment are 1× magnification imaging optical systems. Each of the first and second imaging optical systems 120A, 120B has the function to invert the image of the object once.

The first imaging optical system 120A and a first reflecting mirror 121 are provided between the first mask M1 and the beam splitter 124. The first exposure light beam EL1 from the first mask M1 passes through the first imaging optical system 120A, and then the first exposure light beam EL1 comes into the beam splitter 124 via the first reflecting mirror 121. A second reflecting mirror 122, the second imaging optical system 120B, and a third reflecting mirror 123 are provided between the second mask M2 and the beam splitter 124. The second exposure light beam EL2 from the second mask M2 is reflected by the second reflecting mirror 122, and then passes through the second imaging optical system 120B. Afterwards, the second exposure light beam EL2 is reflected by the third reflecting mirror 123, and then comes into the beam splitter 124. The first exposure light beam EL1 and the second exposure light beam EL2, which are allowed to come into the beam splitter 124, come into the optical system 120C via the beam splitter 124.

In this embodiment, the image of the first pattern PA1 is inverted once by the first imaging optical system 120A between the first mask M1 and the beam splitter 124. In this embodiment, the optical system 120C inverts the image of the object once. Therefore, the image of the first pattern PA1 is inverted twice (even number of times) between the first mask M1 and the first exposure area AR1. The image of the second pattern PA2 is inverted once by the second imaging optical system 120B between the second mask M2 and the beam splitter 120C. Therefore, the image of the second pattern PA2 is inverted twice (even number of times) between the second mask M2 and the second exposure area AR2.

As described above, in the projection optical system PL' of this embodiment, the image of the first pattern PA1 is inverted an even number of times between the first mask M1 and the first exposure area AR1, and the image of the second pattern PA2 is inverted an even number of times between the second mask M2 and the second exposure area AR2. Therefore, even when the first pattern PA1 and the second pattern PA2 are illuminated with the first exposure light beam EL1 and the second exposure light beam EL2 respectively while moving the first mask M1 and the second mask M2 in the same scanning direction (for example, in the +Y direction), desired images of the first and second patterns PA1, PA2 can be projected onto the shot area S on the substrate P.

Figure 23:
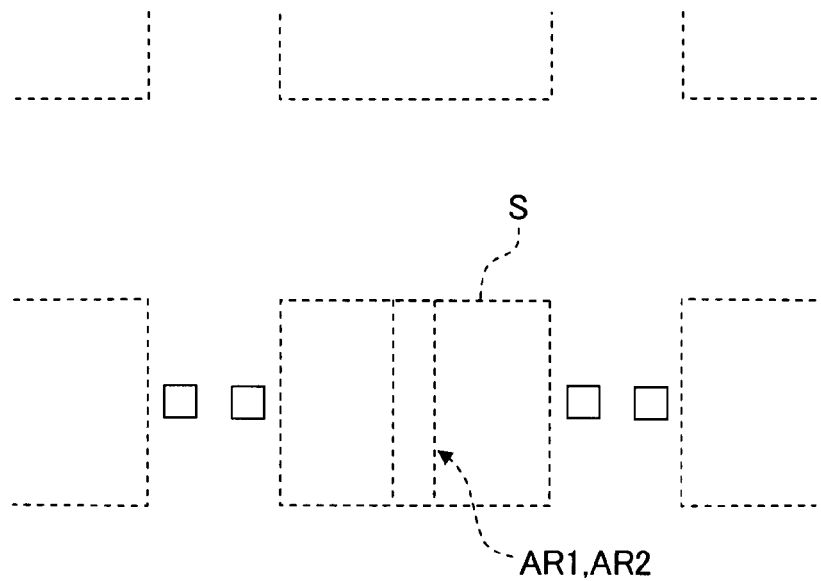
FIG. 23 schematically shows the relationship between a shot area of the substrate and the first and second exposure areas according to the seventh embodiment.

FIG. 23 shows the positional relationship among the first exposure area AR1, the second exposure area AR2, and the shot area S according to the seventh embodiment. As shown in FIG. 23, in this embodiment, the setting is made such that the first exposure area AR1 and the second exposure area AR2 are set to be overlapped with each other at a same position.

Also in this embodiment, the operation, in which the position of the first image plane IS1 and the position of the second image plane IS2 are measured by using the spatial image-measuring instrument 162, is executed before starting the exposure operation for the substrate P. When the position of the first image plane IS1 is measured by using the spatial image-measuring instrument 162, the controller 30 arranges the aperture 161 on the measuring stage 90 in the first exposure area AR1, and the controller 30 detects the spatial image of the measuring mark of the first mask M1 arranged in the first illumination area IA1 with the spatial image-measuring instrument 162 to measure the position of the first image plane IS1, in the same manner as in the embodiment described above. In this embodiment, the first exposure area AR1 and the second exposure area AR2 are overlapped with each other. When the position of the first image plane IS1 is measured, the radiation of the second exposure light beam EL2 is stopped. When the position of the second image plane IS2 is measured by using the spatial image-measuring instrument 162, the controller 30 arranges the aperture 161 on the measuring stage 90 in the second exposure area AR2, and the controller 30 detects the spatial image of the measuring mark of the second mask M2 arranged in the second illumination area IA2 with the spatial image-measuring instrument 162 to measure the position of the second image plane IS2, in the same manner as in the embodiment described above. When the position of the second image plane IS2 is measured, the radiation of the first exposure light beam EL1 is stopped.

Also in this embodiment, the controller 30 starts the exposure for the substrate P after allowing the position of the first image plane IS1 and the position of the second image plane IS2 to be matched to each other on the basis of the measurement result of the spatial image-measuring instrument 162. In order to allow the position of the first image plane IS1 and the position of the second image plane IS2 to be matched to each other, for example, it is allowable to adjust at least one of the positions of the first pattern formation surface K1 and the second pattern formation surface K2. In this case, for example, it is also allowable to use the optical adjustment of the projection optical system PL' and/or the adjustment of the wavelength of the exposure light beam, instead of or in combination with the positional adjustment of at least one of the first pattern formation surface K1 and the second pattern formation surface K2.

The controller 30 performs the exposure for the substrate P while maintaining the adjusted surface positions of the first pattern formation surface K1 and the second pattern formation surface K2 so that the first and second image planes IS1, IS2 are not moved. By doing so, it is unnecessary to move the first and second masks M1, M2 during the exposure for the substrate P; and the first and second image planes IS1, IS2 and the surface of the substrate P can be adjusted to be in the desired positional relationship only by moving the substrate table 80T.

A part or parts of the optical elements of the projection optical system PL' may be moved so that the first image plane IS1 and the second image plane IS2 are formed in the substantially same plane.

In the respective embodiments described above, the position information about the first image plane IS1 and the second image plane IS2 is obtained by detecting the spatial image of the measuring marks provided for the first and second masks M1, M2 by using the spatial image-measuring instrument 162. However, the reference marks provided for the mask stage 60 may be arranged in the first and second illumination areas IA1, IA2, and the spatial images thereof may be detected with the spatial image-measuring instrument 162. The mask stage provided with the reference mark is disclosed, for example, in Japanese Patent Application Laid-open Nos. 8-78313 and 8-78314 (each corresponding to U.S. Pat. No. 6,018,384) and Japanese Patent Application Laid-open No. 8-227847 (corresponding to U.S. Pat. No. 6,169,602).

Eighth Embodiment

The eighth embodiment will be explained. The feature of the exposure apparatus EX of this embodiment is that a surface detecting system capable of obtaining the surface information about a pattern formation surface of the mask is provided as disclosed, for example, in Japanese Patent Application Laid-open No. 11-45846 (corresponding to U.S. Pat. No. 6,549,271). In the following description, the constitutive parts or components, which are the same as or equivalent to those of the embodiment described above, are designated by the same reference numerals, any explanation of which will be simplified or omitted.

Figure 24:
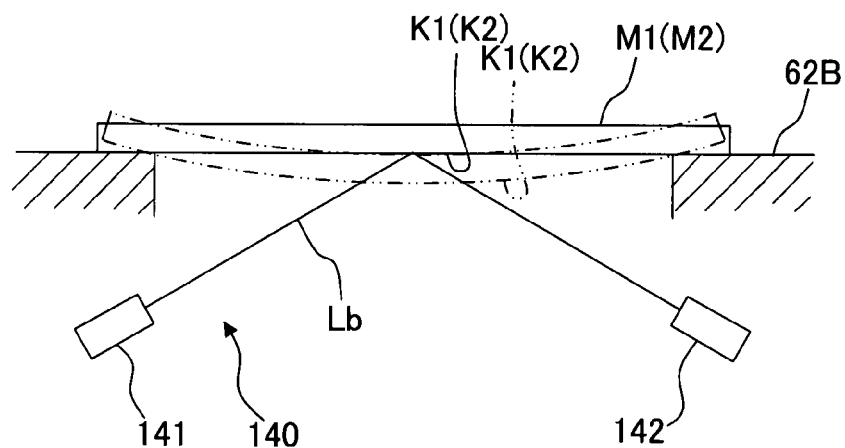
FIG. 24 shows an exposure apparatus according to an eighth embodiment.

FIG. 24 shows schematically shows main components of the exposure apparatus EX according to the eighth embodiment. As shown in FIG. 24, the exposure apparatus EX according to this embodiment includes a surface detecting system 140 which is capable obtaining the surface information about the first and second pattern formation surfaces K1, K2 of the first and second masks M1, M2. The surface detecting system 140 includes a light-emitting system 141 which radiates a detecting light beam Lb onto the first and second pattern formation surfaces K1, K2, and a light-receiving system 142 which is capable of receiving the reflected light beam of the detecting light beam Lb radiated from the light-emitting system 141 onto the first and second pattern formation surfaces K1, K2. The surface detecting system 140 is capable of determining the surface information about the first and second pattern formation surfaces K1, K2 on the basis of the light-receiving result of the light-receiving system 142. The surface information about the first and second pattern formation surfaces K1, K2 includes the position information about the first and second pattern formation surfaces K1, K2 (position information in the Z axis, θX, and θY directions) and an information about the shapes of the first and second pattern formation surfaces K1, K2 (irregularity or unevenness information).

For example, when the spatial image-measuring instrument 162 measures the position of the first image plane IS1 on the basis of the first exposure light beam EL1 from the measuring mark of the first pattern formation surface K1, the controller 30 can determine the position of the first image plane IS1 corresponding to each of the positions of the first pattern formation surface K1 on the basis of the measurement result of the spatial image-measuring instrument 162 and the detection result of the surface detecting system 140. That is, as indicated by broken lines shown in FIG. 24, when any warpage appears on the first pattern formation surface K1, the position of the first image plane IS1 formed by the first exposure light beam EL1 allowed to pass through the central area of the first pattern formation surface K1 is different from the position of the first image plane IS1 formed by the first exposure light beam EL1 allowed to pass through the circumferential edge area (for example, the area in which the measuring mark is formed) of the first pattern formation surface K1. Even when the spatial image-measuring instrument 162 measures the position of the first image plane IS1 on the basis of the first exposure light beam EL1 allowed to pass through the circumferential edge area of the first pattern formation surface K1, the controller 30 can determine the position of the first image plane IS1 formed by the first exposure light beam EL1 allowed to pass through the central area of the first pattern formation surface K1 on the basis of the measurement result of the spatial image-measuring instrument 162 and the detection result of the surface detecting system 140.

In the first to seventh embodiments described above, the positional relationship between the image plane (IS1 and/or IS2) and the surface of the substrate P can be adjusted highly accurately in the exposure area (AR1 and/or AR2) by adjusting at least one of the first image plane IS1, the second image plane IS2, and the surface of the substrate P while considering the detection result of the surface detecting system 140 as well.

When the surface information about the first and second pattern formation surfaces K1, K2 can be measured during the exposure for the substrate P by using the surface detecting system 140, the surface detecting system 140 may be used instead of the Z measuring device 70A described above. The surface detecting system 140 is not limited to the structure shown in FIG. 24.

Ninth Embodiment

The ninth embodiment will be explained. The feature of this embodiment is that a liquid immersion area of a liquid is formed on the substrate P, and the first exposure light beam EL1 and the second exposure light beam EL2 are radiated through the liquid of the liquid immersion area onto the shot area S on the substrate P. In the following description, the constitutive parts of components, which are the same as or equivalent to those of the embodiment described above, are designated by the same reference numerals, any explanation of which will be simplified or omitted.

Figure 25:
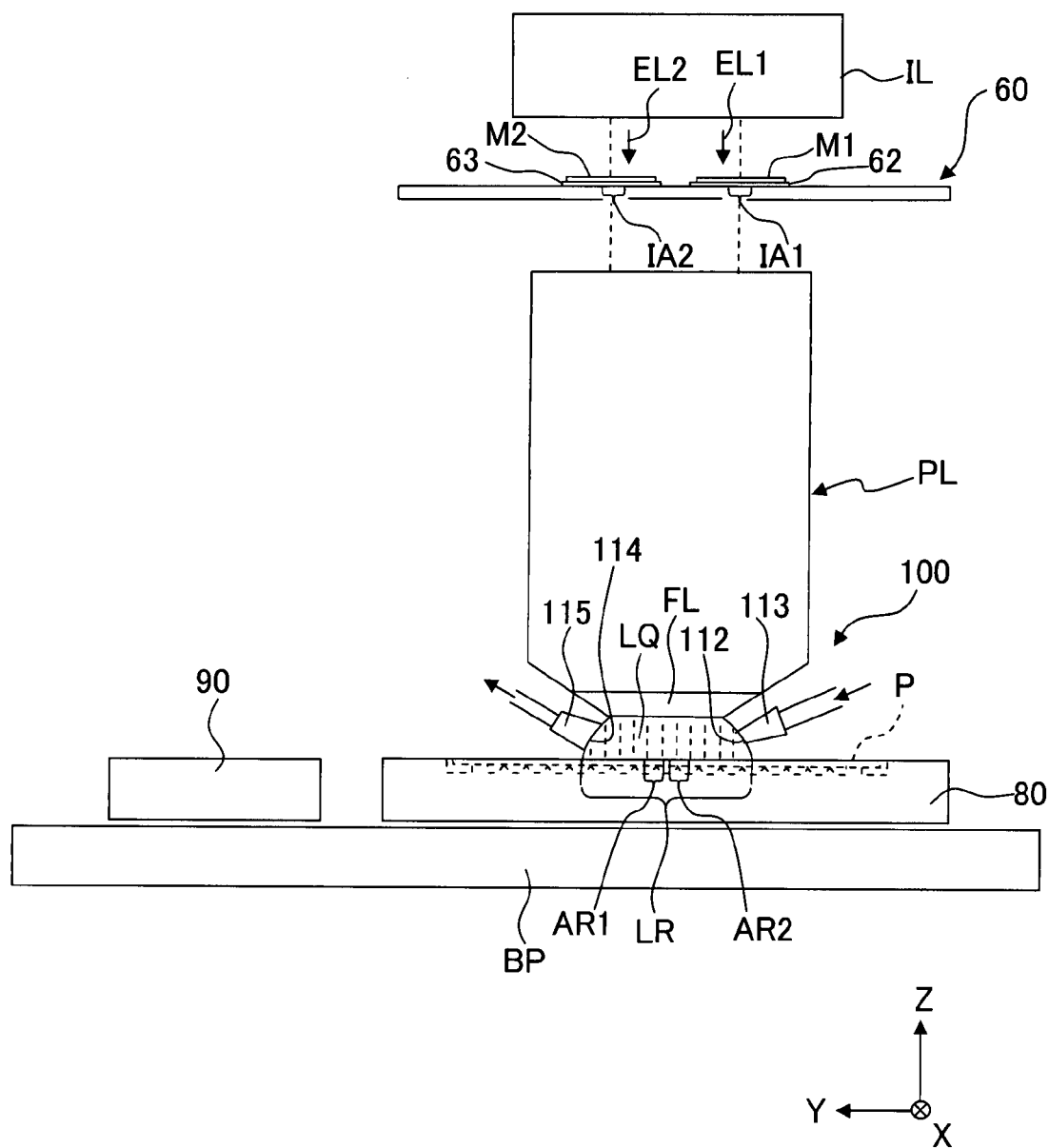
FIG. 25 shows an exposure apparatus according to a ninth embodiment.

FIG. 25 shows a schematic arrangement view illustrating the ninth embodiment. The exposure apparatus EX of this embodiment is an exposure apparatus to which the liquid immersion method is applied in order that the exposure wavelength is substantially shortened to improve the resolution and the depth of focus is substantially widened, as disclosed, for example, in International Publication No. 99/49504, Japanese Patent Application Laid-open No. 2004-289126 (corresponding to United States Patent Application Publication No. 2004/0165159), and the like. The exposure apparatus EX includes a liquid immersion system 100 for forming the liquid immersion area LR of the liquid LQ on the substrate P. In this embodiment, water (pure or purified water) is used as the liquid LQ. A top coat film or the like, which protects the photosensitive material and the base material from the liquid LQ, can be provided on the substrate P.

The liquid immersion system 100 includes a supply member 113 having a supply port 112 for supplying the liquid LQ to an optical path and a recovery member 115 having a recovery port 114 for recovering the liquid LQ which are provided in the vicinity of the optical path, the optical path being for the first and second exposure light beams EL1, EL2 between the substrate P and a final optical element FL closest to the image plane of the projection optical system PL among a plurality of optical elements of the projection optical system PL. A liquid supply device (not shown), which is capable of feeding out the liquid LQ, is connected to the supply member 113. The liquid supply device is capable of supplying the liquid LQ which is clean and temperature-adjusted to the optical path via the supply port 112. A liquid recovery device (not shown), which includes, for example, a vacuum system and the like, is connected to the recovery member 115. The liquid recovery device is capable of recovering, via the recovery port 114, the liquid LQ which fills the optical path. The operations of the liquid supply device and the liquid recovery device are controlled by the controller 30. The controller 30 controls the liquid immersion system 100 to concurrently perform the liquid supply operation by the liquid supply device and the liquid recovery operation by the liquid recovery device, to thereby form the liquid immersion area LR of the liquid LQ locally on a part of the substrate P so that the optical path for the first and second exposure light beams EL1, EL2, which is disposed between the lower surface (light-exit surface) of the final optical element FL of the projection optical system PL and the surface of the substrate P on the substrate stage 80, is filled with the liquid LQ. The liquid immersion area LR is formed to be larger than the first exposure area AR1 and the second exposure area AR2 on the substrate P. That is, the liquid immersion area LR is formed so that all of the first exposure area AR1 and the second exposure area AR2 are covered therewith. It is not necessarily indispensable that a part or parts of the liquid immersion system 100 (for example, any member for constructing the liquid supply device and/or the liquid recovery device) are provided for the exposure light beam EL. For example, any equipment of the factory or the like in which the exposure apparatus is installed may be used in place thereof. The structure of the liquid immersion system 100 is not limited to the structure described above. It is possible to use those disclosed, for example, in European Patent Publication No. 1420298, International Publication No. 2004/055803, International Publication No. 2004/057590, International Publication No. 2005/029559 (corresponding to United States Patent Application Publication No. 2006/0231206), International Publication No. 2004/086468 (corresponding to United States Patent Application Publication No. 2005/0280791), and Japanese Patent Application Laid-open No. 2004-289126 (corresponding to U.S. Pat. No. 6,952,253). The contents of, for example, United States Patent documents and the like are incorporated herein by reference within a range of permission of the domestic laws and ordinances of the designated or selected state, in relation to the liquid immersion mechanism of the liquid immersion exposure apparatus and the attached equipment thereof.

The exposure apparatus EX forms the liquid immersion area LR of the liquid LQ on the substrate P held by the substrate stage 80. The first and second exposure light beams EL1, EL2 are radiated onto the first and second exposure areas AR1, AR2 on the substrate P respectively through the liquid LQ of the liquid immersion area LR to expose the substrate P with the first and second exposure light beams EL1, EL2.

The exposure apparatus EX radiates the first and second exposure light beams EL1, EL2 onto the first and second exposure areas AR1, AR2 respectively while moving the shot area S on the substrate P in the Y axis direction with respect to the first and second exposure areas AR1, AR2 in the state in which the liquid immersion area LR is formed. Accordingly, the shot area S on the substrate P is subjected to the multiple exposure (double exposure) with the image of the first pattern PA1 formed with the first exposure light beam EL1 radiated onto the first exposure area AR1 through the liquid LQ and the image of the second pattern PA2 formed with the second exposure light beam EL2 radiated onto the second exposure area AR2 through the liquid LQ.

FIG. 26 schematically illustrates an example of the operations of the substrate stage 80 and the measuring stage 90. As shown in FIG. 26, the substrate stage 80 and the measuring stage 90 are movable on the side of the image plane of the projection optical system PL. The liquid immersion area LR, which is formed by the liquid immersion system 100, can be moved by the controller 30 between the upper surface of the substrate stage 80 and the upper surface of the measuring stage 90 by moving the substrate stage 80 and the measuring stage 90 in the X axis direction and/or the Y axis direction together in a state in which the upper surface of the substrate stage 80 and the upper surface of the measuring stage 90 are allowed to make approach to each other or make contact with each other in a predetermined area including a position disposed just under or below the projection optical system PL. For example, when the positions of the first and second image planes IS1, IS2 are measured by using the spatial image-measuring instrument 162, the liquid immersion area LR is moved to a position on the measuring stage 90. The controller 30 performs the measuring operation by the spatial image-measuring instrument 162 in a state in which the liquid immersion area LR is formed to cover the aperture 161. The spatial image-measuring instrument 162 can measure the positions of the first and second image planes IS1, IS2 formed via the projection optical system PL and the liquid LQ by measuring the spatial image via the projection optical system PL and the liquid LQ. When the substrate P is subjected to the liquid immersion exposure, the liquid immersion area LR is moved to a position on the substrate stage 80.

In this embodiment, water (pure or purified water) is used as the liquid LQ. However, it is also allowable to use liquids other than water as the liquid LQ. For example, when the exposure light beam EL is the $F_2$ laser beam, the $F_2$ laser beam is not transmitted through water. Therefore, the liquid LQ may be, for example, a fluorine-based fluid such as fluorine-based oil and perfluoropolyether (PFPE). Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL.

The liquid LQ, which has the refractive index (for example, not less than 1.5) higher than that of pure water, includes, for example, predetermined liquids having the C—H bond or the O—H bond such as isopropanol having a refractive index of about 1.50 and glycerol (glycerin) having a refractive index of about 1.61; predetermined liquids (organic solvents) such as hexane, heptane, decane and the like; decalin (decahydronaphthalene) having a refractive index of about 1.60; and the like. As for the liquid LQ, it is also allowable to use liquids obtained by mixing arbitrary two or more liquids of the foregoing liquids and liquids obtained by adding (mixing) at least one of the foregoing liquid or liquids to (with) pure or purified water. Further, as for the liquid LQ, it is also allowable to use liquids obtained by adding (mixing) base or acid such as $H^+$, $Cs^+$, $K^+$, $Cl^-$, $SO_4^{2-}$, $PO_4^{2-}$ and the like to (with) pure or purified water, and it is also allowable to use liquids obtained by adding (mixing) fine particles of Al oxide or the like to (with) pure or purified water. As for the liquid LQ, it is preferable to use liquids which have the small coefficients of light absorption, which have the small temperature dependency, and which are stable against the photosensitive material (or, for example, top coat film or antireflection film) coated on the surface of the substrate P and/or the projection systems PL, PL'. As for the liquid LQ, it is also allowable to use liquids having refractive indexes higher than that of water with respect to the exposure light beam EL, for example, liquids having refractive indexes of about 1.6 to 1.8. As for the liquid LQ, it is also possible to use supercritical fluids.

The final optical element FL of the projection optical system PL may be formed of silica glass (silica), or single crystal materials of fluorine compounds such as calcium fluoride, barium fluoride, strontium fluoride, lithium fluoride, sodium fluoride, and the like. Alternatively, the final optical element FL may be formed of a material having a refractive index (for example, not less than 1.6) higher than those of silica glass and calcium fluoride. Materials usable as the material having the refractive index of not less than 1.6 include, for example, sapphire and germanium dioxide as disclosed, for example, in International Publication No. 2005/059617, and potassium chloride (refractive index: about 1.75) as disclosed in International Publication No. 2005/059618.

In the projection optical system PL, a refractive index $n_1$ of the final optical element FL with respect to the exposure light beam EL may be smaller than a refractive index $n_2$ of the liquid LQ with respect to the exposure light beam (EL1, EL2). For example, the final optical element FL is formed of silica glass (refractive index: about 1.5), and the liquid LQ to be used has the refractive index $n_2$ which is higher (for example, about 1.6 to 1.8) than that of silica glass. Alternatively, in the projection optical system PL, the refractive index $n_1$ of the final optical element FL may be larger than the refractive index $n_2$ of the liquid LQ. For example, the final optical element FL is formed of a material having a refractive index of not less than 1.6, and the liquid LQ to be used has the refractive index $n_2$ which is higher than that of pure water and which is smaller than that of the final optical element FL. In this case, it is preferable that the refractive index $n_2$ of the liquid LQ, which is smaller than the refractive index $n_1$ of the final optical element FL, is larger than the numerical aperture NA of the projection optical system.

In the projection optical system of this embodiment, an optical path, which is disposed on the side of the object plane of the final optical element, may be also filled with the liquid, in addition to the optical path which is disposed on the side of the image plane of the final optical element, as disclosed, for example, in International Publication No. 2004/019128 (corresponding to United States Patent Application Publication No. 2005/0248856). It is also allowable that a thin film, which has the liquid-attractive property and/or the anti-dissolution function, may be formed on a part (including at least a contact surface with the liquid LQ) or all of the surface of the final optical element. Silica glass has a high affinity for the liquid LQ, for which any anti-dissolution film is unnecessary as well. However, it is preferable to form at least any anti-dissolution film for calcium fluoride.

In this embodiment, the first exposure area AR1 and the second exposure area AR2 are covered with one liquid immersion area LR. However, the first exposure area AR1 and the second exposure area AR2 may be covered with distinct (separate) liquid immersion areas respectively. In this case, a liquid of the first liquid immersion area which covers the first exposure area AR1 may be the same as or different from a liquid of the second liquid immersion area which covers the second exposure area AR2 in relation to terms of the type (physical property) thereof. For example, the first and second liquid immersion areas may be formed with liquids of different types (at least having mutually different refractive indexes with respect to the exposure light beam EL) respectively. For example, one of the first and second liquid immersion areas may be formed with water (pure or purified water), and the other of the liquid immersion areas may be formed with any liquid having a refractive index with respect to the exposure light beam higher than that of water (refractive index: about 1.44). At least one of the viscosity of the liquid LQ, the transmittance for the exposure light beam, and the temperature may mutually differ between the first liquid immersion area and the second liquid immersion area.

In the first to ninth embodiments described above, at least one of the positions of the first image plane IS1 and the second image plane IS2 is adjusted by adjusting at least one of the positions of the first pattern formation surface K1 on which the first pattern PA1 is formed and the second pattern formation surface K2 on which the second pattern PA2 is formed. However, it is also allowable to adjust at least one of the positions of the first image plane IS1 and the second image plane IS2 by using the first imaging characteristic-adjusting device LC1 and the second imaging characteristic-adjusting device LC2 described above. As described above, the first imaging characteristic-adjusting device LC1 is capable of performing the positional adjustment of the first image plane IS1 in the Z axis direction and the positional adjustment (inclination adjustment) of the first image plane IS1 in the θX and θY directions, and the second imaging characteristic-adjusting device LC2 is capable of performing the positional adjustment of the second image plane IS2 in the Z axis direction and the positional adjustment of the second image plane IS2 in the θX and θY directions. The controller 30 is capable of adjusting at least one of the positions of the first image plane IS1 and the second image plane IS2 by adjusting the projection optical system PL by using the first and second imaging characteristic-adjusting devices LC1, LC2. Of course, the positional adjustment of the pattern formation surface (K1 and/or K2) and the imaging characteristic-adjusting device (LC1 and/or LC2) may be used in combination.

In the first to ninth embodiments described above, there is such a possibility that at least one of the positions of the first image plane IS1 and the second image plane IS2 may be changed due to the thermal change in an optical element of the projection optical system (PL, PL') caused by the radiation of the first exposure light beam EL1 and the second exposure light beam EL2. When the change as described above is caused, the light amounts (or the energy) of the first exposure light beam EL1 and the second exposure light beam EL2 allowed to come into the projection optical system (PL, PL') may be monitored respectively to adjust the surface positional relationship among the first image plane IS1, the second image plane IS2, and the surface of the substrate P. That is, the change in at least one of the first image plane IS1 and the second image plane IS2, which is caused by the first exposure light beam EL1 and the second exposure light beam EL2 coming into the projection optical system, may be compensated by performing the positional adjustment for at least one of the first image plane IS1, the second image plane IS2, and the surface of the substrate P. For example, it is possible to perform the positional adjustment for at least one of the first image plane IS1 and the second image plane IS2 by controlling at least one of the first imaging characteristic-adjusting device LC1 and the second imaging characteristic-adjusting device LC2 on the basis of the light amounts (or the energy) of the first exposure light beam EL1 and the second exposure light beam EL2 allowed to come into the projection optical system (PL, PL'). It is also possible to perform the positional adjustment for the surface of the substrate P by controlling the substrate stage 80 (substrate table 80T) on the basis of the light amounts (or the energy) of the first exposure light beam EL1 and the second exposure light beam EL2 allowed to come into the projection optical system (PL, PL').

In the respective embodiments described above, the plurality of measuring members, which include, for example, the spatial image-measuring instrument 162 to be used for measuring the positions of the first and second image planes IS1, IS2, are provided for the measuring stage 90. However, at least one of the plurality of measuring members, for example, the spatial image-measuring instrument 162 may be provided for the substrate stage 80 (substrate table 80T). In this case, the entire spatial image-measuring instrument 162 may be provided for the substrate stage 80. However, it is also allowable that only a part of the spatial image-measuring instrument 162 is provided for the substrate stage 80. In the respective embodiments described above, the spatial image-measuring instrument 162 is used to measure the positions of the first and second image planes IS1, IS2. However, the image plane-measuring device is not limited to the measuring device or instrument as described above, and may be any device or instrument.

Figure 27A:
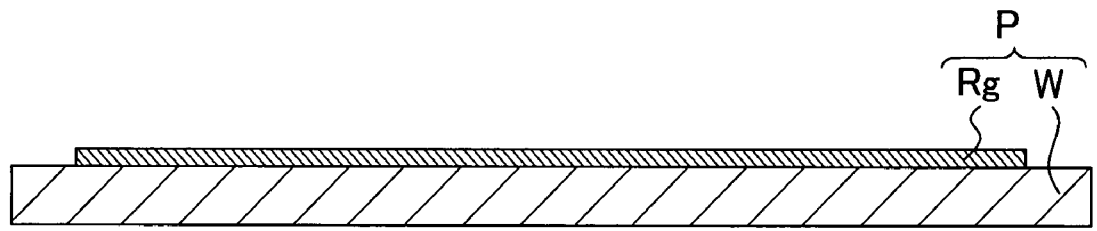
FIGS. 27A and 27B schematically show exemplary substrates.
Figure 27B:
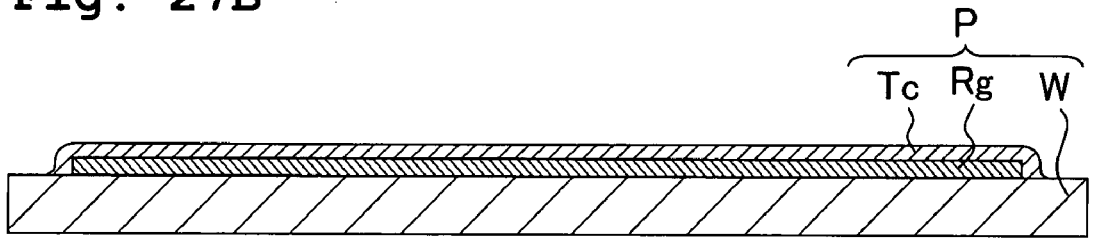

In the respective embodiments described above, the explanation has been made that in some cases such that the first and second image planes IS1, IS2 are allowed to be matched to the surface (outermost surface) of the substrate P. However, the surface (exposure surface), to which the first and second image planes IS1, IS2 are to be matched in order to form the desired pattern on the substrate P, is not necessarily limited to the surface (outermost surface) of the substrate P. For example, as schematically shown in FIG. 27A, when the substrate P has a base material W which includes a semiconductor wafer and a resist film Rg which is formed on the base material W, then the exposure surface, to which the first and second image planes IS1, IS2 are to be matched, is not necessarily limited to the outermost surface of the substrate P (surface of the resist film Rg in this case). For example, there is such a possibility that the exposure surface is the interface between the base material W and the resist film Rg, or any internal portion of the resist film Rg. On the other hand, as schematically shown in FIG. 27B, when the substrate P has a base material W which includes a semiconductor wafer, a resist film Rg which is formed on the base material W, and a film Tc (for example, a top coat film or an antireflection film) which is formed on the resist film Rg, then the surface (exposure surface), to which the first and second image planes IS1, IS2 are to be matched, is not necessarily limited to the outermost surface of the substrate P (surface of the film Tc in this case). The exposure surface, to which the first and second image planes IS1, IS2 are to be matched in order to form the desired pattern on the substrate P, can be determined, for example, by a test exposure. The controller 30 can adjust the positional relationship between the first and second image planes IS1, IS2 and the substrate P so that the exposure surface, which is determined, for example, by the test exposure, is matched to the first and second image planes IS1, IS2.

In the respective embodiments described above, the first mask M1 and the second mask M2 are synchronously moved with respect to the substrate P by the main stage 61 provided on the mask stage 60. However, the movement is not limited to this. The first mask M1 and the second mask M2 can be synchronously moved with respect to the substrate P independently as well. In this case, it is possible to provide a first mask stage and a second mask stage which are driven independently while placing the first mask M1 and the second mask M2 respectively thereon. For example, the main stage 61 may be omitted; and the first substage 62 and the second substage 63 may be synchronously moved with respect to the substrate P independently or in cooperation. When the first mask stage and the second mask stage, which are driven independently, are provided as described above, it is necessary that each of the first and second mask stages is synchronously moved with respect to the substrate stage. That is, it is necessary to adjust each of the positional relationship between the first mask M1 placed on the first mask stage and the shot area of the substrate P and the positional relationship between the second mask M2 placed on the second mask stage and the shot area of the substrate P. By doing so, the shot area of the substrate P can be subjected to the multiple exposure (double exposure) with the image of the first pattern PA1 of the first mask M1 formed in the first exposure area AR1 and the image of the second pattern PA2 of the second mask M2 formed in the second exposure area AR2 in such a state that the images are correctly overlaid with each other.

In the respective embodiments described above, when the shot area S on the substrate P is subjected to the exposure, the first mask M1 and the second mask M2 are moved in the same scanning direction. However, the first mask M1 and the second mask M2 may be moved in the mutually opposite scanning directions. For example, when the first mask M1 is moved in the +Y direction, the second mask M2 may be moved in the −Y direction; and when the first mask M1 is moved in the −Y direction, the second mask M2 may be moved in the +Y direction. Alternatively, the first mask M1 may be moved in the XY plane, and the second mask M2 may be moved in the YZ plane (or in the XZ plane).

In the respective embodiments described above, the first pattern PA1 is formed on the first mask M1, and the second pattern PA2 is formed on the second mask M2 which is distinct (separate) from the first mask M1. However, the first pattern PA1 and the second pattern PA2 may be formed on a single mask. The substrate P can be subjected to the multiple exposure with the image of the first pattern PA1 and the image of the second pattern PA2 provided on the single mask.

In the respective embodiments described above, the projection optical system PL (PL') is not limited to those of the reduction system. It is also allowable to use any one of those of, for example, the 1× magnification system and the magnifying system. In the respective embodiments described above, the explanation has been made as exemplified by the case in which the projection optical system PL (PL') is the catadioptric system including catoptric optical elements and dioptric optical elements by way of example. However, the projection optical system PL (PL') may be, for example, the dioptric system including no catoptric optical element or the catoptric system including no dioptric optical element. Further, the projection optical system PL (PL') is not limited to the two-headed type catadioptric system. It is also allowable to use the so-called inline type catadioptric system in which a plurality of reflecting surfaces are provided; an optical system (catoptric or dioptric system) for forming an intermediate image at least once is provided at a part thereof; and a single optical axis is provided, as disclosed, for example, in International Publication No. 2004/107011 (corresponding to United States Patent Application Publication No. 2006/0121364). The projected image, which is generated by the projection optical system PL (PL'), may be either an inverted image or an erecting image.

In the respective embodiments described above, the image of the first pattern PA1 of the first mask M1 and the image of the second pattern PA2 of the second mask M2 are projected onto the substrate P by using the single projection optical system PL. However, a plurality of (two) projection optical systems may be provided to project the image of the first pattern PA1 of the first mask M1 and the image of the second pattern PA2 of the second mask M2 onto the substrate P by using the distinct projection optical systems. The present invention is also applicable to a scanning type exposure apparatus based on the so-called multi-lens system in which a plurality of projection optical systems are arranged so that adjoining projection areas are displaced by a predetermined amount in the scanning direction, and that the ends of the adjoining projection areas are overlapped with each other in a direction perpendicular to the scanning direction.

In the respective embodiments described above, the first exposure area AR1 and the second exposure area AR2 can be simultaneously arranged in one shot area S. However, it is not necessarily indispensable that the first exposure area AR1 and the second exposure area AR2 can be arranged simultaneously in one shot area S. It is possible to arbitrarily set the first exposure area AR1 and the second exposure area AR2.

In the respective embodiments described above, the first exposure area AR1 and the second exposure area AR2 may be different from each other in at least one of the size and the shape. For example, the width in the X axis direction and/or the width in the Y axis direction may differ between the first exposure area AR1 and the second exposure area AR2. When the width in the X axis direction differs between the first exposure area AR1 and the second exposure area AR2, only a part in the shot area S is subjected to the multiple (double) exposure by one time of the scanning operation. The shape of each of the first and second exposure areas AR1, AR2 is not limited to the rectangular shape, and may be any other shape including, for example, circular arc-shaped, trapezoidal, parallelogram forms, or the like.

In the respective embodiments described above, the exposure light beams EL1, EL2 are continuously radiated onto the first exposure area AR1 and the second exposure area AR2 respectively during the period in which the shot area S passes across the first exposure area AR1 and the second exposure area AR2. However, the exposure light beam may be radiated only in a part of a period of time during which the shot area S passes across at least one of the exposure areas. That is, only a part of the shot area S may be subjected to the multiple (double) exposure.

In the respective embodiments described above, the respective shot areas S of the substrate P are subjected to the double exposure with the image of the first pattern PA1 of the first mask M1 and the image of the second pattern PA2 of the second mask M2. However, it is also possible to perform the triple or more multiple exposure in accordance with the principle of the present invention. When the triple exposure is performed, a third mask (M3) having a third pattern (PA3) is used in addition to the first mask M1 and the second mask M2. The third mask (M3) is moved in synchronization with the movement of the substrate P in the same manner as the first mask M1 and the second mask M2. The respective shot areas S of the substrate P can be subjected to the triple exposure with the images of the first to third patterns. In this case, a third exposure area AR3, on which the image is formed by radiating the illumination light beam onto the third pattern, can be set so that the third exposure area AR3 is distinct from the first exposure area AR1 and the second exposure area AR2 or a part of the third exposure area AR3 is overlapped with at least one of the first exposure area AR1 and the second exposure area AR2. In this case, three projection optical systems may be independently provided corresponding to the exposure areas respectively. Alternatively, the projection optical system PL as shown in FIG. 4 may be further provided with an optical system corresponding to the third mask similarly to the first and second optical systems 41, 42 corresponding to the first mask M1 and the second mask M2, and the projection optical system PL may be provided with a catoptric and/or dioptric system for guiding the light beam from the optical system to the third optical system. An optical system, which includes a reflecting plate and a beam splitter for guiding the exposure light beam allowed to pass through the third mask to the optical system 120C, may be further provided by improving the optical system shown in FIG. 22. The third mask (M3)

may be placed on the mask stage 60 on which the first mask M1 and the second mask M2 are placed, or the third mask (M3) may be placed on any distinct (separate) mask stage.

In the respective embodiments described above, the interferometer system is used to measure the position information about the mask stage and the substrate stage. However, the measurement is not limited to this. For example, it is also allowable to use an encoder system for detecting a scale (diffraction grating) provided on the upper surface of the substrate stage. In this case, it is preferable that a hybrid system including both of the interferometer system and the encoder system is provided, and that the measurement result of the encoder system is calibrated (subjected to the calibration) by using the measurement result of the interferometer system. The position control of the substrate stage may be performed by switching and using the interferometer system and the encoder system or using both of them.

In the respective embodiments described above, an ArF excimer laser may be used as a light source device for generating an ArF excimer laser beam as the exposure light beam. However, it is also allowable to use a high harmonic wave-generating device which includes, for example, a solid laser light source such as a DFB semiconductor laser or a fiber laser, a light-amplifying section having a fiber amplifier or the like, and a wavelength-converting section and which outputs a pulse light beam having a wavelength of 193 nm as disclosed, for example, in International Publication No. 1999/46835 (corresponding to U.S. Pat. No. 7,023,610).

The substrate P, which is usable in the respective embodiments described above, is not limited only to the semiconductor wafer for producing the semiconductor device. Applicable substrates include, for example, a glass substrate for the display device, a ceramic wafer for the thin film magnetic head, a master plate (synthetic silica glass, silicon wafer) for the mask or the reticle to be used for the exposure apparatus, or a film member. The shape of the substrate P is not limited only to the circular shape, and it is also allowable to use other shapes such as a rectangular shape.

The present invention is also applicable to an exposure apparatus in which the measuring stage is not provided and only one substrate stage is provided.

The present invention is also applicable to an exposure apparatus of the multistage type (twine-stage type) provided with a plurality of substrate stages as disclosed, for example, in Japanese Patent Application Laid-open Nos. 10-163099 and 10-214783 (corresponding to U.S. Pat. Nos. 6,341,007, 6,400,441, 6,549,269, and 6,590,634) and Published Japanese Translation of PCT International Publication for Patent Application No. 2000-505958 (corresponding to U.S. Pat. No. 5,969,441). In this case, the information about the substrate P is obtained in the measuring station, and the positional adjustment between the image plane and the surface of the substrate is performed in at least one of the first exposure area AR1 and the second exposure area AR2 as described above in the exposure station. The contents of U.S. Pat. Nos. 6,341,007, 6,400,441, 6,549,269, 6,590,634, and 5,969,441 described above are incorporated herein by reference within a range of permission of the domestic laws and ordinances of the designated or selected state, in relation to the exposure apparatus of the multistage type.

The embodiment, which is included in the respective embodiments described above and in which the optical path for the exposure light beam EL is filled with the liquid, adopts the exposure apparatus in which the space between the projection optical system and the substrate P is locally filled with the liquid. However, the present invention is also applicable to a liquid immersion exposure apparatus which performs the exposure in a state in which the entire surface of the substrate as the exposure-objective is immersed in the liquid as disclosed, for example, in Japanese Patent Application Laid-open Nos. 6-124873 and 10-303114 and U.S. Pat. No. 5,825,043.

In the respective embodiments described above, the first and second masks M1, M2 are used in order to form the first and second patterns. However, instead of the first and second masks M1, M2, it is possible to use an electronic mask (also referred to as "variably shaped mask", "active mask", or "pattern generator") which generates a variable pattern. As the electronic mask as described above, it is possible to use DMD (Deformable Micro-mirror Device or Digital Micro-mirror Device) which is a type of the no light-emitting image display device (also referred to as "spatial light modulator" (SLM)). DMD has a plurality of reflecting elements (micro-mirrors) which are driven on the basis of predetermined electronic data. The plurality of reflecting elements are arranged in a two-dimensional matrix form on a surface of DMD, and each of the elements is driven independently (is driven by element by element) to reflect and deflect the exposure light beam. The respective reflecting elements have reflecting surfaces for which the angles are adjusted. The operation of DMD may be controlled by the controller 30. The controller 30 drives the respective reflecting elements of DMD on the basis of the electronic data (pattern information) corresponding to the first pattern and the second pattern to be formed on the substrate P. The exposure light beam, which is radiated from the illumination system IL, is patterned by the reflecting elements. When DMD is used, it is possible to perform the multiple exposure more efficiently, because it is unnecessary to perform the operation for exchanging the mask and the positional adjustment operation for the mask on the mask stage when the pattern is changed, as compared with the case in which the exposure is performed with the mask (reticle) on which the pattern is formed. It is also allowable for the exposure apparatus using the electronic mask that the substrate is merely moved in the X axis direction and the Y axis direction by the substrate stage without providing the mask stage. In order to adjust the relative positions of the images of the first and second patterns on the substrate, for example, an actuator is used to adjust the relative positions of the two electronic masks for generating the first and second patterns respectively. However, in at least one of the two electronic masks, a timing for generating the pattern may be adjusted, or the pattern formation position on the electronic mask may be deviated. The exposure apparatus using DMD is disclosed, for example, in Japanese Patent Application Laid-open Nos. 8-313842 and 2004-304135 and U.S. Pat. No. 6,778,257. The disclosure of U.S. Pat. No. 6,778,257 is incorporated herein by reference within a range of permission of the domestic laws and ordinances of the designated or selected state.

The type of the exposure apparatus EX is not limited to the exposure apparatus for producing the semiconductor element for exposing the semiconductor element pattern on the substrate P. The present invention is also widely applicable, for example, to an exposure apparatus for producing the liquid crystal display device or producing the display as well as to an exposure apparatus for producing, for example, the thin film magnetic head, the micromachine, MEMS, the DNA chip, the image pickup element (CCD), the reticle, the mask, or the like.

The contents of various United States patents and various United States patent application Publications referred to in this specification, which are not included in those having been specifically incorporated herein explicitly, are also incorporated herein by reference within a range of permission of the domestic laws and ordinances of the designated or selected state.

As described above, the exposure apparatus EX according to the embodiments of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature, the cleanness and the like are managed.

Figure 28:
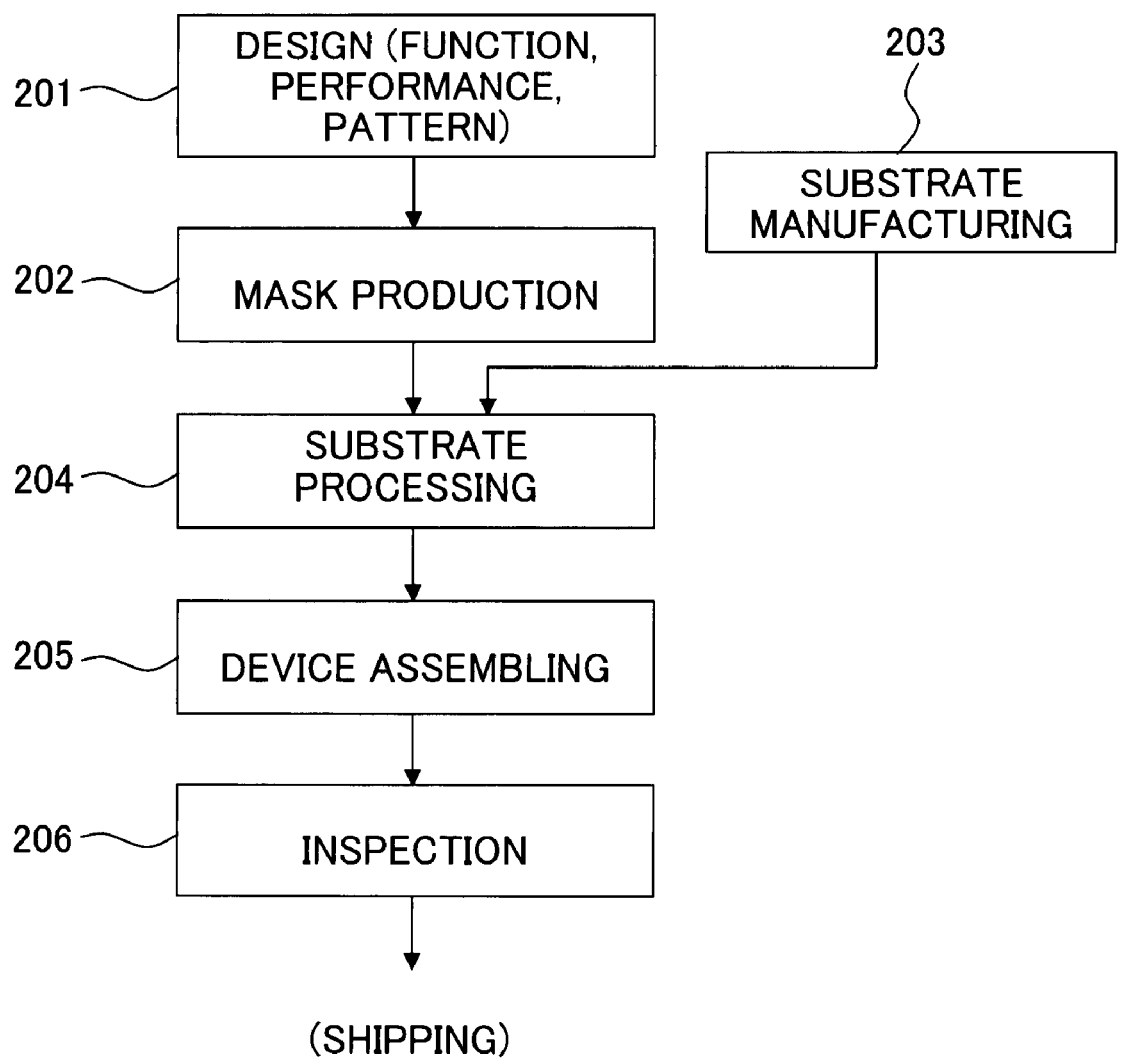
FIG. 28 shows a flow chart illustrating exemplary steps of producing a microdevice.

As shown in FIG. 28, a microdevice such as the semiconductor device is produced by performing, for example, a step 201 of designing the function and the performance of the microdevice, a step 202 of producing a mask (reticle) based on the designing step, a step 203 of manufacturing a substrate as a base material for the device, a substrate-processing step 204 including an exposure step of performing the multiple exposure for the substrate with pattern(s) of the mask by using the exposure apparatus EX of the embodiment described above and a development step of developing the exposed substrate, a step 205 of assembling the device (including processing processes such as a dicing step, a bonding step, and a packaging step), and an inspection step 206.

According to the present invention, the multiple exposure for the substrate can be performed correctly and highly efficiently. Therefore, it is possible to produce, at the high throughput, the device having a highly integrated and complicated circuit pattern. Therefore, the present invention will contribute to the development of the high technology industry and the IT industry including the semiconductor industry in our country.

What is claimed is:

1. An exposure apparatus which exposes a substrate, comprising:
    an optical system which forms an image of a first pattern in a first exposure area and which forms an image of a second pattern in a second exposure area by illumination of the first pattern and illumination of the second pattern, the second pattern being different from the first pattern;
    an adjusting device which adjusts a surface positional relationship between a surface of the substrate and a first image plane for forming the image of the first pattern thereon and which adjusts a surface positional relationship between the surface of the substrate and a second image plane for forming the image of the second pattern thereon when a predetermined area on the substrate is subjected to multiple exposure with the image of the first pattern and the image of the second pattern via the optical system;
    an illumination system that illuminates the first pattern and the second pattern; and
    a control unit that is configured to control the illumination system,
    wherein the substrate is moved in a scanning direction with respect to the first exposure area and the second exposure area to make the predetermined area on the substrate pass across the first exposure area and the second exposure area during the multiple exposure for the predetermined area on the substrate, and
    the first pattern and the second pattern are moved in scanning directions respectively and the control unit controls the illumination system such that one of the illumination of the first pattern and the illumination of the second pattern is started and then the other of the illuminations is started before the one of the illuminations is completed during the multiple exposure for the predetermined area on the substrate.

2. The exposure apparatus according to claim 1, wherein the adjusting device adjusts at least one of positions of the first pattern and the second pattern to adjust at least one of positions of the first image plane and the second image plane.

3. The exposure apparatus according to claim 1, wherein the adjusting device adjusts the optical system to adjust at least one of positions of the first image plane and the second image plane.

4. The exposure apparatus according to claim 3, wherein the adjustment of at least one of the positions of the first image plane and the second image plane includes adjustment of at least one of inclinations of the first image plane and the second image plane.

5. The exposure apparatus according to claim 1, wherein the adjusting device adjusts a position of the substrate, and the adjustment of the position includes adjustment of an inclination of the substrate.

6. The exposure apparatus according to claim 1, wherein the adjusting device adjusts the surface positional relationship between the surface of the substrate and the first image plane and the surface positional relationship between the surface of the substrate and the second image plane, based on a surface information about the substrate.

7. The exposure apparatus according to claim 6, further comprising a surface detecting system which is capable of obtaining the surface information about the substrate, wherein the adjusting device adjusts the surface positional relationship between the surface of the substrate and each of the first and second image planes based on a detection result of the surface detecting system.

8. The exposure apparatus according to claim 7, wherein the surface detecting system obtains the surface information about the substrate concurrently with the multiple exposure operation performed for the predetermined area.

9. The exposure apparatus according to claim 7, wherein the surface detecting system is arranged away from the optical system, and obtains the surface information about the substrate before the exposure operation for the substrate is started.

10. The exposure apparatus according to claim 1, wherein the adjusting device adjusts the surface positional relationship between the surface of the substrate and the first image plane in the first exposure area only by positional adjustment of the first image plane, and the adjusting device adjusts the surface positional relationship between the surface of the substrate and the second image plane in the second exposure area only by positional adjustment of the substrate.

11. The exposure apparatus according to claim 1, wherein the adjusting device adjusts the surface positional relationship between the surface of the substrate and the first image plane in the first exposure area and adjusts the surface positional relationship between the surface of the substrate and the second image plane in the second exposure area only by positional adjustment of the substrate, without performing positional adjustment of the first image plane and the second image plane.

12. The exposure apparatus according to claim 11, wherein the adjusting device performs the positional adjustment of the substrate to match the first image plane in the first exposure area to an exposure surface on the substrate.

13. The exposure apparatus according to claim 11, wherein the adjusting device performs the positional adjustment of the substrate to make an error between an exposure surface on the substrate and the first image plane in the first exposure area to be substantially same as an error between the exposure surface on the substrate and the second image plane in the second exposure area.

14. The exposure apparatus according to claim 1, wherein the adjusting device performs positional adjustment of each of the surface of the substrate, the fist image plane and the second image plane to match the first image plane in the first exposure area to an exposure surface on the substrate, and to match the second image plane in the second exposure area to the exposure surface on the substrate.

15. The exposure apparatus according to claim 14, wherein the adjusting device performs the positional adjustment of the substrate to make an amount of positional adjustment of the first image plane to be substantially equal to an amount of positional adjustment of the second image plane.

16. The exposure apparatus according to claim 1, wherein the adjusting device adjusts the surface positional relationship between the surface of the substrate and the first image plane in the first exposure area and adjusts the surface positional relationship between the surface of the substrate and the second image plane in the second exposure area only by positional adjustment of the first image plane and the second image plane, without performing positional adjustment of the substrate.

17. The exposure apparatus according to claim 1, wherein the adjusting device moves at least one of the first image plane, the second image plane, and the substrate to dispose the first image plane and the surface of the substrate in a predetermined positional relationship in the first exposure area, and to dispose the second image plane and the surface of the substrate in a predetermined positional relationship in the second exposure area.

18. The exposure apparatus according to claim 1, wherein the adjusting device adjusts the surface positional relationship during the multiple exposure for the predetermined area.

19. The exposure apparatus according to claim 1, further comprising:
a mask stage which is capable of moving a first mask having the first pattern and a second mask having the second pattern in the scanning directions respectively; and
a substrate stage which is capable of moving the predetermined area on the substrate in the scanning direction with respect to the first exposure area and the second exposure area,
wherein the mask stage and the substrate stage are controlled to move the first mask and the second mask in synchronization with movement of the substrate.

20. The exposure apparatus according to claim 19, wherein the mask stage has a main stage which is capable of moving the first mask and the second mask in substantially same scanning directions while holding the first mask and the second mask.

21. The exposure apparatus according to claim 20, wherein the mask stage has a first driving device which is capable of moving the first mask with respect to the main stage and a second driving device which is capable of moving the second mask with respect to the main stage.

22. The exposure apparatus according to claim 21, wherein the adjusting device adjusts at least one of positions of the first and second image planes by moving at least one of the first and second masks with the first and second driving devices.

23. The exposure apparatus according to claim 19, further comprising a first measuring system which is capable of measuring position information about the first mask and position information about the second mask.

24. The exposure apparatus according to claim 1, wherein the optical system has one optical element which is arranged to opposite to the substrate, and the image of the first pattern and the image of the second pattern are formed in the first exposure area and the second exposure area respectively via the one optical element.

25. The exposure apparatus according to claim 1, wherein the first exposure area and the second exposure area are set at different positions.

26. The exposure apparatus according to claim 25, wherein the optical system has a first reflecting surface which is arranged in the vicinity of a position optically conjugate with the first exposure area and the second exposure area; a second reflecting surface which is arranged in the vicinity of a position optically conjugate with the first exposure area and the second exposure area; a first optical system which guides an exposure light beam from the first pattern to the first reflecting surface; a second optical system which guides an exposure light beam from the second pattern to the second reflecting surface; and a third optical system which guides the exposure light beam from the first reflecting surface and the exposure light beam from the second reflecting surface to the first exposure area and the second exposure area respectively.

27. The exposure apparatus according to claim 1, further comprising a second measuring system which measures a position of the first image plane and a position of the second image plane.

28. The exposure apparatus according to claim 27, wherein the second measuring system has a light-receiving section arrangeable in each of the first exposure area and the second exposure area.

29. The exposure apparatus according to claim 1, wherein a liquid immersion area of a liquid is formed on the substrate, and an exposure light beam from the first pattern and an exposure light beam from the second pattern are radiated onto the predetermined area on the substrate through the liquid of the liquid immersion area.

30. The exposure apparatus according to claim 1, wherein the substrate is a wafer.

31. A method for producing a device, comprising using the exposure apparatus as defined in claim 1.

32. An exposure method for performing multiple exposure for a predetermined area on a substrate with an image of a first pattern and an image of a second pattern by illumination of the first pattern and illumination of the second pattern, the exposure method comprising:
adjusting surface positional relationship between a surface of the substrate and a first image plane on which the image of the first pattern is to be formed;

adjusting surface positional relationship between the surface of the substrate and a second image plane on which the image of the second pattern is to be formed;

forming the image of the first pattern and the image of the second pattern in a first exposure area and a second exposure area respectively to perform the multiple exposure for the predetermined area on the substrate with the image of the first pattern and the image of the second pattern; and controlling the illumination of the first pattern and the second pattern, and during the multiple exposure performed for the predetermined area on the substrate with the image of the first pattern and the image of the second pattern, the substrate, a first mask on which the first pattern is formed and a second mask on which the second pattern is formed are synchronously moved and, during the controlling, one of the illumination of the first pattern and the illumination of the second pattern is started and then the other of the illuminations is started before the one of the illuminations is completed.

33. The exposure method according to claim 32, wherein the predetermined area on the substrate is subjected to the multiple exposure with the image of the first pattern and the image of the second pattern by synchronously moving the first and second masks and the substrate for one time.

34. The exposure method according to claim 32, wherein the substrate is moved in a scanning direction relative to the first and second exposure areas during the multiple exposure; and the first and second exposure areas are located at mutually different positions in the scanning direction.

35. The exposure method according to claim 32, further comprising adjusting a surface positional relationship between the first image plane and the second image plane.

36. The exposure method according to claim 32, wherein a liquid immersion area of a liquid is formed on the substrate, and an exposure light beam from the first pattern and an exposure light beam from the second pattern are radiated onto the predetermined area on the substrate through the liquid of the liquid immersion area.

37. A method for producing a device, comprising:
performing multiple exposure for a substrate by using the exposure method as defined in claim 32;
developing the exposed substrate; and
processing the developed substrate.

* * * * *

UNITED STATES PATENT AND TRADEMARK OFFICE
CERTIFICATE OF CORRECTION

PATENT NO. : 8,027,020 B2
APPLICATION NO. : 11/707027
DATED : September 27, 2011
INVENTOR(S) : Nagasaka Page 1 of 1

It is certified that error appears in the above-identified patent and that said Letters Patent is hereby corrected as shown below:

Title page
Please add Item (60), "Provisional application No. 60/779,436, filed on March 7, 2006."

Signed and Sealed this
Thirty-first Day of January, 2012

David J. Kappos
*Director of the United States Patent and Trademark Office*